United States Patent [19]
Wright et al.

[11] Patent Number: 5,990,738
[45] Date of Patent: Nov. 23, 1999

[54] COMPENSATION SYSTEM AND METHODS FOR A LINEAR POWER AMPLIFIER

[75] Inventors: Andrew S. Wright, Vancouver; Steven J. Bennett, Coquitlam, both of Canada

[73] Assignee: Datum Telegraphic Inc., Vancouver, Canada

[21] Appl. No.: 09/216,091

[22] Filed: Dec. 17, 1998

Related U.S. Application Data

[63] Continuation-in-part of application No. 09/100,568, Jun. 19, 1998.

[51] Int. Cl.$^6$ .......................................................... H03F 1/26
[52] U.S. Cl. ............................. 330/149; 330/2; 330/124 R
[58] Field of Search ..................................... 330/2, 124 R, 330/136, 149, 295

[56] References Cited

U.S. PATENT DOCUMENTS

| | | | |
|---|---|---|---|
| 3,777,275 | 12/1973 | Cox | 330/20 |
| 3,896,395 | 7/1975 | Cox | 330/53 |
| 3,906,401 | 9/1975 | Seidel | 330/149 |

(List continued on next page.)

OTHER PUBLICATIONS

James K. Cavers, Member, IEEE—Article Entitled: The Effect of Quadrature Modulator and Demodulator Errors on Adaptive Digital Predistorters for Amplifier Linearization, IEEE Transactions on Vehicular Technology, vol. 46, No. 2, dated May 1997.

Rui Dinis, Paulo Montezuma and Antonio Gusmao, with CAPS, Instituto Superior Tecnico, Av. Rovisco Pais, 1096 Lisboa Codex—Five Page Article Entitled: Performance Trade–Offs with Quasi–Linearly Amplified OFDM through a Two–Branch Combining Technique, dated May 1996.

Lars Sundstrom, Student Member, IEEE—Article Entitled: The Effect of Quantization in a Digital Signal Component Separator for LINC Transmitters, IEEE Transactions on Vehicular Technology, vol. 45, No. 2, dated May 1996.

L. Sundstrom, Department of Applied Electronics, Land University, Article Entitled: Effects of Reconstruction Filters and Sampling Rate for a Digital Signal Component Separator on LINC Transmitter Performance, dated Jul. 6, 1995, vol. 31, No. 14.

L. Sundstrom and M. Johansson, Department of Applied Electronics, Land University, Article Entitled: Effect of Modulation Scheme on LINC Transmitter Power Efficiency three page article from Electronics Letters, dated Sep. 29, 1994, vol. 30, No. 20.

K.Y. Chan, A. Bateman and M. Li with Centre for Communications Research, University of Bristol, U.K.—Article Entitled: Analysis and Realization of the LINC Transmitter using the Combined Analogue Locked Loop Universal Modulator (CALLUM), dated Mar. 1994.

(List continued on next page.)

*Primary Examiner*—Robert Pascal
*Assistant Examiner*—Khanh Van Nguyen
*Attorney, Agent, or Firm*—Knobbe, Martens, Olson & Bear, LLP

[57] ABSTRACT

A LINC amplifier of a radio frequency transmitter provides substantially linear amplification from two nonlinear amplifiers by decomposing the original signal into two constant amplitude envelope, phase varying signals, which, when combined, constructively and destructively interfere to re-form the original signal. The output of the LINC amplifier, which is to be transmitted via an antenna, is an amplified form of the original signal. The LINC amplifier uses a digital control mechanism to control and adapt a digital compensation network that directly compensates for the imperfections of the analog RF environment, including the amplifiers. The mechanism monitors the combined amplifier output and adjusts the signal components in order to precisely compensate for any differences in the characteristics of the separate signal paths which would cause the combination not to accurately represent the original signal. The mechanism also corrects the component signals using information which can be applied to the amplifiers independent of the signal to be transmitted.

31 Claims, 28 Drawing Sheets

U.S. PATENT DOCUMENTS

| | | | |
|---|---|---|---|
| 3,909,742 | 9/1975 | Cox et al. | 330/124 R |
| 3,927,379 | 12/1975 | Cox et al. | 330/124 R |
| 3,978,424 | 8/1976 | Hobo et al. | 331/45 |
| 4,068,186 | 1/1978 | Sato et al. | 330/149 |
| 4,090,147 | 5/1978 | Seidel | 330/124 R |
| 4,178,557 | 12/1979 | Henry | 330/124 R |
| 4,319,204 | 3/1982 | Weldon et al. | 332/9 R |
| 4,346,354 | 8/1982 | Hanna | 332/9 R |
| 4,420,723 | 12/1983 | de Jager | 330/20 |
| 4,433,312 | 2/1984 | Kahn | 332/22 |
| 4,490,684 | 12/1984 | Epsom et al. | 330/149 |
| 4,540,957 | 9/1985 | Hanna | 330/10 |
| 4,584,541 | 4/1986 | Nossen | 332/16 R |
| 4,656,434 | 4/1987 | Selin | 330/149 |
| 4,835,493 | 5/1989 | Walsh, Jr. | 332/41 |
| 5,093,636 | 3/1992 | Higgins, Jr. et al. | 332/100 |
| 5,107,520 | 4/1992 | Karam et al. | 455/126 |
| 5,148,448 | 9/1992 | Karam et al. | 455/126 |
| 5,249,201 | 9/1993 | Posner et al. | 332/106 |
| 5,264,807 | 11/1993 | Okubo et al. | 330/295 |
| 5,287,069 | 2/1994 | Okubo et al. | 330/10 |
| 5,329,259 | 7/1994 | Stengel et al. | 332/103 |
| 5,365,187 | 11/1994 | Hornak et al. | 330/149 |
| 5,410,280 | 4/1995 | Linguet et al. | 330/10 |
| 5,469,127 | 11/1995 | Hulick et al. | 330/10 |
| 5,568,086 | 10/1996 | Schuss et al. | 330/124 R |
| 5,568,088 | 10/1996 | Dent et al. | 330/124 R |
| 5,574,967 | 11/1996 | Dent et al. | 455/12.1 |
| 5,631,604 | 5/1997 | Dent et al. | 330/124 R |
| 5,638,024 | 6/1997 | Dent et al. | 330/124 R |
| 5,659,272 | 8/1997 | Linguet | 332/151 |
| 5,675,288 | 10/1997 | Peyrotte et al. | 330/149 |
| 5,705,959 | 1/1998 | O'Louglin | 332/151 |
| 5,732,333 | 3/1998 | Cox et al. | 330/149 |
| 5,748,678 | 5/1998 | Valentine et al. | 330/149 |
| 5,760,646 | 6/1998 | Belcher et al. | 330/149 |
| 5,867,065 | 2/1999 | Leyendecker | 330/149 |

OTHER PUBLICATIONS

Andrew Bateman, Mu Li and K. Chan with Centre for Communications Research, University of Bristol, U.K. — Article Entitled: Implementation of the LINC Transmitter using the Combined Analogue Locked Loop Universal Modulator (CALLUM), from Mobile and Personal Communications, 13–15, dated Dec. 1993, Conference Publication No. 387.

Fernando J. Casadevall, Member, IEEE, and Antonio Valdovinos, Student Member, IEEE—Article Entitled: Performance Analysis of QAM Modulations Applied to the LINC Transmitter from IEEE Transactions on Vehicular Technology, vol. 42, No. 4, dated Nov. 1993.

Dr. A. Bateman with Centre for Communications Research, University of Bristol—Article Entitled: The Combined Analogue Locked Loop Universal Modulator (CALLUM), dated Feb. 1992.

S.A. Hetzel, A. Bateman and J.P. McGeehan with Centre for Communications Research, University of Bristol, U.K.— Article Entitled: A LINC Transmitter, dated 1991.

S.A. Hetzel, A. Bateman and J.P. McGeehan, Centre for Communications Research, University of Bristol, U.K.— Article Entitled: LINC Transmitter, dated May 9, 1991, vol. 27, No. 10.

Fernando Casadevall, Juan J. Olmos with Department de Teoria del Senyal i Comunicacions—Article Entitled: On The Behavior of the LINC Transmitter, dated 1990.

A. Bateman, R.J. Wilkinson and J.D. Marvill with Communications Research Group—Article Entitled: The Application of Digital Signal Processing to Transmitter Linearisation, dated 1988.

S. Tomisato, K. Chiba, and K. Murota, with NTT Radio Communication Systems Laboratories—Article Entitled: Phase Error Free LINC Modulator, dated Apr. 27, 1989. vol. 25, No. 9.

D.C. Cox with Bell Laboratories—Article Entitled: Linear Amplification with Nonlinear Components, dated Dec. 1974.

COMPENSATION SYSTEM AND METHODS FOR A LINEAR POWER AMPLIFIER

RELATED APPLICATIONS

This application is a continuation-in-part of U.S. Appl. No. 09/100,568, filed Jun. 19, 1998, the disclosure of which is hereby incorporated by reference.

APPENDIX

Attached as an appendix is a state machine specification for a preferred embodiment of the invention. The appendix forms part of the disclosure of the application.

TECHNICAL FIELD OF THE INVENTION

This application relates in general to power amplifiers and in particular to linear amplification of band limited signals using non-linear amplifiers.

BACKGROUND OF THE INVENTION

Radio frequency power amplifiers are widely used to transmit signals in communications systems. Typically a signal to be transmitted is concentrated around a particular carrier frequency occupying a defined channel. Information is sent in the form of modulation of amplitude, phase or frequency or some combination of these which causes the information to be represented by energy spread over a band of frequencies around the carrier frequency. In many schemes the carrier itself is not sent since it is not essential to the communication of the information.

When a signal, which contains amplitude variations, is amplified it will suffer distortion if the amplifier does not exhibit a linear amplitude transfer characteristic. This means that the output is not linearly proportional to the input. It will also suffer distortion if the phase shift which the amplifier introduces is not linear over the range of frequencies present in the signal, or if the phase shift caused by the amplifier varies with the amplitude of the input signal. The distortion introduced includes intermodulation of the components of the input signal. The products of the intermodulation appear within the bandwidth of the signal causing undesirable interference, as well as outside the bandwidth originally occupied by the signal. This can cause interference in adjacent channels and violate transmitter licensing and regulatory spectral emission requirements.

Although filtering can be used to remove the unwanted out of band distortion, this is not always practical, especially if the amplifier is required to operate on several different frequencies. Distortion products which are at multiples of the carrier frequency can also be produced in a nonlinear amplifier, but these can typically be removed by filtering.

Intermodulation is also a problem when multiple signals are amplified in the same amplifier even if individually they do not have amplitude variations. This is because the combination of the multiple signals produces amplitude variations as the various components beat with each other by adding and subtracting as their phase relationships change.

Amplifiers can introduce some distortion even if they are well designed. Perfect linearity over a wide range of amplitude is difficult to realize in practice. Moreover, as any amplifier nears its maximum output capacity, the output no longer increases as the input increases and thus it becomes nonlinear. A typical amplifier becomes significantly nonlinear at a small fraction of its maximum output capacity. This means that in order to maintain linearity the amplifier is often operated at an input and output amplitude which is low enough such that the signals to be amplified are in the part of its transfer characteristic which is substantially linear. This method of operation is described as "backed off," in which the amplifier has a low supplied power to transmitted power conversion efficiency. A "Class A" amplifier operated in this mode may be linear enough for transmitting a signal cleanly, but might typically be only 1% efficient. This wastes power and means that the amplifier has to be large and relatively expensive. It also means that the wasted power is dissipated as heat which has to be removed by a cooling system.

Communication schemes using signals which have constant amplitude with frequency and phase modulation can use highly nonlinear amplifiers. These types of signals are unaffected by the distortion and the amplifiers can be smaller, cooler, more power efficient and less expensive. Modulation of this type is used in conventional radio paging systems which use CPFSK modulation.

Many of the newer, bandwidth efficient modulation schemes have both amplitude and phase variations. There is also a desire to be able to transmit multiple signals on different channels through a single amplifier. This reduces the number of separate amplifiers required and avoids the need for large, costly high level output signal combining filters which have undesirable power losses.

In the prior art, linearized amplifiers can be made by correcting for the nonlinearities of amplifiers using mechanisms such as cartesian feedback, predistortion and feedforward correction.

Cartesian feedback is a mechanism in which a monitoring system looks at the output of the amplifier and attempts to alter the input of the amplifier so that it produces the intended output. This is arranged as a direct feedback loop. The delay in the feedback path means that the correction can be too late to correct effectively, especially at higher bandwidths.

The predistortion mechanism attempts to correct for the nonlinear transfer characteristic of an amplifier by forming an inverse model of its transfer characteristic. This characteristic is applied to the low level signal at the input of the amplifier in a nonlinear filter, to pre-distort it such that when it passes though the amplifier the signal emerges amplified and substantially undistorted. This method is capable of excellent results over a relatively small bandwidth. The filter has to be updated to account for variations in the amplifier transfer characteristic and this is done by monitoring the output and periodically updating the corrections. The filter also has to change its coefficients as often as every sample using the values stored in memory.

The feedforward mechanism derives a signal which represents the inverse of the distortions produced by the amplifier. This is done by comparing the amplifier input and output. A small linear amplifier is used to amplify the distortion signal. This signal is then subtracted from the main amplifier output. This method operates correctly over a wider bandwidth than the predistortion mechanism. However, balancing the amplitude and delay of the distortion signal so that it cancels the main amplifier errors exactly is complicated to perform.

Both predistortion and feedforward are widely used in commercial products which can amplify multiple signals and work over wide amplitude ranges. Both methods are quite complicated and the power efficiencies are still not excellent. Feedforward amplifiers are typically only 5% efficient. The complicated processing requirements add to the cost and the power used and significant cooling capacity is still required to remove waste heat.

Another prior art amplifier is the LINC (Linear Nonlinear Component) amplifier 10, as shown in FIG. 1. A signal which has amplitude variations can be generated by two signals which vary only in their relative phases. The vector sum of the two signals can represent any amplitude. Thus, it is possible to represent the instantaneous state of any signal or combination of signals. The phase and frequency of the component signals can also be made to represent that of the original so that when combined, the original signal is reconstructed.

In FIG. 1, LINC amplifier 10 amplifies two or more constant amplitude signals, which represent an input signal to be amplified. The LINC amplifier uses a signal separator 11 to split the input 12 into the two components 13, 14, which are constant amplitude, phase varying components. The LINC amplifier may be supplied a complex baseband digitally sampled signal 12. The baseband signals 12 can be a representation of multiple modulated carriers using any modulations. For simplicity, various details such as the need to convert from baseband to a higher frequency and the need to convert from digital into analog have been omitted.

Since amplitude variations do not have to be dealt with, it is possible to build an amplifier which will amplify signals linearly by using the two phase and frequency modulated components. The nonlinearity of the amplifiers is no longer a problem in the amplification of multiple signals or those containing amplitude variations because the constant amplitude of the two components 13, 14 become constant amplified amplitudes as they are amplified by amplifiers 15, 16, while the phase of the components passes through the amplifiers with a constant shift. Although the nonlinear amplifiers produce distortion signals at multiples of the carrier frequency, these can be filtered off.

A problem occurs when the LINC mechanism is used for radio communication transmission at radio frequency ("RF"). Prior art descriptions which refer to the LINC idea have principally described methods of generation of the two phase component signals from an input signal, as shown in FIG. 1. A very high degree of accuracy in the phases and amplitudes of the two components, 13, 14 is required in order to achieve proper operation. If the two components 13, 14 are not extremely well balanced, the distortions seen at the output of combiner 17 (which recombines the amplified signals of components 13 and 14) due to the effect of the imbalances can be worse than the effects of an amplifier non linearity. A typical prior art arrangement might only generate a signal which is 20 dB above its wideband intermodulation noise floor. This is not sufficient for most base station transmitter applications where 60 to 80 dB is often required.

Therefore, there is a need in the art for a modern radio communication system to have power amplifiers for multiple signals and signals which have varying amplitude. Moreover, there is a need for an amplifier unit which is power efficient and inexpensive. Current solutions to this problem are linearized amplifiers which are complicated and not particularly efficient. Prior art LINC amplifiers cannot be used because the two components cannot be accurately combined to the required degree of precision without the deleterious effects of imbalance.

SUMMARY OF THE INVENTION

The present invention addresses these and other problems by providing a system, and various associated methods and components, for reducing the adverse effects caused by differences between the analog signal paths of a LINC amplifier. The invention may be used, for example, within a transmitter of a cellular base station or other wireless communications system. The invention can also be applied in other environments in which a signal is decomposed into component signals that are processed along separate analog signal paths and then combined.

In accordance with the invention, a bandlimited signal is divided by a signal component separator (SCS) into multiple constant amplitude, phase varying component signals. In a preferred embodiment, two such component signals are generated, and the signals are in digital form. Each component signal is amplified (and in RF embodiments, upconverted) along a respective analog amplification chain or path, and the amplified component signals are then combined by a signal combiner to generate the transmission signal. The amplifiers provided along the analog paths are preferably non-linear amplifiers.

Prior to being applied to the analog amplification chains, the component signals are processed (preferably digitally) by respective compensation circuits (also referred to as compensation processors) to compensate for differences between the analog chains. During such processing, various effects such as phase rotations, propagation delays, amplitude gains, DC offsets and/or IQ cross talk are digitally added to the component signals to compensate for the imperfections in the analog chains. The effects added through such compensation processing are preferably equal and opposite to those introduced by the analog chains. At least some of the effects are preferably introduced using finite impulse response (FIR) digital filters that process the component signal outputs of the SCS before the signals are converted to analog form. As a result of the compensation processing, the adverse effects normally caused by imbalances between the analog chains are significantly reduced or eliminated.

In a preferred embodiment, the compensation processing applied along each path is specified by a set of compensation parameters which are updated over time. The compensation parameters are preferably generated digitally using an adaptive compensation estimation process which monitors the component signal outputs of the SCS and the output of the signal combiner. An important aspect of the invention involves the recognition that the compensation parameters need not be generated in real time, because the characteristics of the analog chains change relatively slowly over time. It is therefore possible to implement the adaptive compensation estimation process in a non-real time mode (e.g., using sequences of previously-captured samples), and at a digital signal processing rate that is substantially lower than the sampling rate of the signal being transmitted. An important advantage of this approach is that the adaptive compensation estimation process can be implemented using general purpose digital signal processing (DSP) chips. Another advantage is that computationally intensive compensation algorithms can be used.

The invention also provides various techniques for stimulating the analog amplification chains and training the compensation circuits when no signal is being transmitted. One feature of the invention involves applying training sequences to the compensation/amplification chains (the analog amplification chains and their respective compensation circuits) when no signal is being transmitted, such as during powering up and down of the amplifier and/or between burst transmissions. The use of training signals in this manner allows the compensation/amplification chains to be brought into balance (or maintained in balance) prior to transmissions of information signals. In one embodiment, the training signals applied to the compensation/ amplification chains are in antiphase, so that the training signals substantially cancel when combined; unwanted emissions from the transmitter's antenna are thereby substantially eliminated during training without the need for a costly antenna switch. In other embodiments, an antenna switch may be used to disconnect the antenna during application of the training signals.

The invention also provides various methods and algorithms for computing initial sets of compensation parameters, and for updating the compensation parameters using training sequences or a random transmission signal. In the preferred embodiment, a numerical model is initially generated to model the imperfections introduced to the component signals by the amplification chains and the signal combiner. The model is then used in combination with the compensation circuits, or a software implementation of such circuits, to simulate the overall operation of the amplifier. During the simulation process, test sequences are applied to the amplifier model as a default set of compensation parameters is adaptively updated. Through this process, an initial set of compensation parameters is obtained which may be used to modify the component signals during transmission events. Updates to the compensation parameters are thereafter repetitively computed during transmission and training events, in a non-real-time mode, to maintain the amplifier's distortion level within regulatory specifications.

BRIEF DESCRIPTION OF THE DRAWINGS

These and other features of the invention will now be described with reference to the following drawings of a preferred embodiment of the invention.

DETAILED DESCRIPTION OF A PREFERRED EMBODIMENT

A preferred embodiment of a LINC amplifier, and various design options for implementing the amplifier, will now be described in detail with reference to the drawings. It should be understood, however, that the described embodiment is intended only to illustrate, and not limit, the scope of the invention. The invention is defined only by the appended claims.

For convenience, the description of the preferred embodiment is arranged within the following sections and subsections:

I. Overview

II. Example Hardware Implementations

III. Signal Component Separator

IV. Digital Compensation Signal Processor

V. Example State Machine

VI. Capture of Data Samples

VII. Adaptive Compensation Estimation Methods
   a. Initial generation of compensation parameters
   b. Updates to compensation parameters during operation VIII. Combining of Amplified Signals IX. Digital-to-Analog and Up Conversion X. Monitoring of Output Signal XI. Training of Compensation System
   a. Generation of antiphase sequences
   b. Selection of training sequences
   c. Powering up and down of amplifier
   d. Real time adjustments to training band
   e. Transitions between training sequences and modulated signal XII. Storage and Reuse of Compensation Parameters XIII. Gain Control and Clipping XIV. Recovery of Waste Energy XV. Effects of Imbalances XVI. Additional Considerations Appendix

I. Overview

Figure 1:
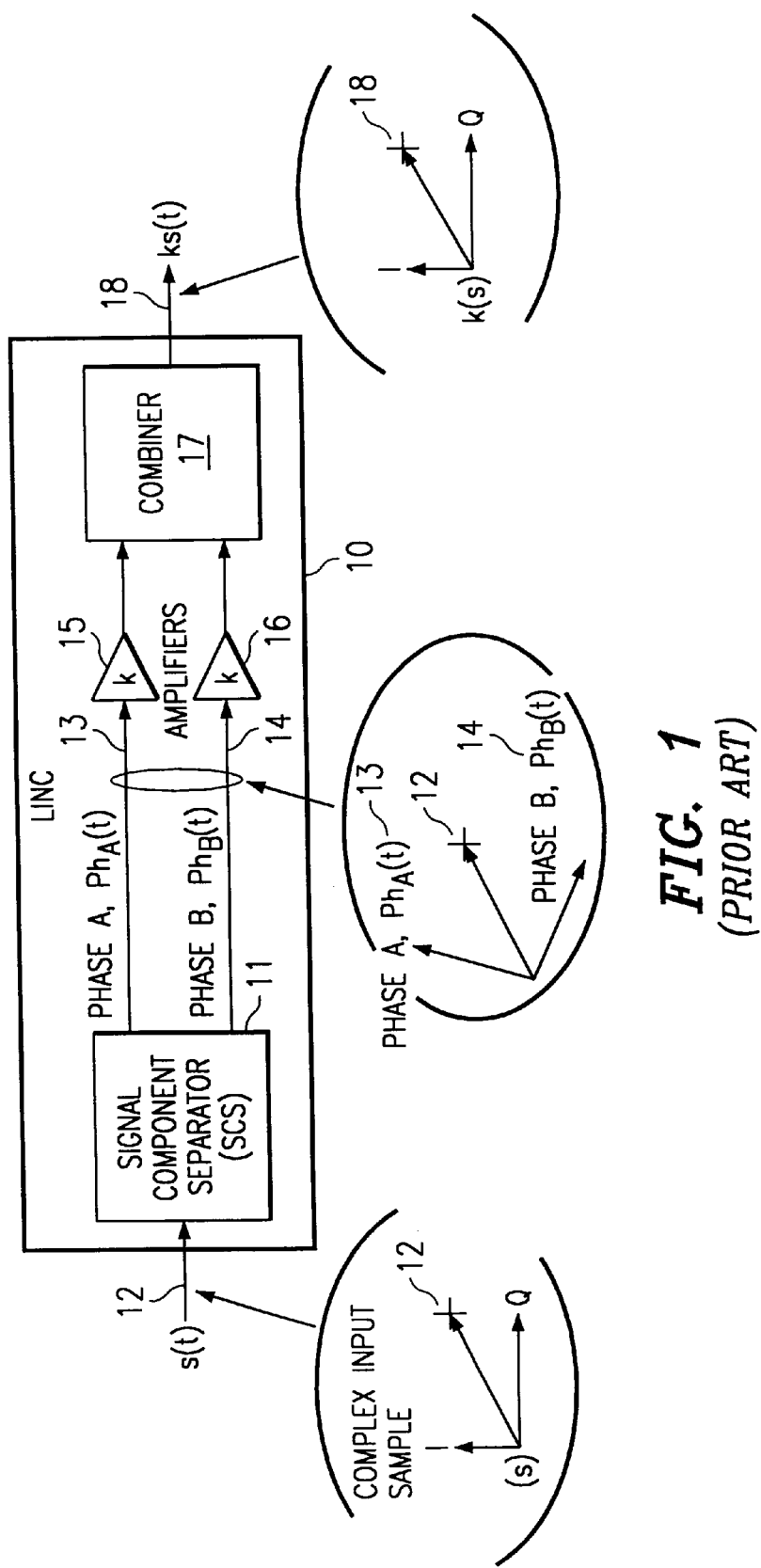
FIG. 1 is a schematic diagram of a prior art LINC amplifier arrangement.
Figure 2:
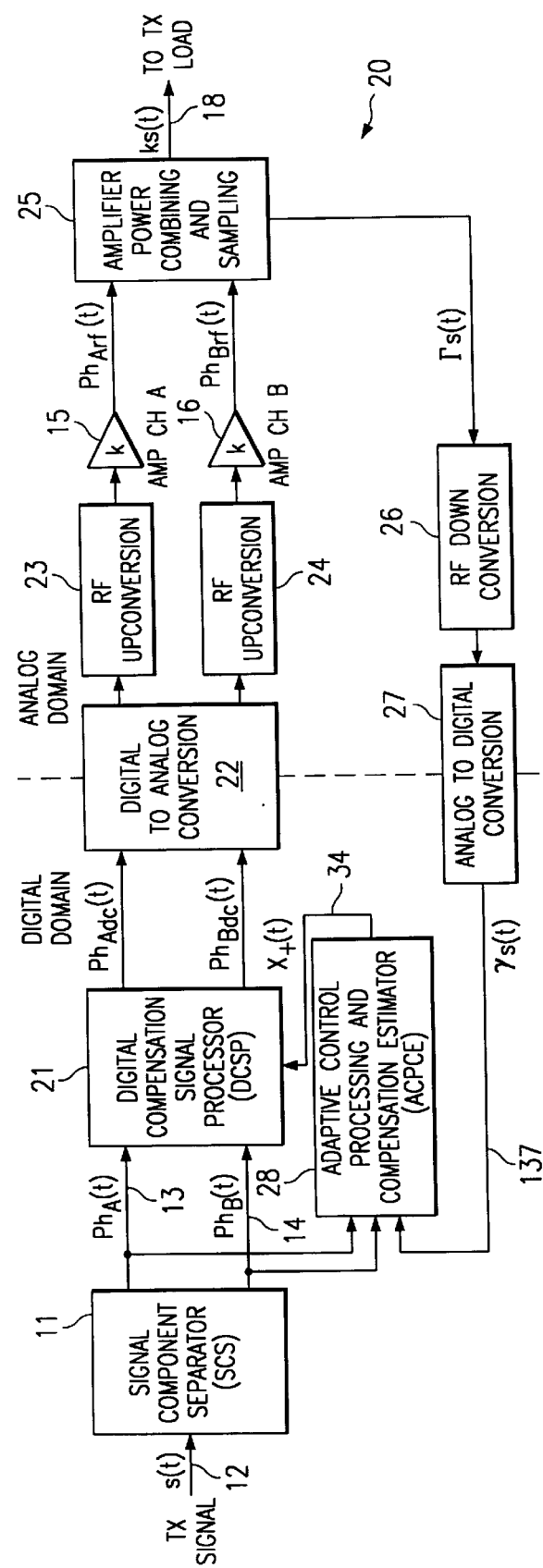
FIG. 2 is a schematic diagram of a LINC amplifier which operates in accordance with the invention.

FIG. 2 depicts a LINC power amplifier 20 which operates in accordance with the invention. The LINC amplifier is preferably incorporated within a transmitter (not shown) of a cellular base station or other wireless communications system. The amplifier 20 is constructed from the following core components: a signal component separator (SCS) 11, a digital compensation signal processor (DCSP) 21, a digital-to-analog conversion circuit 22, two RF up-conversion circuits 23, 24, two nonlinear amplifiers 15, 16, an amplifier power combining and sampling circuit 25, an RF down-conversion circuit 26, an analog-to-digital conversion circuit 27, and an adaptive control processing and compensation estimator (ACPCE) 28. The power combining and sampling circuit 25 includes a quadrature coupler 244 (FIG. 26) which is discussed below.

In operation, the LINC amplifier 10 provides substantially linear amplification from two nonlinear amplifiers 15, 16 by decomposing the original signal 12 to be transmitted into two constant amplitude envelope, phase varying signals $Ph_A(t)$ and $Ph_B(t)$ (also referred to as "phase signals" or "component signals"). As described in detail below, the phase signals are digitally modified by the DCSP 21 to compensate for differences and imperfections in the analog amplification paths. The outputs of the DCSP are converted to analog form by the digital-to-analog conversion circuit 22 (which may comprise separate digital-to-analog converters), up-converted by the RF up-converters 23, 24, and amplified by amplifiers 15 and 16 to form the signals $Ph_{Arf}$ and $Ph_{Brf}$. When combined by the power combining and sampling circuit 25, the signals $Ph_{Arf}$ and $Ph_{Brf}$ constructively and destructively interfere to re-form an amplified version ks(t) of the original signal s(t). This approach is desirable because constant amplitude envelope, phase varying signals can be amplified to form ks(t) 18 without degradation by nonlinear amplifiers 15, 16.

For purposes of clarity, the term "analog chain" will be used herein to refer to the analog signal path (including the associated components) along which each phase signal is up-converted and amplified. Although the analog chains in the preferred embodiment include RF up-converters 23, 24, it will be recognized that the RF up-converters could be omitted, such as in cable modem embodiments and other applications in which conversion to RF is unnecessary. The term "compensation/amplification chain" will be used to refer to the signal path along which a phase signal is digitally modified, converted to analog form, optionally up-converted, and amplified. Thus, each compensation/amplification chain includes an analog chain and the associated circuitry for digitally modifying the phase signal applied thereto.

Ordinarily, a LINC amplifier requires that both analog chains be generally identical and free from imperfections. In practice, it is impossible to build two identical analog circuits, and thus perfect constructive and destructive signal recombining is impossible to achieve. LINC amplifiers are extremely sensitive to phase, delay and amplitude imbalance between the two analog chains which has caused the LINC design to be abandoned by many investigators. The inventive LINC amplifier solves this problem by providing an adaptive compensation and control scheme to compensate for the differences between the two analog chains. Using this scheme, balance is achieved between the compensation/amplification chains (even though the analog chains may be significantly out of balance) such that each phase signal is processed substantially identically. The distortions normally caused by differences in the analog chains are thereby avoided.

Figure 3A:
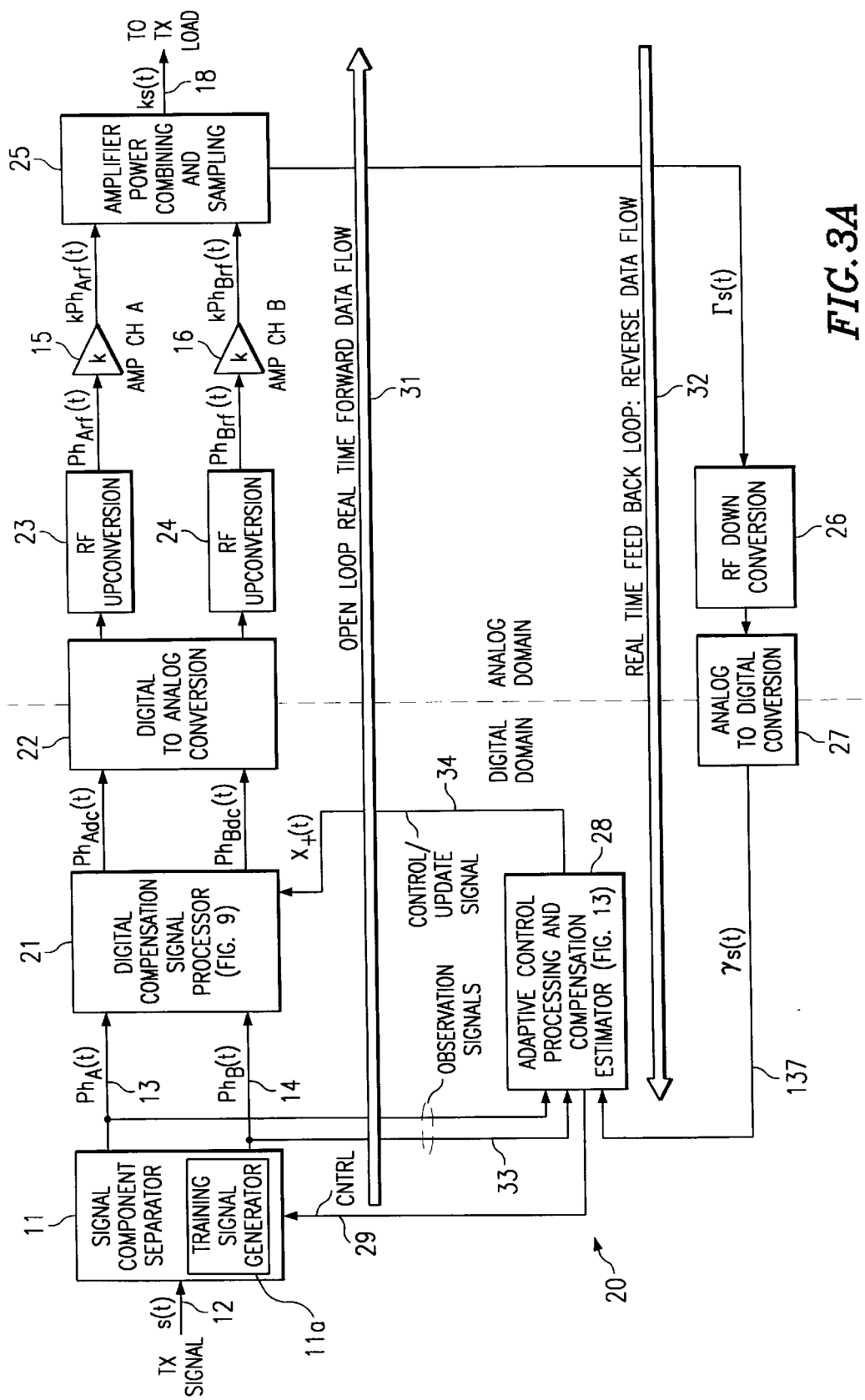
FIG. 3A depicts the data and control flow of the amplifier of FIG. 2.

FIG. 3A depicts the data and control flow paths within the system of FIG. 2. The general overall operation of the system of FIG. 2 is described by following these major data flows.

The open loop real time forward data flow path is concerned with the direct flow of data or signals from the applied input signal s(t) through to amplifiers 15, 16. This path operates in real time. The signal component separator 11 generates two wideband constant amplitude envelope phase varying signals along paths 13 and 14. An SCS 11 which separates the input signal s(t) into more than two components could alternatively be used, if desired, in which case additional compensation/amplification chains would be provided. The signal processing sample rate used to provide this separation is between 8 and 16 times the bandwidth of the complex bandlimited input signal s(t) 12. Note that the baseband samples could be interpolated up to the higher rate, as needed by the signal component separator. This would generate the two phase modulated component signals at up to 16 times the input sample rate. This allows the SCS to operate from sample to sample at that rate.

Figure 3B:
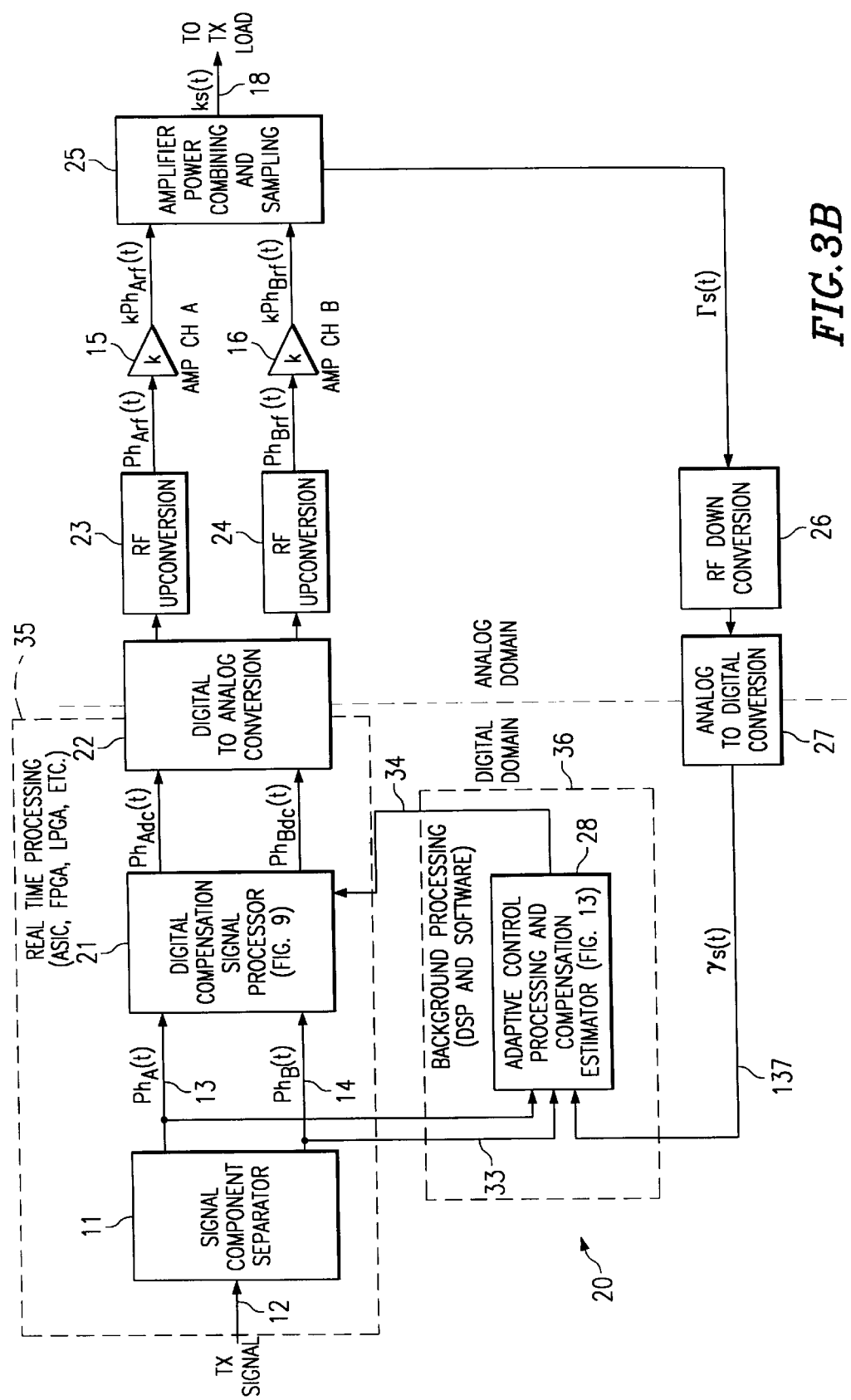
FIG. 3B illustrates how real time and background processing units can be used to perform the digital processing tasks in the FIG. 2 system.
Figure 4A:
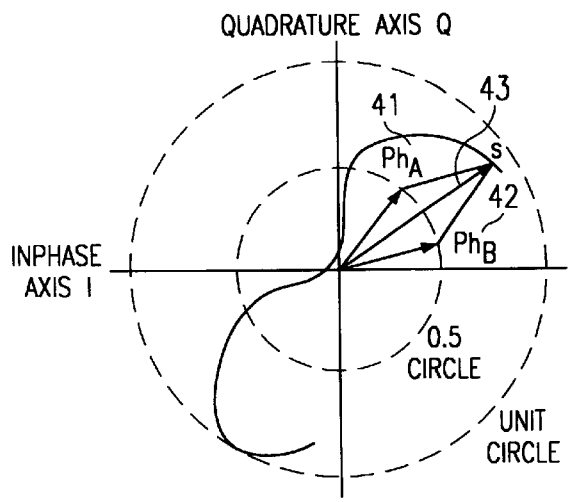
FIGS. 4A–4D depict graphs of the operation of the signal component separator of FIG. 2.
Figure 4B:
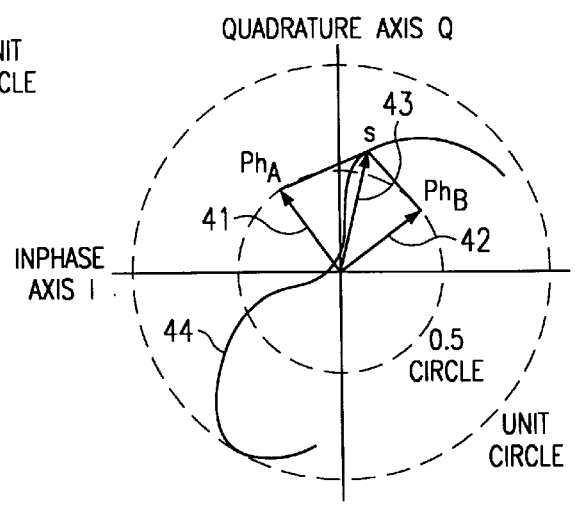
Figure 4C:
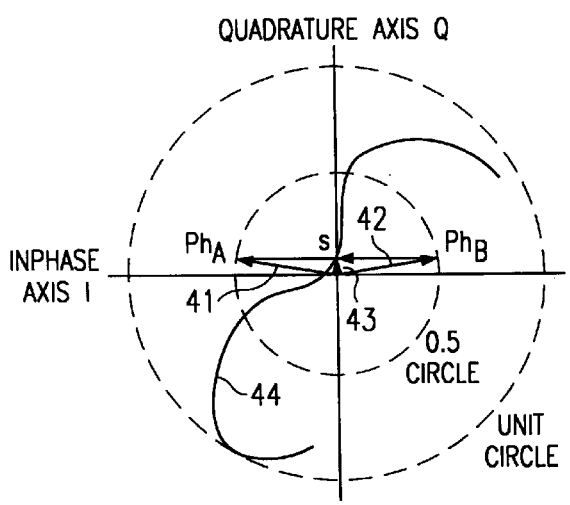
Figure 4D:
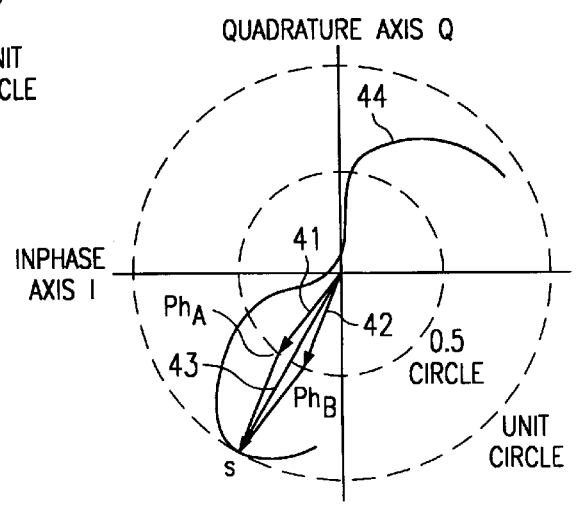

With further reference to FIG. 3, since the system 20 employs analog components, which have manufacturing imperfections, the system uses feedback control to ensure near-perfect operation. One method of achieving this control is by constructing a feedback loop which operates in real time and provides compensation by using data from the output of amplifier power combiner 25. However, real time adaptive control processing and compensation estimation is not required because the imperfections in the RF upconversion stages 23, 24 and the amplifiers 15, 16 change very slowly as a function of time. As described below, this permits off line computation to be achieved by allowing the ACPCE 28 to extract a sequence of samples of the amplified output and sequences of samples of the two phase signals. This data is used to compute residual imperfections in the analog chains and then identify parameter corrections that should be made by the digital compensation signal processor (DCSP) 21. The updated parameters are provided to the DCSP 21 via the control update signal path 34.

The complex baseband signal s(t) that is intended to be amplified is applied to the input of signal component separator (SCS) 11. In the digital design, the SCS 11 requires that s(t) be a bandlimited complex baseband signal. If s(t) is only available as a real passband digital IF or real analog RF passband signal then it must be converted to a complex baseband representation. This modification is performed by using known techniques such as Hilbert transforms and digital mixing.

As indicated above, the SCS 11 decomposes complex signal s(t) into two constant amplitude envelope, phase varying complex baseband signals, $Ph_A(t)$ and $Ph_B(t)$. These two signals are deliberately constructed so that when recombined by simple linear addition, the original transmitted signal s(t) is reconstructed as described by equation 1.

$$s(t) = Ph_A(t) + Ph_B(t) \qquad \text{eqn 1}$$

The signals $Ph_A(t)$ and $Ph_B(t)$ are passed to the digital compensation and signal processor (DCSP) 21. The DCSP inserts phase rotations, propagation delays, amplitude gains, DC offsets and IQ cross talk into each of the $Ph_A(t)$ and $Ph_B(t)$ signals, as required, to correct errors introduced in the analog chains. The amount of compensation is commensurate with that required to cancel the imperfections incurred by the analog chains. Since each analog chain is independent, the corrections for each signal path may be entirely different.

The DCSP 21 provides two digital compensated signals $Ph_{Adc}(t)$ and $Ph_{Bdc}(t)$ to the digital to analog conversion block 22. Note that the digitally compensated signals, $Ph_{Adc}(t)$ and $Ph_{Bdc}(t)$, are no longer necessarily required to satisfy the constant amplitude envelope condition. This can be seen when the DCSP 21 corrects for frequency dependant amplitude variations in the analog chain.

Figure 26:
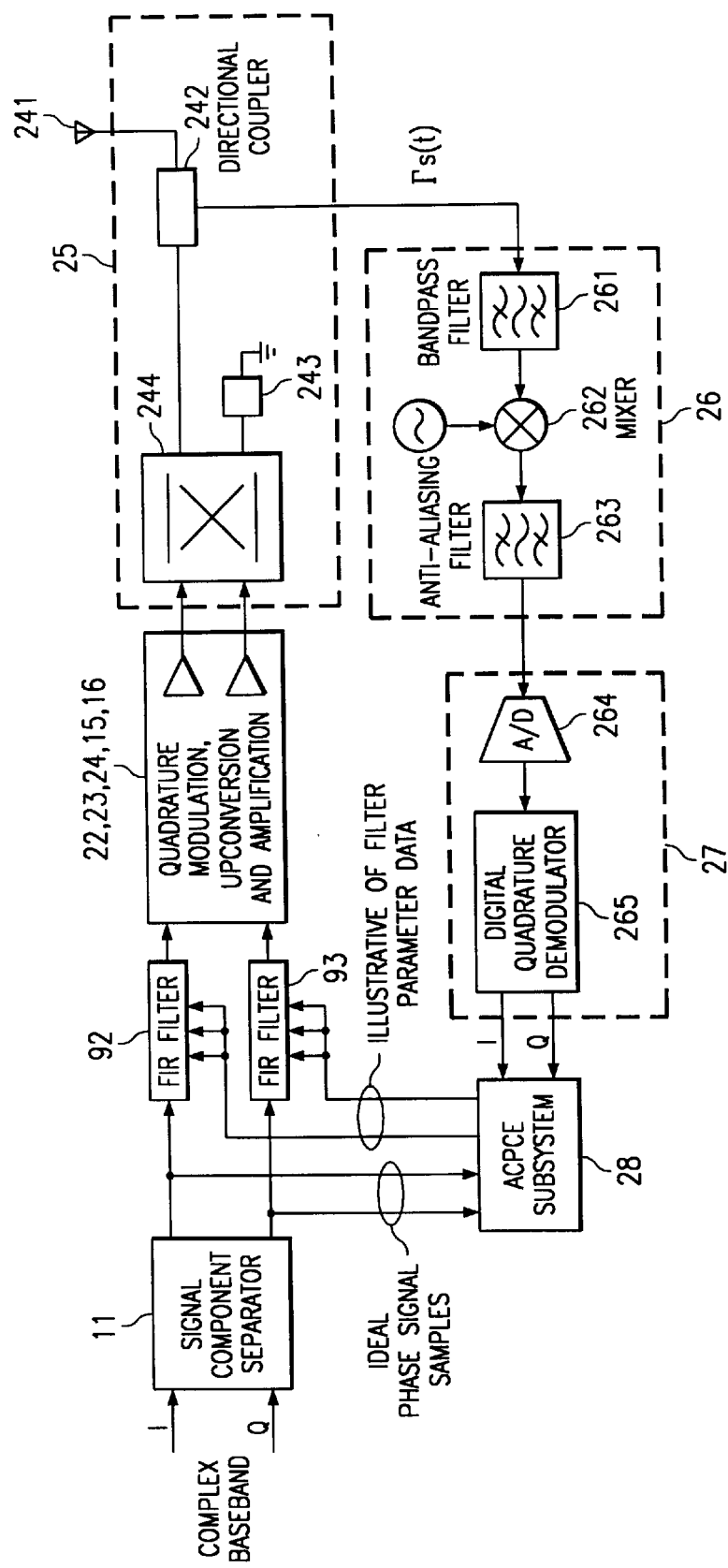
FIG. 26 depicts an arrangement for monitoring the output of the LINC amplifier of FIG. 2.

The compensation of the two signals which are initially constant envelope amplitude is arranged to make the two component signal paths match all the way to the point of combination, or equivalently, to bring the compensation/amplification chains into balance. The point at which the signals are balanced occurs at RF inside the quadrature coupler 244 (FIG. 26). There can be amplitude variations due to the upconversion, the amplifiers and even in the quadrature coupler itself. The variations may be slight in the last two, but the signals at the inputs and outputs of the amplifiers are not necessarily absolutely constant envelope amplitude. Non-linear amplifiers driven up at saturation do not exhibit significant gain slope over frequency over the bandwidths required. Quadrature couplers should be chosen to work at a range of frequencies where their characteristics are substantially flat over frequency; however, the existing description assumes perfection. If the correction circuits are to have even a slight effect on the amplifier outputs it is likely that a large amplitude variation will be required at the inputs to the amplifiers. This large variation will be "clipped" and the output of the amplifiers will change only slightly.

When analog quadrature modulators are used it is desirable to additionally correct for DC offsets, gain balance and I/Q crosstalk. This results in other amplitude variations in the signal paths which cancel out the variations in the quadrature modulator. This means that these variations are canceled before the amplifiers. Analog quadrature modulation can be direct when done at the RF frequency and in that case there is no upconversion. It can also be done at a lower intermediate frequency and followed by analog upconversion.

The digital to analog conversion block 22 is used to capture a variety of possibilities by which a complex baseband signal such as $Ph_{Adc}(t)$ and $Ph_{Bdc}(t)$ can be imposed upon an RF carrier. The output signals of block 22 each pass through a respective RF upconversion block 23, 24 to form the RF signals $Ph_{ARF}(t)$ and $Ph_{BRF}(t)$ which are applied to the input of non linear amplifiers 15 and 16. Direct conversion from complex baseband can be achieved by utilizing a quadrature up convertor. This requires that two standard digital-to-analog convertors (DACs) be employed to generate an analog complex baseband signal that is applied to the RF or IF and upconversion process. However, this approach is often undesirable because practical analog quadrature modulators incur significant degradations due to DC offsets and IQ crosstalk (IQ phase and amplitude imbalance). An alternative approach is to deliberately generate a digital IF signal by performing a complex baseband to digital IF conversion which generates a real digital IF signal that uses a DAC to generate a real passband low IF signal that may be up converted to RF. This approach is desirable because essentially a quadrature conversion is achieved within the digital domain which incurs no imperfection. Furthermore the approach is advantageous because only a single DAC is required per RF channel. The approach may however require a more costly up conversion process.

Once the two component signals have been separately upconverted to the frequency required, they can be amplified by the two amplifiers 15, 16. The need for two amplifiers within a LINC amplifier is not a practical limitation. For higher power output, multiple amplifiers can be provided along each analog chain using parallel and/or serial combinations.

The two substantially constant amplitude envelope phase varying RF passband signals $Ph_{ARF}(t)$ and $Ph_{BRF}(t)$ are applied to the inputs of non linear amplifiers 15 and 16. Since the signals exhibit a constant envelope and the non-linear amplifiers are characterized by AM-AM and AM-PM distortion, the RF passband signals may be amplified without incurring any degradation. The output of the amplifiers is at a significantly higher power level, characterized by the gain of the amplifiers k. Thus, the amplifier outputs are defined as $kPh_{ARF}(t)$ and $kPh_{BRF}(t)$, where k is the gain of the amplifier. The amplifier outputs are then fed to the linear amplifier power combining and sampling block 25 which linearly combines the two RF signals in accordance with equation 1. This may be achieved with standard microwave components by those skilled in the art. Since the DCSP 21 has compensated for all analog chain imperfections, the combined $kPh_{ARF}(t)$ and $kPh_{BRF}(t)$ signals will constructively and destructively combine to form the amplified version, ks(t) of the original input signal, s(t). Ordinarily, in an open loop LINC design the signal ks(t) 18 is fed directly to the amplifier load, typically an antenna. Note that a small sample of signal 18 is coupled into the RF down conversion block 26, which forms part of the real time feedback loop path 32 (FIG. 3A).

The ACPCE 28 implements the control algorithms for the LINC transmitter. The ACPCE is responsible, under all operating conditions, for identifying and maintaining the validity of the compensation parameters that are used by the DCSP 21. The control and data flow algorithms used within this block 28 encompass substantially all operating conditions from initial calibration procedures through to on-line parameter update and estimation. The ACPCE also ensures that the operation of the power amplifier is substantially free from spurious emissions when required to switch on and off and also when ramping on and off transmissions.

Figure 11:
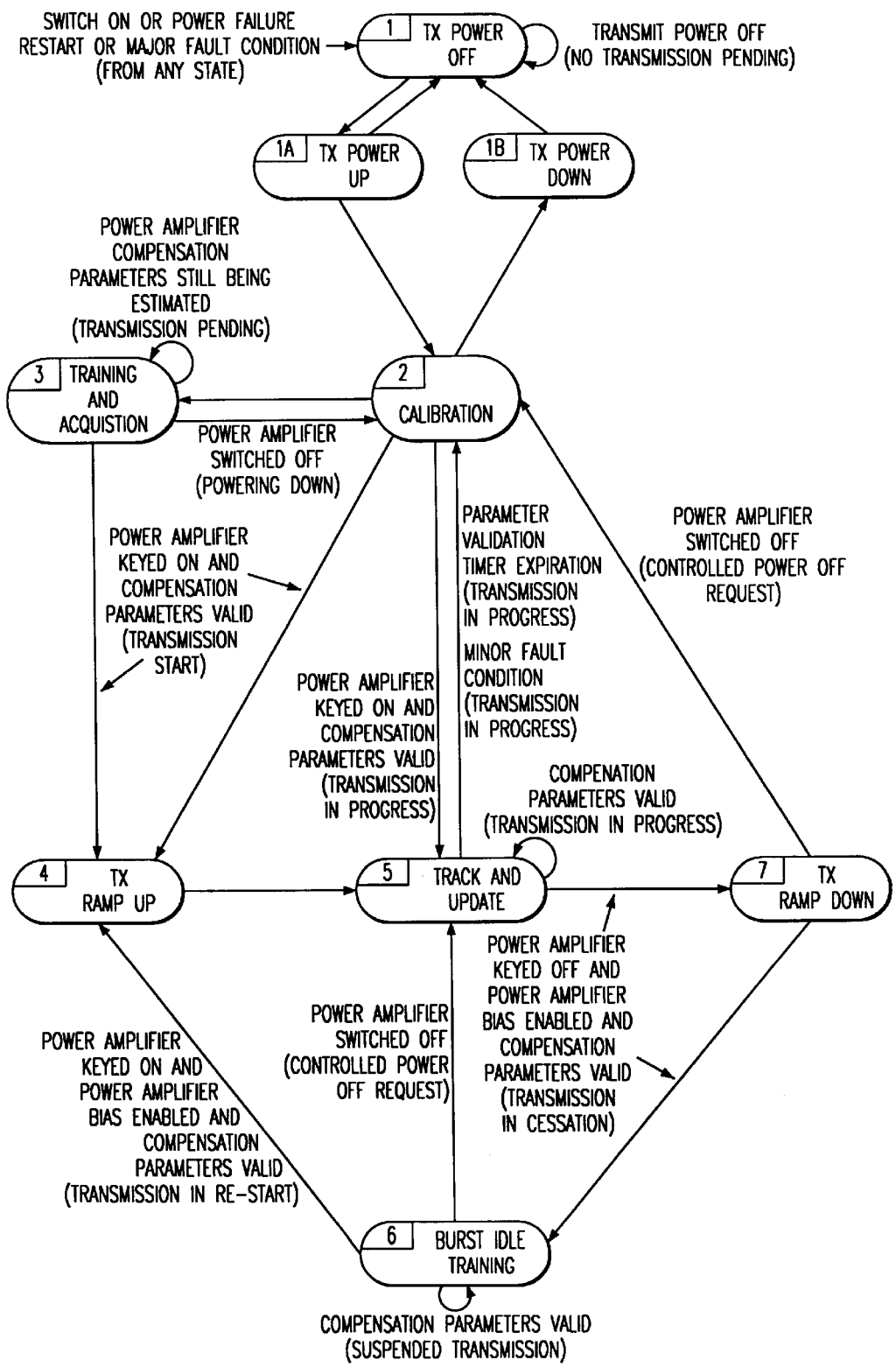
FIG. 11 is a diagram of a state machine of adaptive control processing and compensation estimator of FIG. 2.
Figure 12:
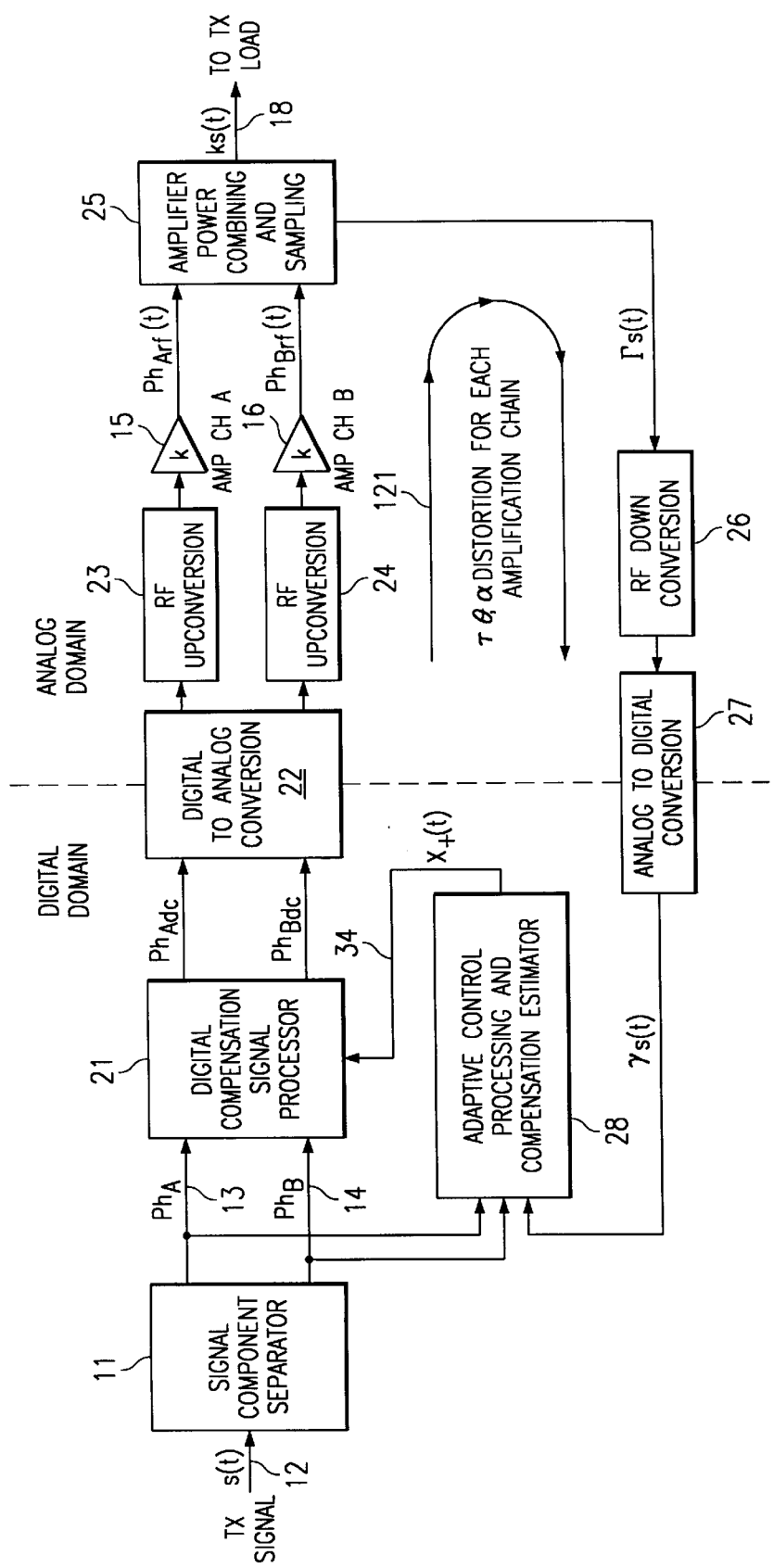
FIG. 12 depicts inputs and outputs and distortion to be corrected by the adaptive control processing and compensation estimator of FIG. 2.

The ACPCE logically comprises two functional units: an adaptive compensation estimator (not shown) and a state machine (FIG. 11). The adaptive compensation estimator is preferably implemented through firmware, and is responsible for generating initial compensation parameters and then updating these parameters during the normal operation of the amplifier (including training). The methods used by the adaptive compensation estimator are described below under the heading "Adaptive Compensation Estimation Methods." The ACPCE state machine is preferably implemented through firmware and/or dedicated hardware, and controls the overall operation of the amplifier. The state machine is responsible, among other things, for determining whether the compensation/amplification chains are sufficiently balanced to commence transmissions, and for instructing the SCS to generate pre-set training and stimulation sequences. The state machine is described below under the heading "Example State Machine."

With further reference to FIG. 2, the signal $\Gamma s(t)$ is down-converted to complex baseband by the RF down conversion block 26 and analog to digital conversion block 27. As described earlier, various techniques are available which permit cost, complexity and imperfection trade-offs to be made. Thus the real RF passband signal, $\Gamma s(t)$, is translated to a complex baseband equivalent signal, $\gamma s(t)$ 137 which is used by the ACPCE block 28. This block 28 is also provided with the complex baseband signals, $Ph_A(t)$ 13 and $Ph_B(t)$ 14 and forms observation signal path 33. The ACPCE 28 examines these three signals, and determines the remaining level of imperfection in the analog up conversion process which has not been previously corrected. This information is then used to compute updates to the existing correction parameters. These new parameters are then provided to the DCSP 21 via $Ph_+(t)$, which is a vector of the latest estimates of the correction parameter values and forms control/update signal path 34. After each new parameter set has been provided to the DCSP 21, the ACPCE 28 selects another set of data samples for processing. As indicated above, the ACPCE's adaptive compensation algorithms need not be implemented in real time because the rate of change observed in the output signal $ks(t)$ as the result of changes in analog component values is relatively slow. This permits the open loop LINC amplifier 20 to be controlled with an off line closed loop controller. Note that an operating bandwidth constraint has not been placed upon system 20. Typical real time closed loop systems are constrained by the loop delay which infers a finite operating bandwidth which is generally 10× lower than the open loop bandwidth.

One feature of the invention involves the use of antiphase training signals to train the amplifier's compensation circuits 21, 28 when the amplifier is not being used to transmit an information signal. As depicted in FIG. 3A, these training signals are generated by a training signal generator 11a. The training signal generator 11a is preferably implemented as part of the SCS 11, but could alternatively implemented elsewhere within the system. Because the training signals are in antiphase (i.e., the signal provided along one path 13 is approximately 180 degrees out of phase with the signal provided along the other path 14), the two signals substantially cancel when combined—assuming the two compensation/amplification chains are sufficiently balanced. Thus, emissions from the transmitter's antenna are substantially inhibited without the need for a costly antenna switch.

The use of antiphase stimulation signals assumes that the LINC amplifier has exactly two compensation/amplification chains. In embodiments in which more than two compensation/amplification chains are provided, cancellation of the stimulation signals can be achieved, for example, by using equal-amplitude signals that are spaced apart in phase by 360/(number of chains) degrees.

The SCS 11 can be configured or instructed to generate the antiphase training signals at any suitable time during which no information signal is being transmitted. For example, the training signals can be generated during power-up of the amplifier, power-down of the amplifier, and/or between burst transmissions such as those which occur on assigned transmission time slots in a TDMA (time division multiple access) system. In one embodiment, an "intelligent" SCS is used which automatically enters into a training signal generation mode when no signal is present at the input to the SCS. As depicted by the control path 29 in FIG. 3A, the generation of antiphase training signals is also preferably controlled by the ACPCE 28.

The use of antiphase training signals, including various algorithms for selecting and varying the frequencies of the training signals, is described in detail below in section XI titled "Training of Compensation System."

II. Example Hardware Implementations

As will be recognized by those skilled in the art, the SCS 11, DCSP 21 and ACPCE 28 can be implemented using a wide range of different types of hardware components. The selection among such components is generally a matter of design choice.

In applications in which the composite bandlimited signal is limited to about 100 kHz or less, all of the functions of the SCS, DCSP and ACPCE can be implemented using one or more general purpose digital signal processing (DSP) chips. Fixed and floating point precision DSP chips from Texas Instruments, AT&T, DSPG and Analog Devices are suitable for this purpose.

In applications in which the frequencies are significantly higher than 100 kHz, such as wideband multicarrier cellular amplifier applications, it is currently not practical to implement the real-time, forward data flow processing tasks using general purpose DSP chips. Consequently, the signal processing which takes place in the digital domain is preferably divided into two main blocks (FIG. 3B): a real time processing block 35 which handles the processing tasks associated with the SCS 11 and the DCSP 21 (and optionally portions of the D-to-A converters 22), and a background processing block 36 which handles the processing tasks associated with the ACPCE 28. The real time processing block 35 is preferably implemented using field programmable gate arrays (FPGAs), laser programmable gate arrays (LPGAs), and/or application specific integrated circuits (ASICs). The background processing block 36 is preferably implemented using general purpose DSP chips due to the complexity of the adaptive compensation algorithms.

In one such embodiment, the DSP chip 36 is a separate device which executes the ACPCE algorithms in the background and provides the resulting compensation parameters to the faster, real-time processing block (e.g., ASIC) 35. In other embodiments, various levels of system integration may be used to combine the various functional units within a single device. For example, using commercially-available DSP cores, the DSP chip can be integrated with the real time digital signal processing circuitry (SCS and DCSP) on a single chip, with the DSP software stored in a masked ROM. In future implementations, it is contemplated that it will also be practical to integrate the analog-to-digital and digital-to-analog converters 22, 27 onto the same device to provide a single-chip solution.

III. Signal Component Separator

The operation of the SCS 11, excluding the antiphase training signal generation functions, will now be described with reference to FIGS. 3–8.

As depicted by FIG. 3A, the SCS 11 decomposes a bandlimited complex baseband waveform, i.e., the information bearing signal s(t) 12, into two complex baseband constant amplitude phase varying signals, $Ph_A(t)$ 13 and $Ph_B(t)$ 14. The decomposition is subject to the requirement that when the two signals, $Ph_A(t)$ and $Ph_B(t)$, are recombined by linear addition, the resultant vector reconstructs the original signal s(t). Thus, non linear amplifiers, such as class AB, C, E, F and S can be used to amplify the constant amplitude envelope phase varying signals, $Ph_A(t)$ and $Ph_B(t)$, without incurring any significant distortion. This can be achieved because amplifiers are characterized by amplitude to amplitude, AM-AM, and amplitude to phase, AM-PM, distortion characteristics. If the amplitude of the waveform/signal that is applied to the amplifier is constant, then no variation in phase or amplitude is observed at the output of the amplifier. Therefore, distortion products are not generated.

Many prior art methods of signal component separation use analog mechanisms which were subject to parameter variation and drift. Using digital signal component separation gives controlled precision defined by the digital resolution. There is quantization error but this is controlled at the design stage and remains unchanged. The stable and precise signal components make the task of correction easier by removing a source of inaccuracy. A digital version of the component separator was published in 1988 in the open literature (*The Application of Digital Signal Processing to Transmitter Linearization*, Authors: A. Bateman, R. J. Wilkinson and J. D. Marvill, IEEE 88CH2607-0, pp.64–67) and also in 1991 (*A LINC Transmitter*, Authors: S. A. Hetzel, A. Bateman and J. P. McGeehan, IEEE CH2944-7/91/0000/0133, pp. 133–137; *LINC Transmitter*, Authors: S. A. Hetzel, A. Bateman and J. P, McGeehan, Electronics Letters 9th May, 1991 Vol. 27 No. 10, pp. 844–846), and *Performance Trade-Offs With Quasi Linearly Amplified OFDM Through a Two-Branch Combining Technique*, Authors: Rui Dinis, Paulo Montezuma and Antonio Gusmao, IEEE 0-7803-3157-5/96, pp. 899–903, which are all incorporated herein by reference. The mathematical development of the signal component separator is undertaken by examining equation 2 which describes the input signal s(t), which is the signal to be amplified, as samples of a bandlimited complex baseband signal. This description imposes no limits upon the nature of the signal s(t) other than it is bandlimited. Thus, the signal trajectory may migrate to any location within the complex plane provided that the rate of change of amplitude and phase does not violate the bandlimited criteria. Note that the finite output power of the amplifiers will impose an additional constraint upon the signal s(t).

$$s(t)=I(t)+jQ(t) \qquad \text{eqn 2}$$

The signal s(t) 12 may be decomposed into two components $Ph_A(t)$ 13 and $Ph_B(t)$ 14 as described by equations 3a and 3b. Equation 3c represents a common term.

$$Ph_A(t) = \frac{I(t)}{2} - Q(t)\xi(t) + j\left(\frac{Q(t)}{2} + I(t)\xi(t)\right) \qquad \text{eqn 3a}$$

$$Ph_B(t) = \frac{I(t)}{2} + Q(t)\xi(t) + j\left(\frac{Q(t)}{2} - I(t)\xi(t)\right) \qquad \text{eqn 3b}$$

$$\xi(t) = \sqrt{\frac{1}{I^2(t)+Q^2(t)} - \frac{1}{4}} \qquad \text{eqn 3c}$$

Examination of equations 3a,b and c reveals that the signals $Ph_A(t)$ and $Ph_B(t)$ are complex baseband signals with constant amplitude envelopes and phase varying modulation trajectories. Consequently, these signals meet the criteria for distortion free amplification by non linear amplifiers. Equation 4 confirms that the signal component separation has also satisfied the requirement that the original signal can be recovered.

$$s(t)=Ph_A(t)+Ph_B(t)=I(t)+jQ(t) \qquad \text{eqn 4}$$

The above analysis demonstrates that signal component separation can be achieved at complex baseband. However, in practice, each constant amplitude envelope, phase varying signal component is up converted to a real passband RF signal, which is amplified and combined at RF. Consequently, it is appropriate that the recombination process is verified at RF. Equation 5 decomposes the real passband signal $S_{RF_{LINC}}(t)$ into in-phase and quadrature components.

$$s_{RF}(t)=I(t)\cos \omega_c t - Q(t)\sin \omega_c t \qquad \text{eqn 5}$$

Equation 6 provides the linear combination of the two real passband signals that would be used in the power combining process to form $S_{RF_{LINC}}(t)$ $$s_{RF_{LINC}}(t) = \left(\frac{I(t)}{2} - Q(t)\xi(t)\right)\cos\omega_c t - \left(\frac{Q(t)}{2} + I(t)\xi(t)\right)\sin\omega_c t + \qquad \text{eqn 6}$$
$$\ldots \left(\frac{I(t)}{2} + Q(t)\xi(t)\right)\cos\omega_c t - \left(\frac{Q(t)}{2} - I(t)\xi(t)\right)\sin\omega_c t + \ldots$$

Simplification of equation 6 yields equation 7.

$$S_{RF_{LINC}}(t)=I(t)\cos \omega_c t - Q(t)\sin \omega_c t \qquad \text{eqn 7}$$

Note that equation 5 and equation 7 are identical, which indicates that the RF upconversion process will not undermine the efficacy of the signal decomposition provided by the signal component separator.

FIGS. 4A–4D depict the general operation of the signal component separator 11, as the signal trajectory varies. These figures illustrate a portion of a signal trajectory in the complex baseband modulation plane which corresponds to a signal s(t). The figures also illustrate that the signal trajectory is constrained within the unit circle. Note that two vectors, $Ph_A$ 41 and $Ph_B$ 42, each of amplitude ½, may be used to reconstruct any point upon the signal trajectory. The original signal trajectory point is simply reconstructed by adjusting the phases of the signal component vectors, $Ph_A$ 41 and $Ph_B$ 42, such that an appropriate portion of each vector constructively interferes to reform the vector s 43, while any excess destructively interferes. The equation presented, in the previous section, permits the vectors $Ph_A$ 41 and $Ph_B$ 42 to be directly computed for any point upon the signal trajectory. Note that the time dependence of these vectors has been suppressed. Thus, input signal s 43 is zero when the vectors, $Ph_A$ 41 and $Ph_B$ 42, are adjusted to be in exact antiphase. Alternatively, if the input signal approaches unity amplitude then the vectors, $Ph_A$ 41 and $Ph_B$ 42, are co-phased. Naturally, the instantaneous phase of the signal s 43 is readily reformed by rotating the vectors, $Ph_A$ 41 and $Ph_B$ 42, by a common reference phase.

Figure 5:
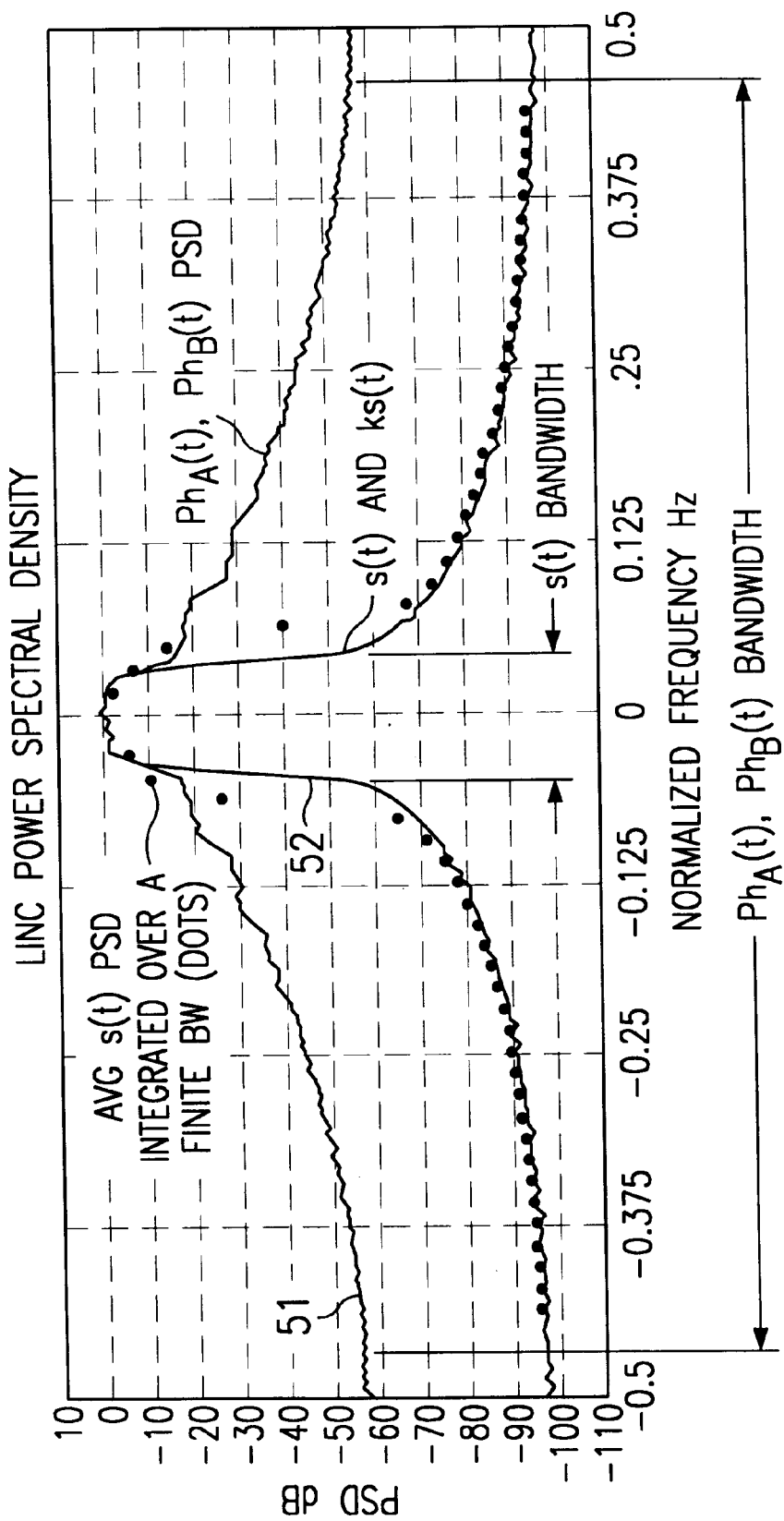
FIG. 5 depicts a graph of the power spectral densities of various signals in the amplifier of FIG. 2.
Figure 6A:
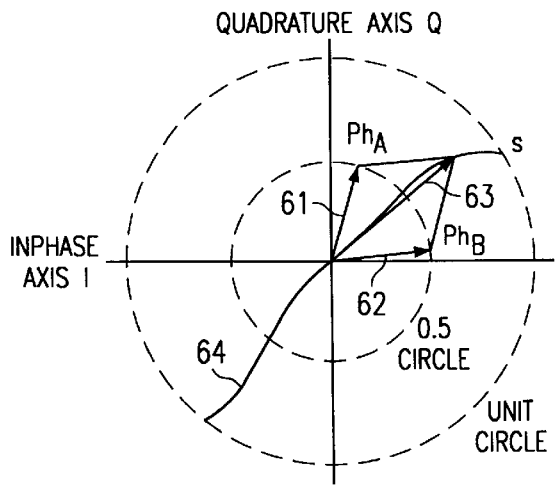
FIGS. 6A–6D depict graphs of the operation of the signal component separator of FIG. 2 having rapid phase changes in the signal components.
Figure 6B:
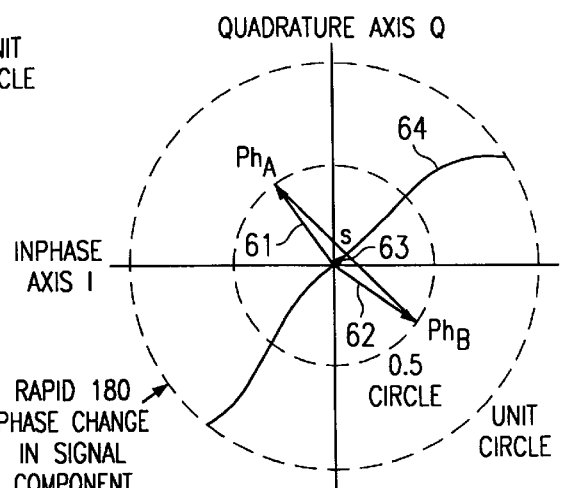
Figure 6C:
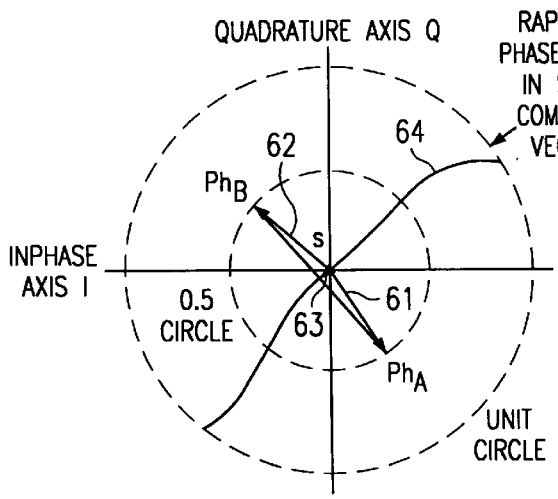
Figure 6D:
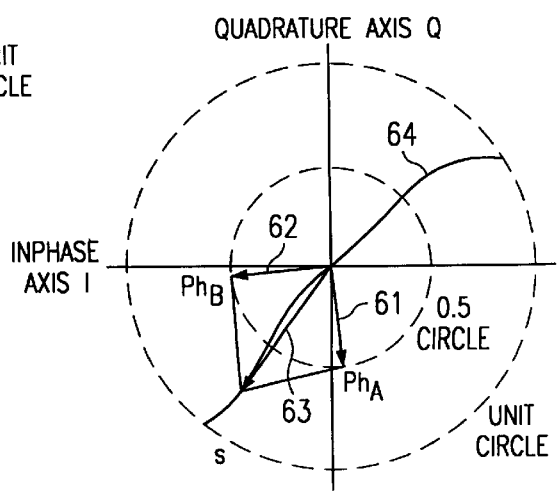

Any bandlimited complex baseband signal could be decomposed by the signal component separator into two constant amplitude envelope phase varying signals. However, a penalty associated with this technique is that the signal components $Ph_A(t)$ and $Ph_B(t)$ undergo a significant bandwidth expansion. FIG. 5 illustrates this effect, wherein the power spectral density 51 is significantly wider than the PSD 52 of the original signal s(t) 12. Note that after recombination the power spectral density 52 of the amplifiers combined outputs ks(t) 18 is identical to the original signal, assuming that the amplifier gain has been normalized. This permits a dual frequency domain interpretation of the LINC operation which is identical to the time domain. That is, co-phased information within the signal components $Ph_A(t)$ and $Ph_B(t)$ that constructively interferes is constrained within the original signal bandwidth, while the anti-phase information which destructively interferes lies outside the original signal bandwidth. This permits frequency domain amplifier efficiency analysis to be performed by simply integrating the PSD over these two regions.

A significant contribution to the generation of spectral energy beyond the bandwidth of the complex baseband signal s(t) is shown in FIGS. 6A–6D. These figures depict a portion of the complex envelope signal trajectory s(t) 64 as it migrates across the complex modulation plane. The path of the trajectory is such that the loci directly passes through the origin, invoking a 180 degree phase change. This does not cause bandwidth expansion in the original signal s(t) 12 because the transition is associated with a zero amplitude. However, if the behavior of the signal component separator wherein equations 3a, b and c are used, then the two signal components $Ph_A(t)$ and $Ph_B(t)$ must undergo an almost instantaneous 180 degree phase shift, if the original signal s(t) is to be correctly reconstructed. This effect is observed by comparing FIGS. 6B and 6C in FIG. 6. Since the component signals, $Ph_A(t)$ and $Ph_B(t)$, have a constant amplitude and hence finite power, the rapid phase change will cause high frequency power spectral components to be generated.

This problem can be avoided by using a mechanism to identify 180 degree phase transitions of the complex modulation plane by the original signal. Rapid phase transitions in the signal components can be eliminated by switching the context of the signal components, so that the rapid phase change in the signal components does not occur. Note that it is irrelevant from a system perspective if the resultant recombined signal s(t) is formed from two vectors that have switched context or not, provided that the resultant signal vector exactly follows the original signal trajectory, s(t). This approach is depicted in FIG. 7.

Figure 7A:
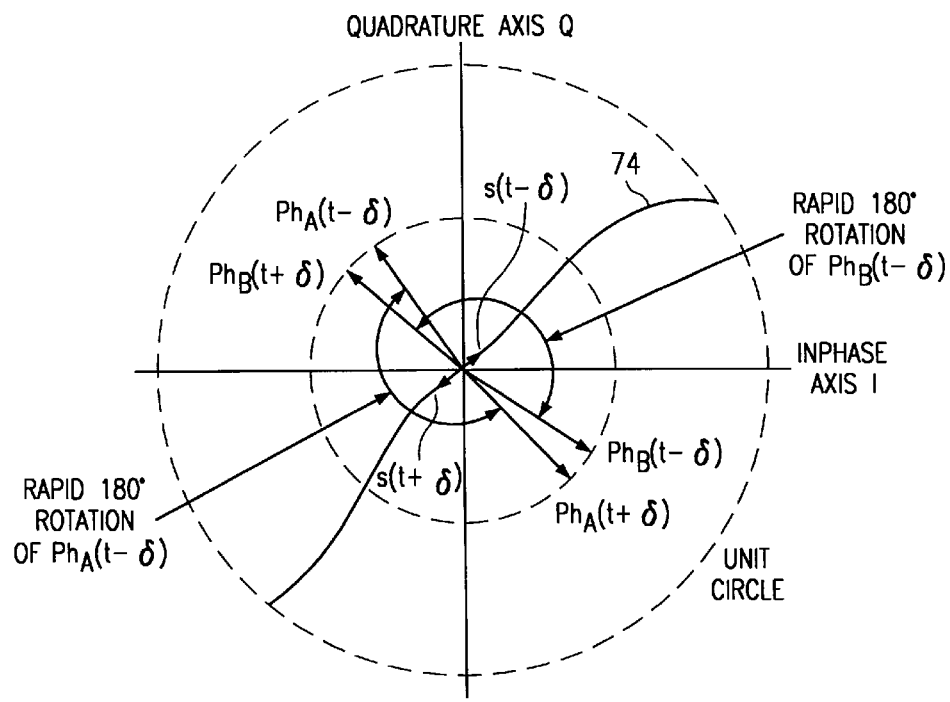
FIGS. 7A–7B depict graphs of the operation of the signal component separator of FIG. 2 without the rapid phase changes of FIG. 6.
Figure 7B:
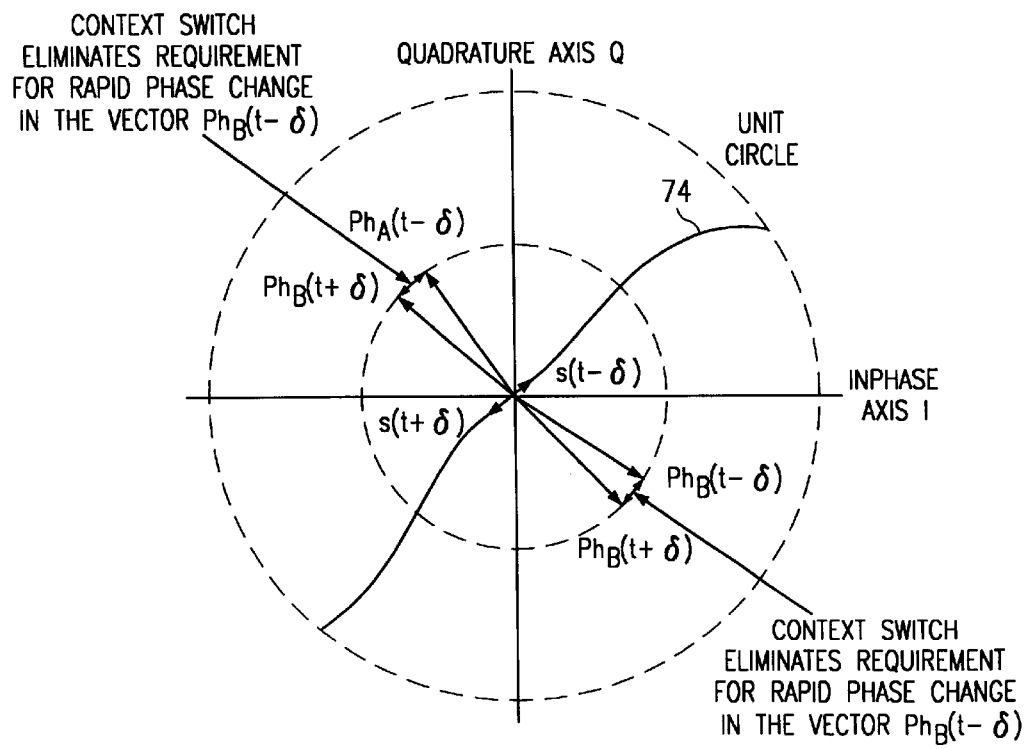

FIGS. 7A and 7B show a trajectory which crosses the origin of the complex plane. This is represented by the two components $Ph_A$ and $Ph_B$. As the trajectory gets close to the origin, the two components move to a position at 180 degrees apart, where flip would actually occur. Note that it is assumed that this occurs at a time (t). The signal component separator works on samples in and gives samples out. This means that the positions are seen at discrete instants. In this case, there are two sets of samples of the two phase components at times an amount delta before and after (t). That is (t−δ) before and (t+δ) after the point, which is typical of how the samples would be generated by the signal component separator.

FIG. 7A shows the movement required to follow the paths. Successive samples of the two components have a large phase difference which generates a burst of a high modulation frequency in their respective analog chain. This is a frequency component which deviates a long way from the center of the signal band. This is seen in the individual signal paths of the successive sample values. A swap of the source signals at the output of the signal component separator produces the situation as seen in FIG. 7B. The resultant trajectory is the same but the amount of movement from one sample to the next in each individual analog chain is much smaller which results in a much lower frequency deviation.

This enhancement may be incorporated into the component separator 11 by including DSP logic, firmware, digital ASIC switches, or analog switches that simply alternate $Ph_A(t)$ and $Ph_B(t)$ between the two compensation/amplification chains for each phase crossing that occurs.

Figure 8:
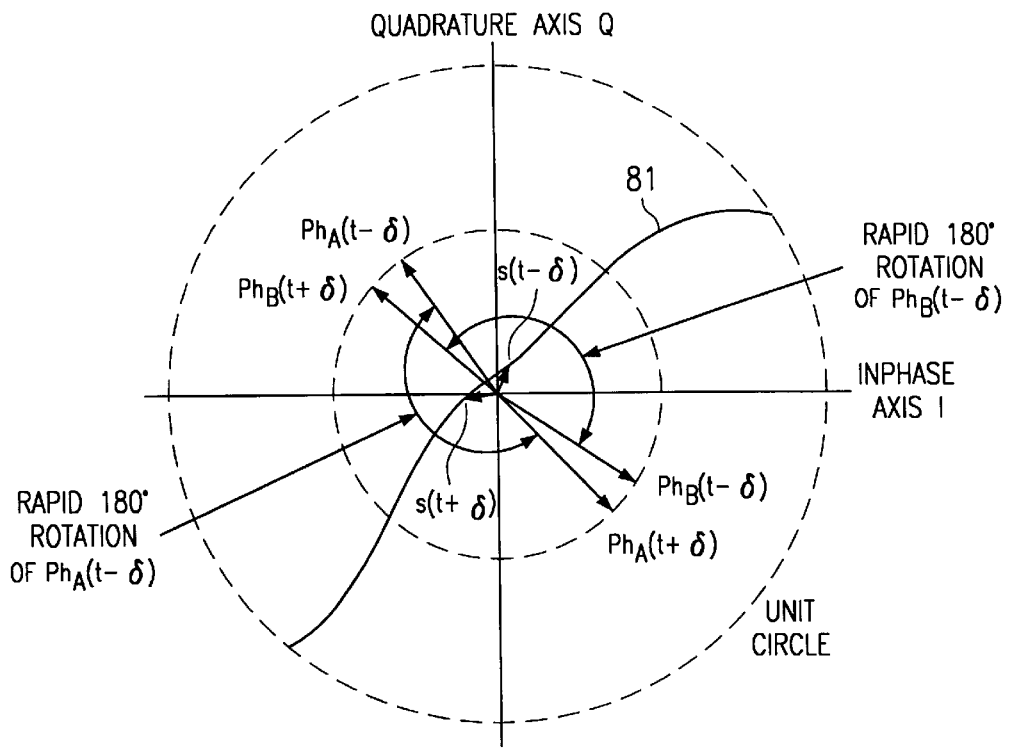
FIG. 8 depicts a graph of the operation of the signal component separator element of FIG. 2 with context switching enabled, but still having a rapid phase change of the signal components.

Note that context switching does not eliminate all situations that may cause the signal components, $Ph_A(t)$ and $Ph_B(t)$, to traverse a rapid phase change in the complex modulation plane. As shown in FIG. 8, a signal trajectory 81 does not exhibit a 180° phase change, but does exhibit a trajectory that causes the components to rapidly swing through a massive phase shift. Context switching will not eliminate the phase shift in this situation. Therefore, rapid phase transitions in the signal components, $Ph_A(t)$ and $Ph_B(t)$, will occur when the underlying signal trajectory, s(t) undergoes rapid phase changes when the signal amplitude approaches but does not cross zero. Thus, despite context switching, rapid phase changes may still occur in the signal components, $Ph_A(t)$ and $Ph_B(t)$. This in turn causes a significant level of wide band energy to still occur. Consequently, for accurate reconstruction of the signal trajectory s(t) the signal component separator must over sample by a rate that is approximately 8 to 16 times greater than that required to generate the signal bandwidth. This imposes a maximum limit on the operation bandwidth of the inventive LINC amplifier if a digital component separator is used, because the maximum sampling rate is limited by the speed of ASIC DSP technology.

The generation of the two phase modulated components in the SCS as complex baseband digital signals has been described above. There is an alternative method of direct generation of real signals which vary in frequency about a carrier or intermediate frequency. For example, VCOs may be used to generate the components, in which case basic feedback will be used. This option would require correction to be implemented at that frequency; this is not a preferred option because in a digital implementation the sample rate would be higher than for baseband operation.

An example of a digital method of generation of the SCS output is a Numerically Controlled Oscillator (NCO) which is known to those skilled in the art. This uses a memory look up table containing digital samples of a single cycle of a sine wave. A counter is used to access the samples in sequence to output to a D/A converter. The resulting analog signal is then filtered to remove the sampling frequency. The frequency of the resulting analog sine wave depends on how many of the available samples in the look up table are skipped at each sample interval. As in any sampled representation it is essential to have at least two samples per cycle of the sine wave to be represented. Quadrature baseband signals are generated by accessing one sample for the "I" component and another one at a position 90 degrees separated from it for the quadrature component at each sample instant. Baseband representations of signals result in sequences of samples which appear to rotate in clockwise or counterclockwise directions.

IV. Digital Compensation Signal Processor

Figure 9:
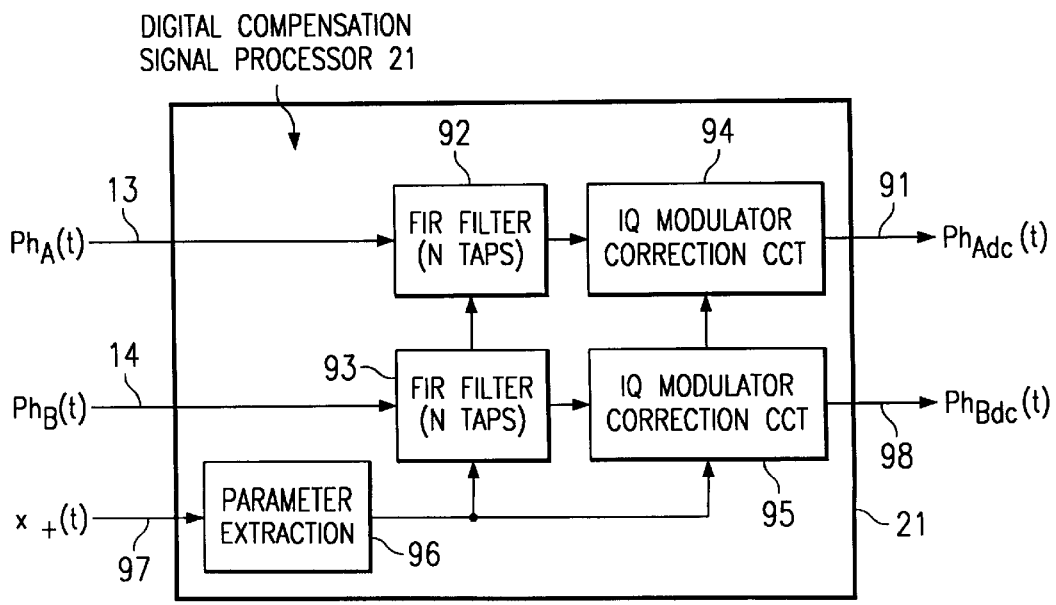
FIG. 9 is a schematic diagram of the digital compensation signal processor of FIG. 2.

The operation of the digital compensation signal processor (DCSP) 21 will now be described in further detail with reference to FIGS. 9 and 10.

The DCSP 21 compensates for the imperfections that are incurred during the up conversion and amplification process. As depicted by FIG. 9, the DCSP operates at real time with samples of the signal components, $Ph_A(t)$ 13 and $Ph_B(t)$ 14, being predistorted to form signal components, $Ph_{Adc}(t)$ 91 and $Ph_{Bdc}(t)$ 98. After RF upconversion, nonlinear amplification, these signals are linearly combined to form an amplified replica of the signal s(t) 12.

Figure 37A:
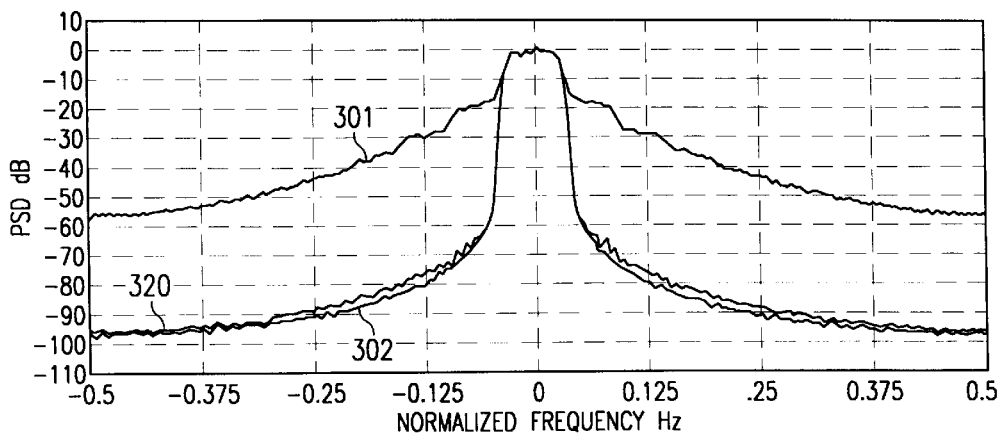
FIG. 37A–37C are graphs of the power spectral densities of the amplifiers with various amplitude imbalances.
Figure 37B:
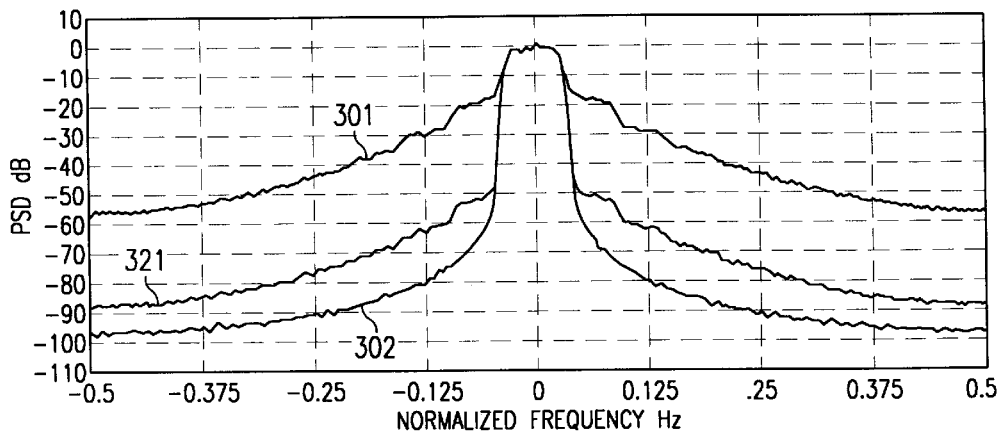
Figure 37C:
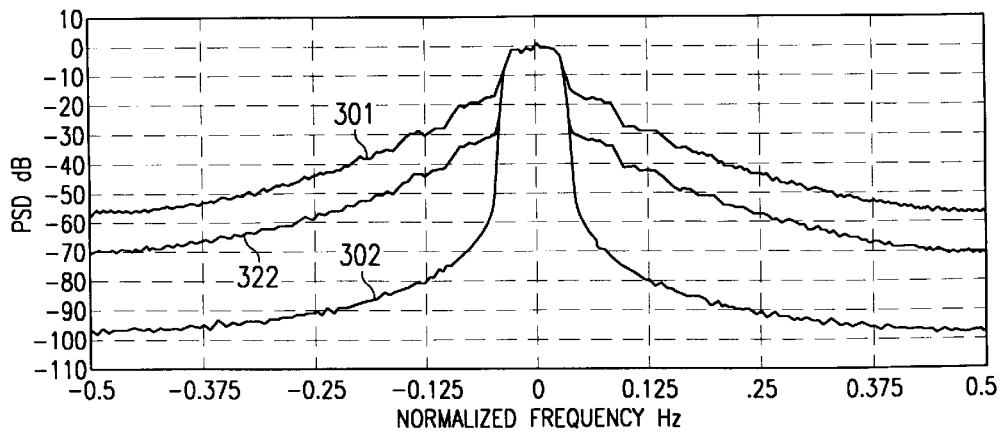

The DCSP 21 is used because manufacturing tolerances of analog components make it impossible to construct two identical analog chains. In addition, the characteristics of each analog chain will change differently from each other over time and temperature. As shown in FIGS. 37A–37C, fractions of a dB in gain imbalance cause rapid degradations in the performance of the LINC amplifier with respect to the reference PSD shown in FIG. 30. Thus, the DCSP should provide, via compensation circuits, which are a FIR filter and IQ modulator correction circuits, complimentary distortions that are equal and opposite to those imperfections incurred in the analog chains.

The parameter extraction block 96 (FIG. 9) separates out the information, which has been generated by the ACPCE 28, describing the distortions in the two analog chains into the parts which are to be applied to make up the individual correction to be applied to each path. In the case where digital quadrature modulators are used, the FIR filters alone are used. In the case where analog quadrature modulators are used, the additional IQ modulator correction circuits 94, 95 are used. In the analog quadrature modulator case, there are possible interactions between the corrections which may require the application of adjustments to the two mechanisms to take account of this. The parameter extraction block would prevent the two corrections from working against each other or exceeding their control ranges. In all cases, the correction is applied to share the amount of correction between the paths to achieve balance. If more information is known about the individual path distortions, more correction can be applied to one path if it needs it due to measured deficiencies. Note that only one of the phase signal paths need be corrected.

The FIR filters 92, 93 work on complex baseband values with complex coefficients, and correct for delay, amplitude scaling and phase shift. The FIR filters can also correct for frequency dependent distortions of those parameters.

The IQ modulator correction circuits 94, 95 correct only the specific distortions introduced by the analog quadrature modulators. Some of these distortions are actually correctable in the FIR filters, but the crosstalk needs a cross linkage between I and Q in each signal path which is not a feature of the complex FIR structure.

Figure 33:
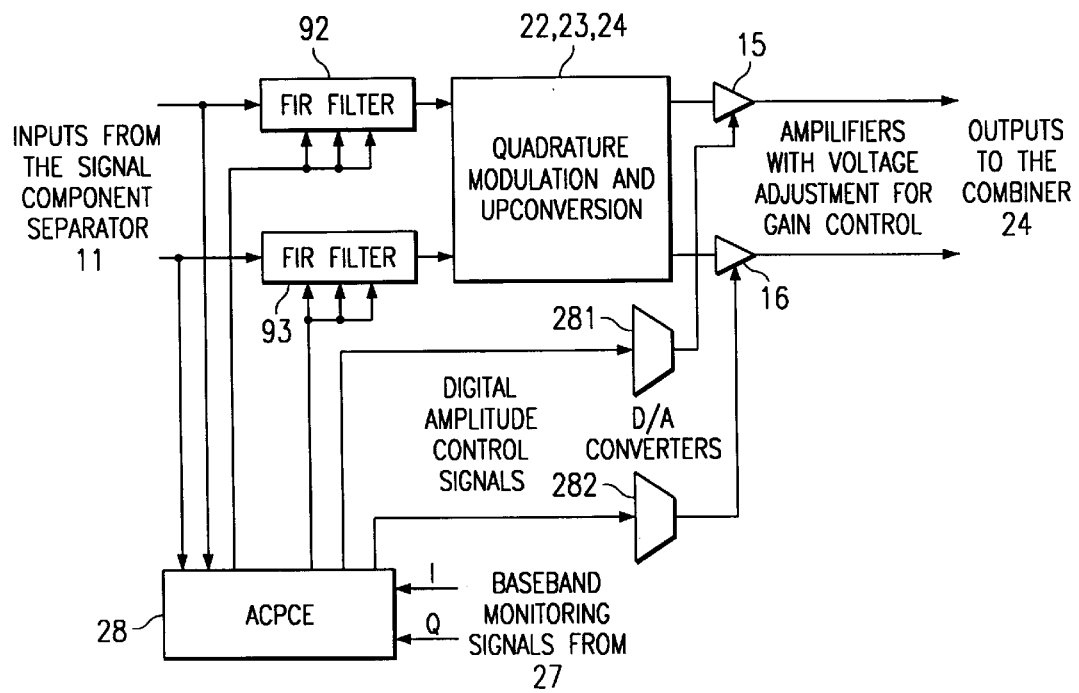
FIG. 33 depicts an arrangement for controlling the component amplifier gain in the LINC amplifier of FIG. 2.

As described below in relation to FIG. 33, the ability of the FIR filters to have any effect on the gain of the amplifiers is small to non-existent if they are close to saturation. In this case, if the amplifiers have different gain then they can be controlled directly as shown in FIG. 33. This type of control has no effect on any frequency dependent gain variation and that would need to be controlled in the FIR filters. In practice, two amplifiers of the same type would be likely to have similar gain slope with frequency and this minimizes the required degree of correction because in the first instance, it is a match that is important even if the overall gain still has a slope. This is no worse than a single conventionally applied non-linear amplifier for FM, MSK or CEPSK having a gain slope over frequency. Gain control could also be applied to compensate in the upconversion paths.

In practice, each analog chain will exhibit different group delay variation, propagation delay, gain and phase rotation characteristics which must be compensated. Furthermore, if analog IQ (quadrature) modulators are used within the system to permit direct complex baseband to RF conversion then, additional imperfections due to IQ gain and phase imbalance (crosstalk) and local oscillator feedthrough and baseband DC offsets will invariably be observed. These will be eliminated by utilizing correction circuits as illustrated in FIG. 9, which advantageously can perform the function of the DCSP 21. However, configuration of these circuits requires parameter values to be provided which precisely compensate for the analog imperfections. Since the DCSP operates in real time, the evaluation of these parameters is the responsibility of the ACPCE 28 (FIG. 3A) which provides updated, more accurate coefficient values for the circuit parameters when they are available.

The new parameters should not be simply updated or switched into use when provided. This could cause an instantaneous step in the phase and amplitude trajectory of the recombined signal. If such a step occurs, then undesirable power spectral responses that exceed the signal bandwidth may arise. This effect may be eliminated or significantly attenuated by providing interpolation between the current parameter values and the new updated estimates. The interpolation is preferably performed by the ACPCE 28.

Figure 10A:
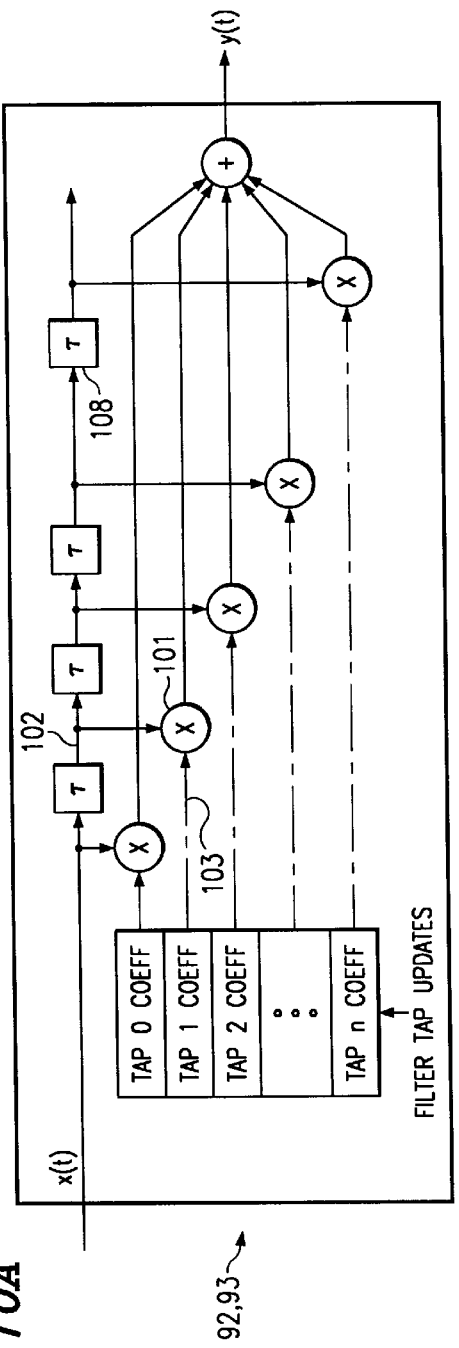
FIGS. 10A–10B depict the FIR filter and IQ modulator components of the digital compensation signal processor of FIG. 9.

FIG. 10A illustrates a FIR filter compensation circuit 92, 93, which is used to correct for different group delay variation, propagation delay, gain and phase rotation characteristics of the analog circuits. The FIR filter has an input x(t), which is actually a complex value made up of an I and a Q component. Note that the tap coefficients are also complex values. Thus, the actual implementation uses four times as many multipliers as commonly used in a FIR filter which only operates with real values and real coefficients. Specifically, each multiplier 101 multiplies a value a+jb 102 with a coefficient c+jd 103. This results in (ac+bd)+j(ad+be) as the output of that stage. The complex output y(t) is the sum of all of the individual complex multiples. The FIR filter takes the complex input and delays it one sample time (tau) in each of the boxes 108. At each sample interval, the values which are in the delay chain are multiplied by the tap coefficients 103 which have been placed there by the ACPCE 28. The products are all summed together to give the output y(t) which changes with each sample interval. The input values shift across the structure and get multiplied by each tap coefficient before being discarded.

The length of the filter 92, 93 is shown as variable. The actual number depends on the type of distortions seen in different implementations of the LINC amplifier.

Figure 10B:
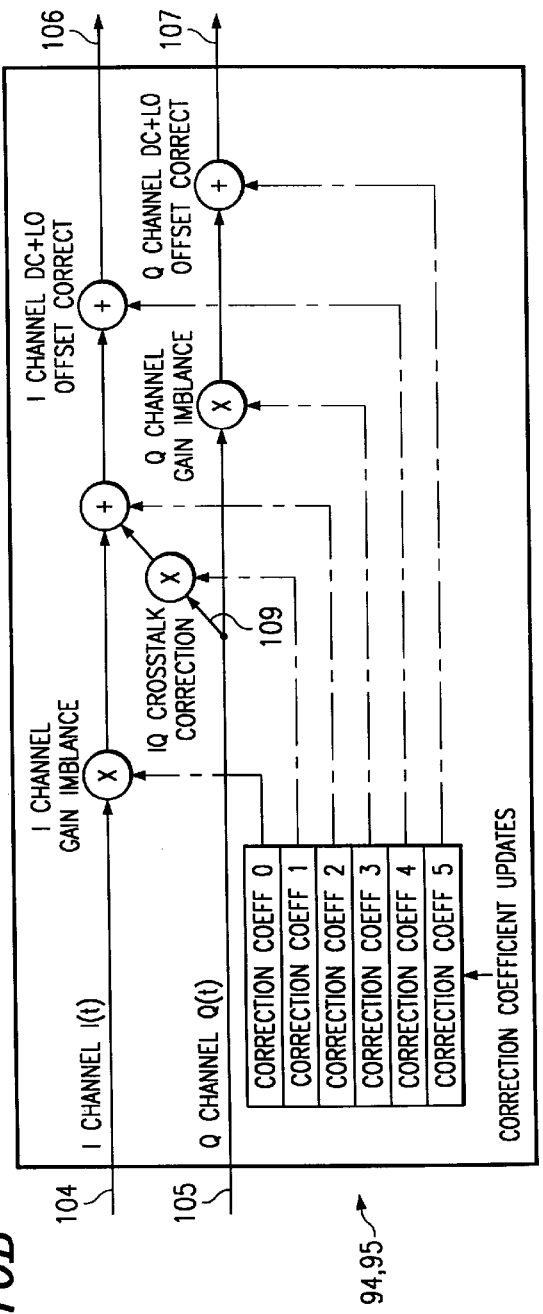

FIG. 10B illustrates an IQ modulator correction circuit 94, 95, which is documented in *The Effect of Quadrature Modulator and Demodulator Errors on Adaptive Digital Predistortors for Amplifier Linearization*, Author: James K.

Cavers, IEEE 0018-9545/97, pp. 456–466. The circuit 94, 95 may be used to compensate for IQ gain and phase imbalance (crosstalk) and local oscillator feedthrough and baseband DC offset imperfections of the IQ modulator. FIG. 11B shows the complex inputs as separate paths I 104 and Q 105 and originate in FIG. 10A as y(t). The 10B outputs 106, 107 are shown separated into complex components. The complex values combine to form one of 91, 98 in FIG. 9.

The IQ modulator 94, 95 is similar to the FIR filter but incorporates simple scalar multiplication of the I and Q values to adjust their gains separately for imbalance. The crosstalk connection 109 takes one channel (in this case Q but the inverse arrangement is a valid alternative) and scales it before adding it to the other channel. The last adjustment is a shift up or down to counteract DC offset in each channel. These adjustments are interactive and the coefficients have to be calculated to take this into consideration. Note that the compensation circuits may be used to compensate for analog circuit imperfections. However, the coefficient values of the parameters that characterize the compensation circuit must be permitted to be updated during the course of operation by ACPCE 28. Thus, the parameter values are dynamic and subject to change. However, only one set of parameters is required at any time and they do not have to be changed on a sample by sample basis as can be required in predistortion linearizers. Note that the parameter values are not necessarily just context switched, but a smooth change between the new and existing values may be undertaken by interpolation if it is deemed necessary.

Parameter updates may be applied to the signals relatively infrequently, with the amplifiers running continuously at their full power operating points, as the distortion characteristics do not change quickly. Overall this is a simpler correction problem than in predistortion and feedforward mechanisms where the amplifier characteristics have to be corrected for the full range of powers that they operate over. In the inventive system the amount of out of band distortion can be monitored to trigger the calculation of new parameters or it can be done periodically. The monitoring of the baseband demodulated signal can provide information on the purity of the signal being transmitted by the use of digital filtering to observe the out of band energy.

V. Example State Machine

A state machine which may be used to control the overall operation of the LINC amplifier will now be summarized with reference to FIG. 11. An example set of logic decisions and steps that may be associated with each state is set forth in the appendix. It may be assumed that the state machine is implemented as part of the ACPCE 28. It may also be assumed that the power amplifier has independent bias and keying control.

Many of the states of the state machine use core numerical and signal processing algorithms that operate upon stored sample data sequences recovered from the output of the SCS 11 and the output Γs(t) of the power combiner 25. These data processing algorithms, and other inventive features that are embodied within the state machine, are described in further detail in the subsequent sections. Also described in the subsequent sections are additional functions and features that can be incorporated into the state machine.

In the TX POWER OFF state (state 1 in FIG. 11) the ACPCE 28 ensures that the amplifier 20 is turned off with the output stage bias removed and that no RF emission from the amplifiers occurs. In addition, previously computed compensation parameters, $X_+(t)$ 34 are stored in memory for future utilization. Note that when the power is switched off completely the parameters are held in non-volatile memory. The storage media is not important, but it must support fast access. Typical implementations may employ RAM for storage while powered up and FLASH ROM, EEPROM, hard disk, magnetic storage media etc. for non-volatile storage.

In the TX POWER UP state (1A), the ACPCE 28 ensures that little or no RF emission from the amplifiers occurs while the bias to the amplifiers is applied in a controlled ramp. As described below with reference to FIG. 27, this is preferably achieved by applying antiphase training signals to the compensation/amplification chains while gradually ramping up the power settings of the amplifiers 15, 16. Alternatively, RF emissions can be inhibited using an antenna switch and a dummy load.

In the TX POWER DOWN state (1B), the ACPCE 28 ensures that the amplifier bias is removed in a controlled manner so that no RF emission from the amplifiers occurs. As described below with reference to FIG. 28, this may optionally be achieved by applying antiphase training signals to the compensation/amplification chains during the power ramp-down process.

In the CALIBRATION STATE (2) the ACPCE 28 is responsible for examining the state of the stored compensation parameters and determining if these parameters are still valid. This requirement captures a large breadth of conditions that may include initial provisioning of a new power amplifier. While in this state, the ACPCE 28 is also responsible for determining if a transmission power ramp is required or whether the signal s(t) has a power ramp already embedded within its structure. This may also be a user programmable option.

In the TRAINING AND ACQUISITION state (3), the ACPCE 28 is responsible for generating, examining and adaptively updating the compensation parameters (filter coefficients, etc.) used by the DCSP 21 to bring the compensation/amplification chains into balance. While in this state, the ACPCE inhibits the commencement of any pending transmissions until the compensation/estimation chains are in balance. The chains are considered balanced (and the compensation parameters "valid") when the resulting power spectral emission profile satisfies the regulatory spectral emissions mask and if the accuracy of the modulation signal, s(t), is sufficient to meet a predefined system specification.

If new compensation parameters are needed, the ACPCE uses several methods to identify the imperfections of each individual analog chain. These methods (described below) preferably use one or more stimulation sequences in conjunction with various estimation techniques to generate a numerical model of the amplifier's analog electronics. The model is then used in combination with the DCSP 21 to simulate the overall operation of the amplifier and compute initial estimates of the compensation parameters. The methods and associated algorithms used to generate the initial compensation parameters are described below under the heading "Initial generation of compensation parameters."

Figure 29:
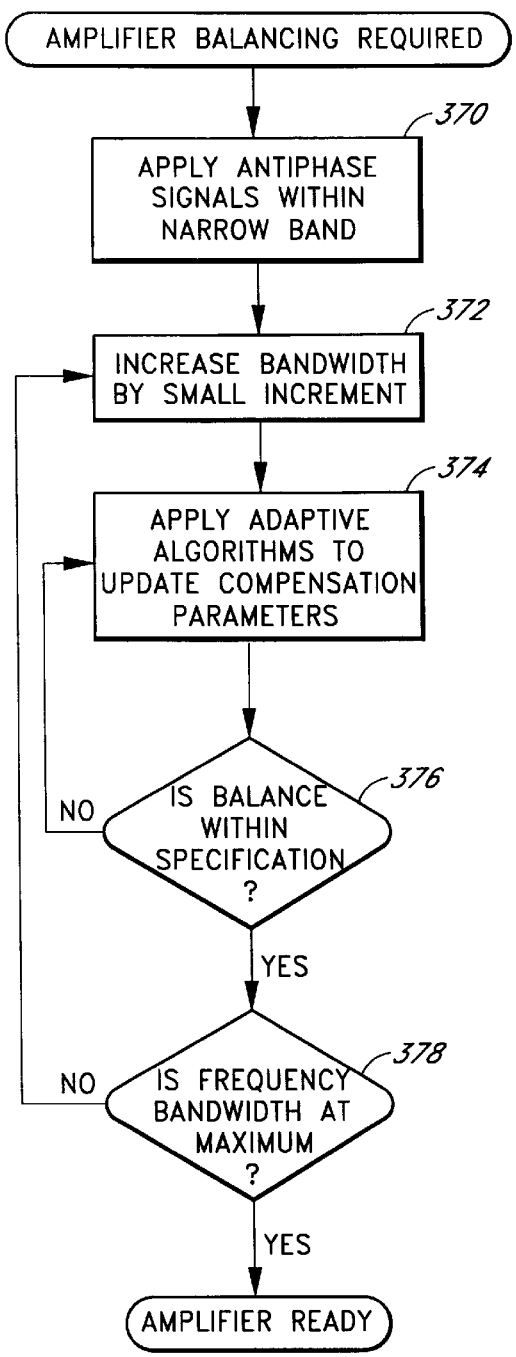
FIG. 29 illustrates a process for varying the bandwidth of training signals that are applied to the compensation/amplification chains.
Figure 30:
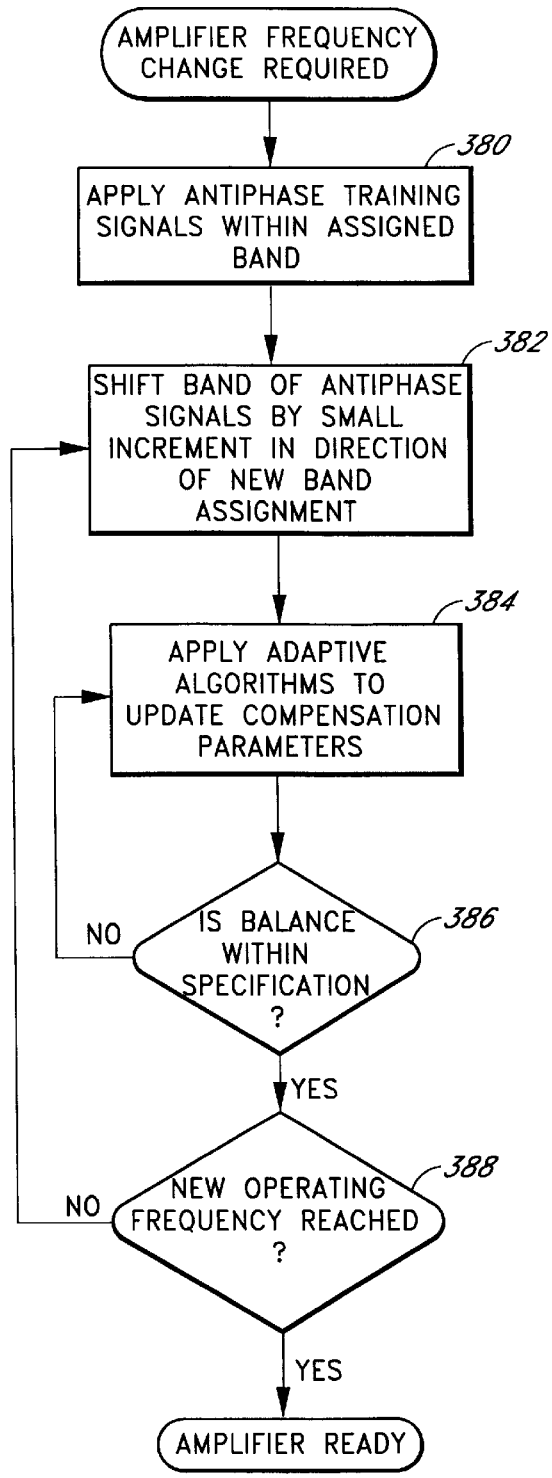
FIG. 30 illustrates a process that may be used to change the operating frequency of the LINC amplifier while maintaining the compensation/amplification chains in balance.

While in the TRAINING AND ACQUISITION state (3), the ACPCE may be required to evaluate and update the compensation parameters used for a single, multiple or a complete set of RF frequency channels that might fall within the amplifier's operating range. Several example techniques for performing training over a range of frequencies are illustrated in FIGS. 29 and 30 and discussed below. The exact evaluation requirements are dependent upon the operating scenario of the amplifier. For example, during amplifier commissioning, all channels may require compensation parameter estimation; and during normal operation, the compensation parameters will remain current by virtue of the operation of the TRACK AND UPDATE state (5) (although channels that are not exercised on a regular basis may require exercise of the TRAINING AND ACQUISITION routines.

The TRAINING AND ACQUISITION state (3) also makes use of training signals that are applied to the compensation/amplification chains to train the compensation circuits 21. A list of example training sequences which may be used is provided in the appendix. As described below, training signals that are in antiphase are preferably used so that emissions from the transmitter's antenna are substantially inhibited during the training process. An antenna switch which disconnects the amplifier from the antenna may additionally or alternatively be used.

Figure 31:
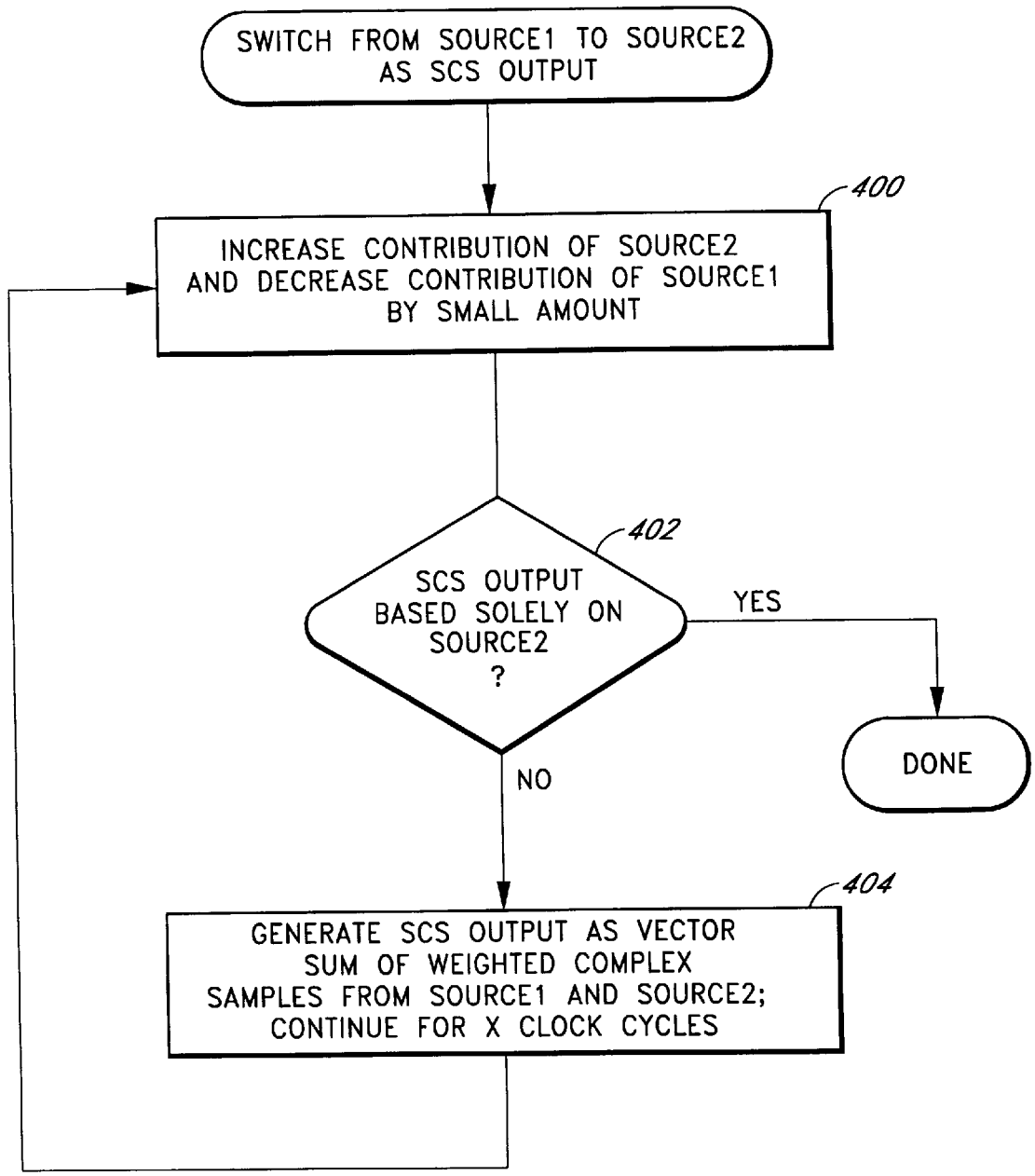
FIG. 31 illustrates a process that may be used to smooth transitions between transmission signals and modulation signals.

In the TRANSMISSION RAMP UP state (4), ACPCE 28 is responsible for ensuring a smooth bandlimited transition between a training sequence state and the start of the modulation signal. A process which may be used for this purpose is illustrated in FIG. 31 and described below. The ACPCE preferably ensures that during the transition the gradients of the amplitude, phase and frequency trajectories are continuous and bandlimited. This is very similar to the ordinary problem of amplifier "clicks" known to those skilled in the art since the inception of telegraphic keying, morse code. However, this effect is more pronounced in a LINC transmitter because the amplifiers are running at full power and any step or disturbance in the modulation trajectory will cause distortion power spectra to be generated.

The TRACK AND UPDATE state (5) represents the normal operational state of the LINC amplifier 20. In this state the applied signal s(t) is decomposed by the SCS into two constant amplitude envelope phase varying signals which are independently modified by the DCSP 21, amplified, and then combined. While in this state, the ACPCE monitors the quality of the transmitted signal ks(t) and adjusts the compensation parameters (filter coefficients, etc.) to adaptively reduce both the power spectral density of the distortion products and the modulation accuracy error. As the new and updated compensation parameters are generated, these are used to overwrite the outdated parameters which have been previously stored. To insure that unacceptable amplitude, phase and frequency imperfections are not introduced into the transmitted signal during parameter updates, an interpolation process may be used to smooth the transition between the current coefficient set and the new coefficient set, in which case a sequence of parameter updates will be performed. Each set of new compensation parameters that is computed and used is uploaded to the digital signal compensation processing block via the state vector $X_+(t)$.

Several adaptive algorithms (described below) are used to enable the ACPCE to continually improve the accuracy of the compensation parameters during on-line operation. These algorithms employ the random transmit signal s(t) in conjunction with various estimation techniques to compute the updated estimates of the compensation parameters. Each algorithm has unique attributes that provide different advantages in different commercial environments. As indicated above, these algorithms are advantageously implemented in a non-real-time mode using sequences of samples that are stored in memory.

The BURST IDLE TRAINING state (6) is used when the LINC power amplifier system 20 is operated in a time division multiplexed mode, or in another mode in which the transmitter provides bursts of RF modulated signal energy that are interspersed with short dormant periods in which no RF energy is transmitted. Typical commercial scenarios where this mode of operation is required are for the IS-54 TDMA digital cellular system, packet data networks such as the Federal Express system, PHS and DECT PCS systems. Ordinarily, in these systems the power amplifiers remain biased but the transmit key is not enabled. This keeps the power amplifier transistor silicon devices thermally stable, but still subject to significant change of operating point on resumption of full power transmission. This rapid change in the operating point of the transistor causes short term transient distortion products to be generated until the transistor is operating at full power and has re-acquired an operational stable thermal state.

In accordance with the invention, the generation of short term distortion products can be reduced or eliminated in the LINC system by applying antiphase training signals to the compensation/amplification chains during such periods of non-transmission, so that the power amplifiers remain operating at full RF power. The antiphase training sequences also permit on-line updates to the compensation parameters to be computed from the sampled data in a manner that is identical to that used in the TRACK AND UPDATE state (5). As indicated above, because the training signals are preferably in antiphase, the training signals substantially cancel when combined (assuming the compensation/amplification chains are sufficiently balanced), and little or no RF energy is emitted from the antenna. The antiphase training signals may, for example, be in the form of polyphase, chirp and/or frequency hopped (discrete or continuous frequency) sequences, and may be generated by the SCS 11 (FIG. 2) or other appropriate component.

In the POWER RAMP DOWN state (7), spectral emissions problems similar or identical to those incurred when the amplifier is ramped up in power can be experienced. The algorithm used for power ramp up, which is subsequently discussed, is also directly applicable to the power ramp down scenario.

As will be recognized by those skilled in the art, a wide range of additional functions could be added to the state machine, such as by adding additional states and/or incorporating additional logic into the existing states. Some of these functions are discussed below. It will also be recognized that some of the states illustrated in FIG. 11 could be omitted.

VI. Capture of Data Samples

As described above, the purpose of the DCSP 21 is to introduce appropriate levels of propagation delays, amplitude gains and/or phase rotations, and possibly other effects, such that the two compensation/amplification chains become balanced. It is the responsibility of the ACPCE 28 to compute the exact values of the compensation parameters, including filter coefficients, that are used by the DCSP 21.

Figure 13:
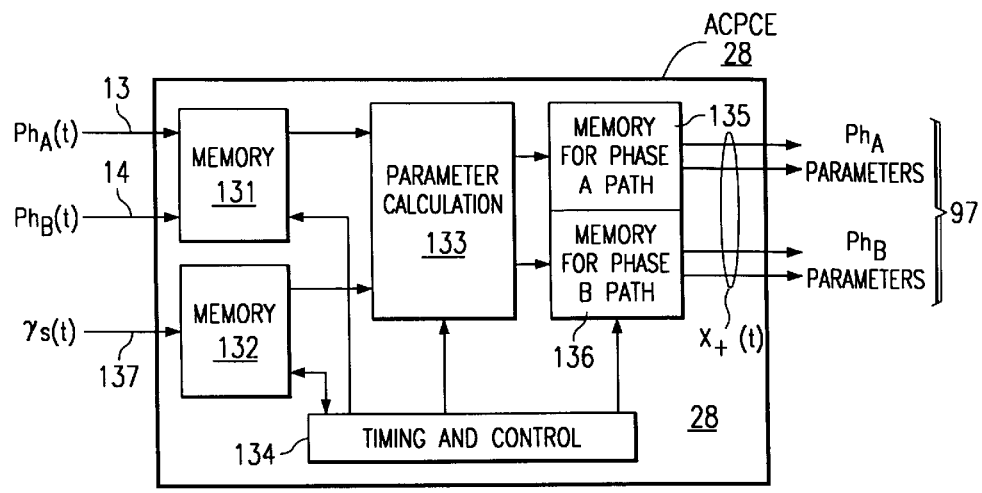
FIG. 13 is a schematic diagram of the adaptive control processing and compensation estimator of FIG. 2.

As depicted in FIG. 13, the ACPCE 28 operates on sets of samples taken from the receiver output, which is the analog-to-digital conversion block 27 in FIG. 2, and from the SCS 11. The capturing of the samples is performed at the individual sampling rates. This process is controlled by the ACPCE, which fills the memory 131, 132, to hold the blocks of samples. When a block of samples is ready, the ACPCE analyzes the data and makes calculations of the necessary parameters for correction of the errors via calculator 133. This can be carried out at a speed which is determined by the capabilities of the processing hardware and software. There is no need for this to be done at the sample rates of the individual signals, it is a lower priority task which is done periodically. The calculated parameters for $Ph_A$ and $Ph_B$ are stored in memories 135 and 136, respectively.

Timing and control block 134 coordinates the collection of samples and the calculation of the correction parameters and their storage and application to the FIR filters and the amplifiers. It is important to sample a reasonably long block of time to increase the amount of information available for the calculations. A preferred signal time segment for this purpose would contain a broad range of frequencies covering the range which can be generated by the signal component separator. The total quantity of samples captured and the frequency and time interval between captures can be optimized for a particular type of signal. For example, a signal which frequently covers the full range of frequencies could be sampled for a shorter time. An advantage to sampling longer periods is the averaging effect of any measurement or quantization errors in the samples which accrues even if they contain repetitive information. Note that the output of memories 135 and 136 forms $Ph_+(t)$ 34 which is fed into the digital compensation signal processing block 21 of FIG. 2. Further note that the $\gamma s(t)$ 137 could be represented by I and Q components.

VII. Adaptive Compensation Estimation Methods

The adaptive compensation estimation algorithms ("adaptive algorithms") and processes used by the ACPCE to generate and refine the compensation parameter values will now be described in detail. Two sets of adaptive algorithms are preferably used because the physical characteristics of the analog chains are not static but drift with age, temperature and operating point. The first set of algorithms, referred to as the "system identification algorithms," is used to identify initial operating values for the compensation parameters. The second set of algorithms is used to enhance these estimates and track the changes in the analog chains. Both sets of algorithms operate on sets of data samples captured as described in the preceding section. The algorithms are preferably implemented in the transmitter's firmware.

a. Initial generation of compensation parameters

The off-line processes and associated algorithms used to generate an initial set of compensation parameters will now be described with reference to FIGS. 14–20.

Figure 14:
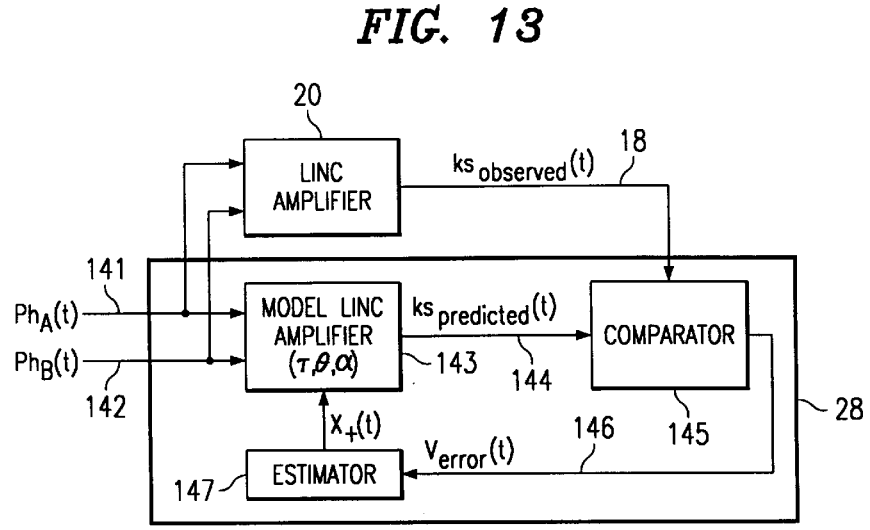
FIG. 14 is a schematic diagram of an arrangement for determining system identification.

FIG. 14 depicts the overall system identification process performed by the ACPCE. The ACPCE causes the SCS 11 to stimulate the LINC amplifier 20 with waveforms $Ph_A(t)$ 141 and $Ph_B(t)$ 142 and records the associated output $kS_{observed}(t)$ 18. However, observation of particular elements within the analog chains is preferably not permitted. Consequently, the ACPCE uses a parallel numerical model 143 that mirrors the expected processes of the real analog LINC amplifier 20, including the analog chains and the combiner 25, and produces $ks_{predicted}(t)$ 144.

To identify the initial values of the compensation parameters, the coefficients of the numerical model are adjusted so that the predicted waveform, $ks_{predicted}(t)$ 144, is substantially identical to the real observed signal, $ks_{observed}(t)$ 18. Comparator 145 compares $ks_{predicted}(t)$ and $ks_{observed}(t)$, the difference of which forms $V_{error}(t)$ 146. This error signal is provided to estimator 147 which adjusts values of the model 143. Note that waveforms 141 and 142 are special sequences generated by the SCS 11 as required. Once the model of the LINC amplifier has been successfully adjusted, the compensation parameters may be directly computed to ensure that the compensation network introduces equal and opposite imperfections to the up conversion and amplification process.

It is important to note that the identification of a system model is a well defined control problem that has many solutions in the robotics and control field. Least Mean Squares (LMS), Recursive Least Squares (RLS), Kalman and extended Kalman algorithms are well known to those skilled in the art of solving this class of problem. It is also important to realize that the bulk imperfections for each analog chain are defined by delay, phase and amplitude gain variations. Smaller but less significant effects correspond to the imperfections associated with direct RF conversion which uses analog IQ quadrature modulators.

The first time that a transmitter is switched on, the FIR filters and other parameter adjustments can be set to have no effect on the signals passed through them. This might only be performed at the factory, or by an operating option selected manually or under certain predetermined conditions. Performing a training of this type could involve the disconnection of the antenna and manual connection to a dummy load. If this to be done in an operational installation, then an antenna switch might be used in the amplifier output to prevent unwanted transmissions by automatically connecting a dummy load in place of the normal transmitting antenna. Alternatively, default values for the correction parameters previously stored could be used and taken into consideration in the calculations. Spurious transmissions due to non-ideal parameters are still a potential problem even if one of the special training sequences which does not transmit a signal to the antenna is used as subsequently described. A training under any of these conditions can be made to perform a system identification which will measure the imperfections and make a correction intended to correct all measurable error.

In practice, the application of the correction may also slightly alter the power operating point of the amplifiers by adjusting the power of the applied signal. This may result in a slight residual error. There is also a possibility that unless one of the special training sequences is used, the captured data will not fully exercise all distortions, resulting in an inaccurate estimate of the errors. In order to achieve the best possible correction, training processes should be made to iterate slowly towards the ideal correction and handle anything which might have changed in the time since the last training. This is depicted in the ACPCE control flow in FIG. 11.

Figure 15:
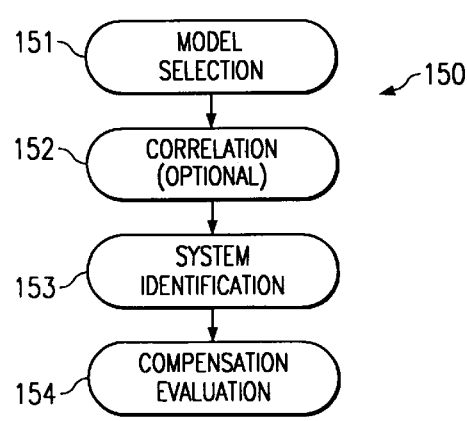
FIG. 15 is a flowchart of the operational states of the identification process performed by the element of FIG. 14.

FIG. 15 illustrates the algorithm flow 150 for the system identification process. Four operation steps are preferably used: model selection 151, an optional correlation stage 152, system identification 153 and compensation parameter evaluation 154. The first stage 151 is used to determine the range of imperfections that are required to be compensated. In general, this is usually fixed at the design stage, because the power amplifier designer will be cognizant of the range of imperfections introduced by the specifics of the selected RF upconversion and amplification process. For example, a digital IF, analog RF up conversion and amplification design will not exhibit quadrature modulator imperfections, while a direct conversion scheme will. The model that is used in the system identification process should capture the effect of all known imperfections. However, it is conceivable that a computer aided model selection algorithm that examines the output of the LINC amplifier and identifies the complexity and order of the numerical model could be used.

The second step, correlation 152, is an optional stage that may be used to accelerate the subsequent system identification stage. This stage stimulates the amplifier with known transmission sequences and correlates these with the recovered amplifier output, i.e., the "observed signal" $S_{observed}(t)$. This permits the bulk amplitude gain imbalance, propagation delay and phase rotation of each arm to be identified and employed as initial estimates of the system model parameters used in the system identification stage. Although optional, this approach does permit the third step, system identification 153, to rapidly acquire model parameters. The third stage is used to identify the imperfections of the LINC amplifier by adjusting the parameters of the parallel numerical model such that the observed amplifier output and predicted amplifier output are substantially identical. Once this has been achieved the parameters of the numerical model may be used to compute the initial compensation parameters of the digital compensation signal processing block. For simple imperfection models, this may be simply achieved by numerical inversion, and for more complicated imperfection models, more intricate techniques may be required. These approaches are addressed in the following sections.

The optional correlation step 152 assesses the bulk propagation delay, amplitude gain and phase shift incurred through each analog chain by transmitting test sequences on each compensation/amplification chain, recording the resulting output sequence (following RF down-conversion) at the signal combiner 25, and then correlating the recorded sequence with the transmitted sequence. The DCSP 21 is preferably configured to produce no effect on the test sequences during this process. The test sequences may consist of sequences that are separately transmitted along each chain. Alternatively, two test sequences may be concurrently transmitted on each compensation/amplification chain, in which case the two sequences are preferably orthogonal to each other under all phase shifts and delays; this enables their effects to be measured separately although the receiver path sees their combined effects. Such orthogonal transmission sequences are readily constructed using the Gram-Schmitt orthogonalization construction that is known to those skilled in the art. The orthogonal sequences may optionally be in antiphase. In either case (independent sequences or concurrent orthogonal sequences), the amplitude gain, phase rotation and delay of each analog chain may be computed by selecting the maximum correlation peak associated with the correlation calculation.

Note that there will be a bulk delay in each transmit path and the shared receive paths, which will result in the received samples representing a slightly later time interval than the input samples. A correlation process may be used to find the time alignment of the transmitted and received sets of samples, even if no other information is calculated. This correlation should be clearly defined for a random signal, but if the signal is a regularly repeating pattern, there could be more than one alignment. Any alignment of an identically transmitted pattern within the duration of the sample block could be accurate enough for estimation of the other parameters. The correct alignment is preferred.

The above-described correlation step is intended primarily for initial calibration in a manufacturing or test environment, although it may also be performed during normal use of the transmitter where an antenna switch is provided to isolate the power amplifier from the antenna load. As indicated above, the step may optionally be used to accelerate the training or tracking process using one of the other algorithms described in following sections. This may be accomplished by using the bulk delay, and average differential delay, phase and amplitudes as initial starting points for the more complicated calculations.

If the correlation step is used and no clear match between the transmitted and received sample sets can be found, this would indicate a major fault. This determination would be used as a fault detection mechanism for the amplifier control system.

When the bulk delay is known, it is possible to offset the start and finish of subsequent transmitted and received sampling block timings, so that the samples have ideal time overlap. This is because the overall delay in terms of sampling intervals is unlikely to change substantially. For any specific design of amplifier this could be made into a fixed parameter.

The bulk delay and the differential delay between the transmit upconversion paths is unlikely to match an exact number of sample intervals. It is important for the timing alignment to be accurate. If the sampling rate is high enough the resulting slight misalignment does not cause any significant degradation in the accuracy of the parameter estimation. The transmit path has a sample rate of approximately 16× the bandwidth of the signal transmitted as described earlier. If the sampling rate is not high enough or the sampling rates are different between the transmit and receive signals, one set of samples may be interpolated to match the other. This is a practical task to implement because the whole training process can run at a much slower relative clock rate than the real time sample rate, which allows for calculation time.

The imperfections of the analog chains may be considered to be constructed from the linear addition of a set of imperfections such as delay, amplitude scale (gain) and phase rotations. Thus, an estimator can be used to adjust the coefficients of a linear parameter vector to minimize the difference between the observed output sequence of the real amplifier and the predicted output sequence of the model, for the same stimuli. Adaptive LMS, RLS and linear Kalman filtering are examples of such approaches that may be employed.

Following the optional correlation step, the identification of the amplifier imperfections (generation of the numerical model) proceeds by capturing a sequence of stimuli sequences and amplifier responses and then utilizing the algorithms to adjust the LINC model parameters such that the error between the predicted and observed signal flows is minimized. This process in described below with reference to FIG. 18. Once the model has been generated, the model or its parameters may be employed to compute initial estimates for the compensation parameters. Use of the model to generate compensation parameters is described below with reference to FIG. 20.

Figure 16:
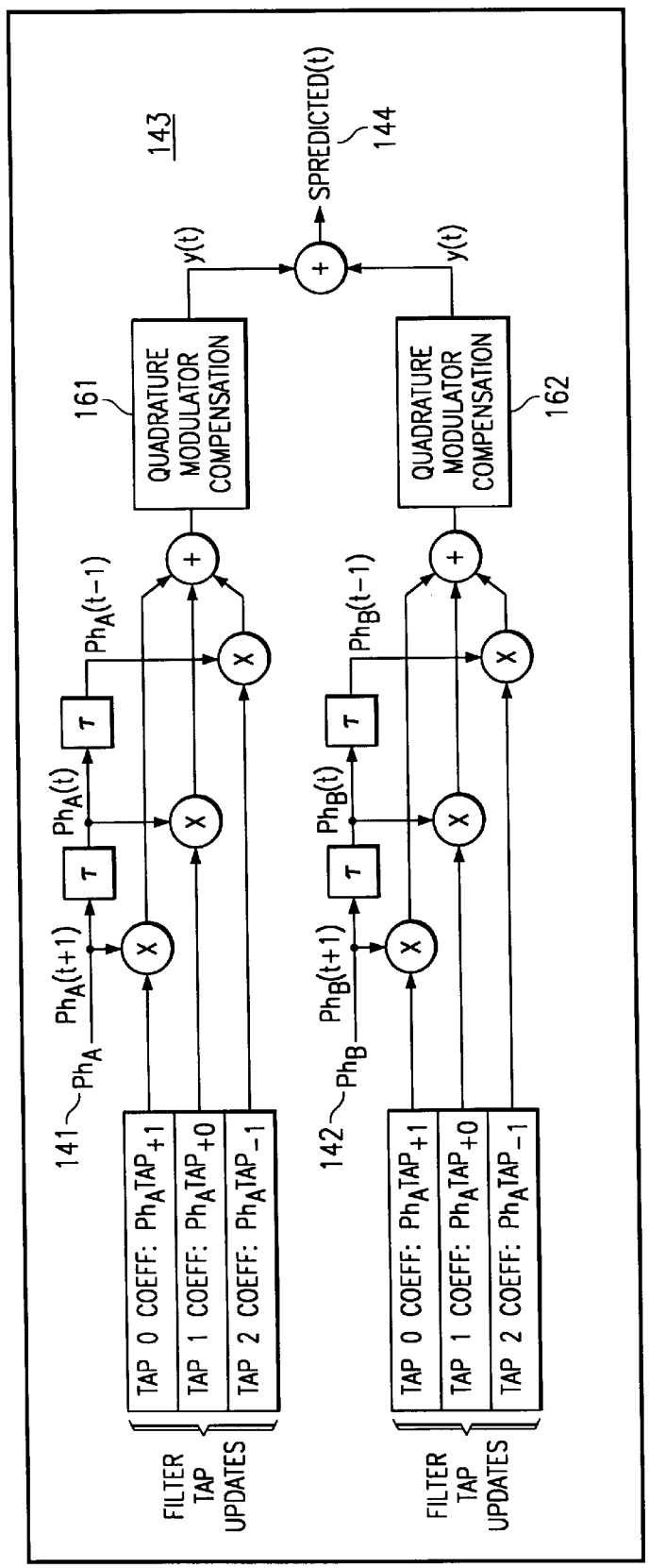
FIG. 16 is a schematic diagram of the LINC model amplifier element of the arrangement of FIG. 14.

FIG. 16 depicts a mathematical model structure that may be used to model the analog chains and the signal combiner 25. The model preferably encompasses substantially all of the distortions that may be introduced to the component signals by the amplifier's analog electronics, including but not limited to distortions produced by analog baseband filtering, IF and RF upconversion and filtering imperfection, amplifier imperfections, and signal combiner errors. The appropriate structure for the model will generally depend upon the specifics of the analog chains, such as whether the chains include quadrature modulators and RF upconverters. It is assumed that the distortions produced can be corrected by the structures in FIG. 9, and that all of the distortions can therefore be modeled by the circuit of FIG. 9.

FIG. 16 shows a simple example in which the FIR filters have only three taps. Quadrature modulator compensation blocks 161 and 162 of the type shown in FIG. 10B may also be included where analog quadrature modulators are used. The inputs $Ph_A$ 13 and $Ph_B$ 14 are the same as for the DCSP (digital compensation signal processor) 21 in FIG. 2. The output $s_{predicted}(t)$ is the calculated equivalent of the output of the analog to digital conversion 27 in FIG. 2 and that is what is compared with it in the comparator 145 in FIG. 14.

To illustrate the use of the LMS algorithm, consider the scenario where a three tap compensation FIR filter (as in FIG. 16) is determined to be sufficient to accurately represent the imperfection incurred in each analog chain. Note that the distortions which naturally occur need to be corrected by a structure which is capable of reproducing their inverse. If the structure can produce the inverse distortions it can also reproduce the actual distortions. The amount of delay, phase rotation and amplitude slope which can be modeled is determined by the capabilities of the structure. The amount of frequency dependent amplitude, delay and phase ripple which can be modeled and the total delay correctable is dependent on the number of taps in the FIR filters. The more complicated the details that need to be modeled (and ultimately corrected) the longer the filter.

Figure 17A:
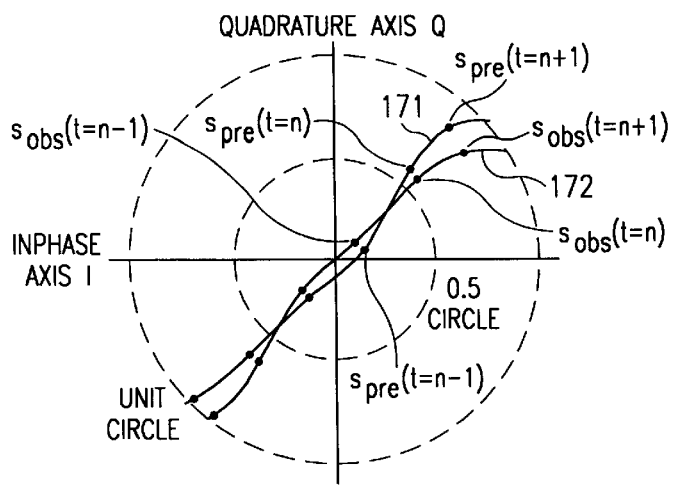
FIGS. 17A–17D depict graphs of the LINC model amplifier element of FIG. 16 with various settings.
Figure 17B:
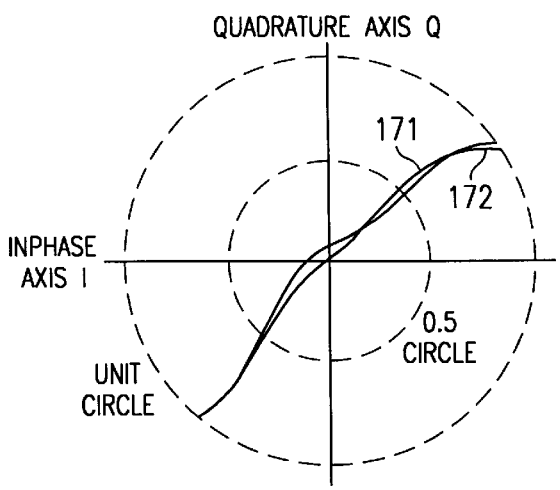
Figure 17C:
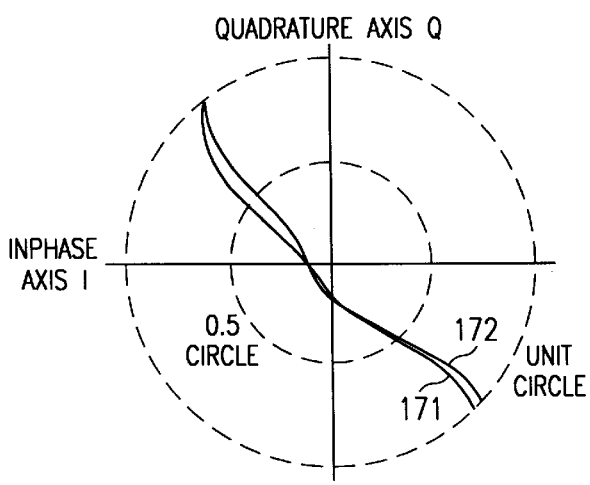
Figure 17D:
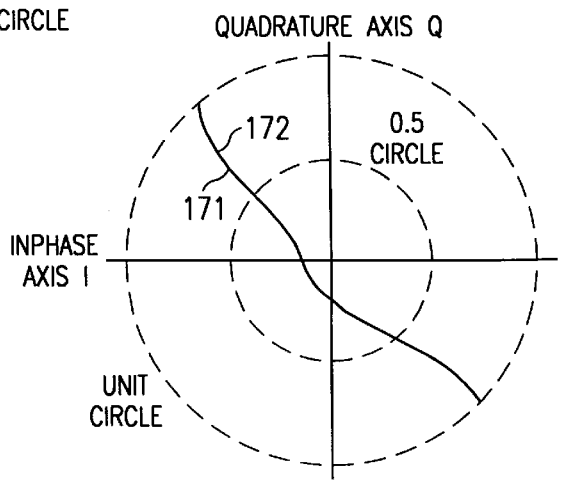
Figure 18:
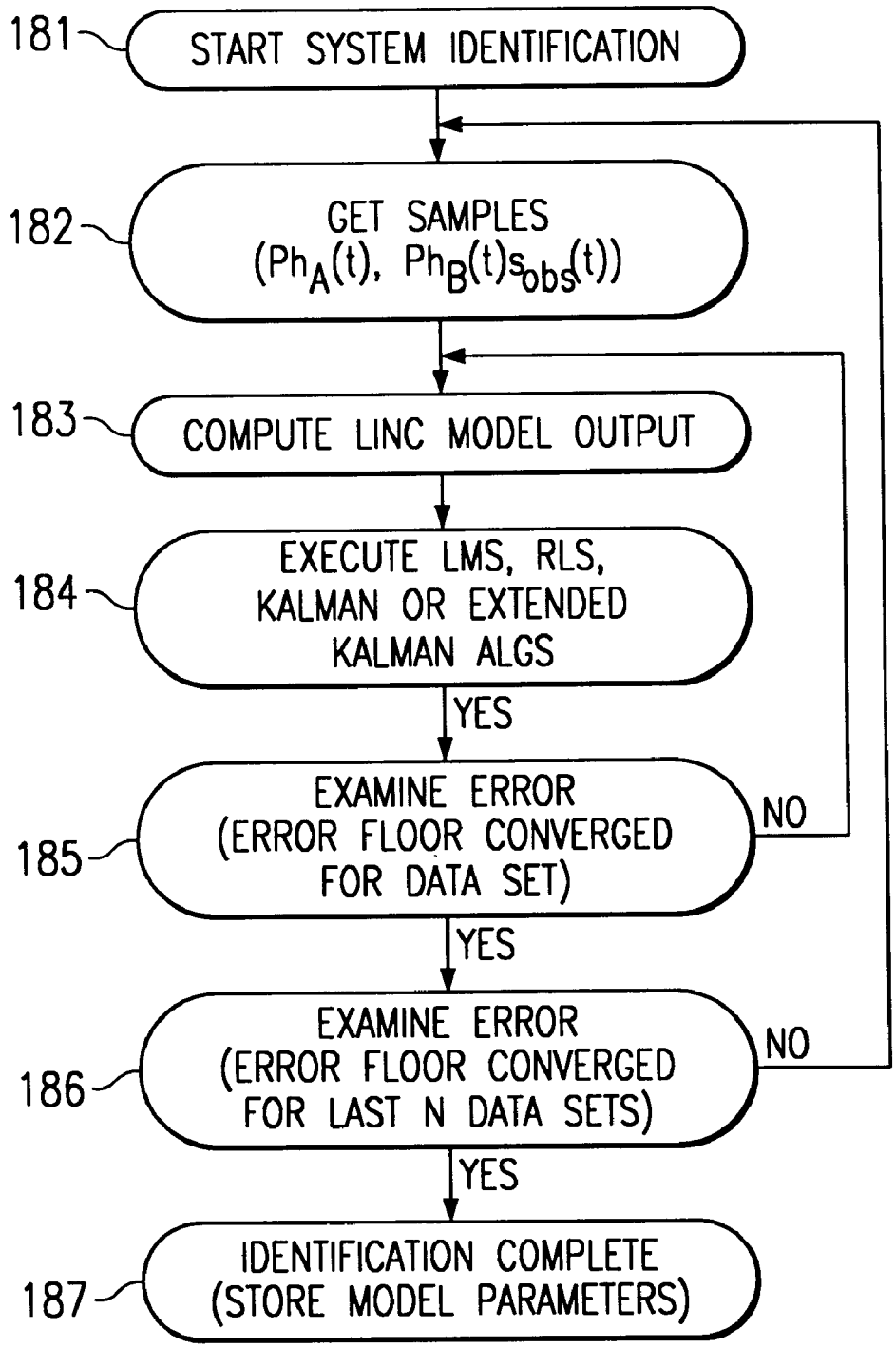
FIG. 18 depicts a flowchart of the operation of system identification.

FIG. 18 illustrates the algorithm flow of the system identification process (step 153 in FIG. 15). The operation of this process will be described with reference to the example datasets shown in FIGS. 17A–17D, wherein the transition from 17A to 17B illustrates the reduction in error which occurs as the model parameters are adjusted for a first dataset, and the transition from 17C to 17D illustrates the reduction in error which occurs as the model parameters are adjusted for a last dataset.

In step 182, as the SCS stimulates the compensation/amplification chains with the DCSP set to have no effect, the ACPCE captures a sequence of the component signals $Ph_A(t)$ and $Ph_B(t)$, and captures a corresponding sequence which represents the observed power amplifier output $s_{obs}(t)$ 172. In step 183, the ACPCE applies the same stimulation sequence (the captured samples of $Ph_A(t)$ and $Ph_B(t)$) to the numerical model to compute a predicted output sequence $s_{pre}(t)$ 171, which is illustrated in FIGS. 17A and 17B. In step 184, the algorithm is used to adjust the parameters of the numerical model to reduce the difference between the observed signal trajectory and the predicted trajectory. Note in FIG. 17B the prediction error is reduced as data sequences become closer.

The process continues over multiple iterations as needed over the data set until the RMS error has been substantially minimized (step 185). However, since the data set is constructed from a finite sequence of observation and stimuli samples, this minimal RMS error value does not ensure that the global minima has been reached for all trajectories. Consequently, subsequent data sets are preferably extracted and the process repeated until the RMS error floor from data set to data set has been substantially minimized (step 186). Note in FIG. 17D the prediction error between observed and predicted trajectories is eliminated. If this error approaches zero it is a good indication that the model selection 187 has captured all imperfection details of the analog design.

The six complex coefficients of the two filters (3 per chain) represent the parameter values that have to be determined; this may be achieved by using equations 8 and 9. Note that the number of coefficients as well as their values are by way of example only.

$$V_{error}(t)=S_{predicted}(t)-s_{obs}(t) \qquad \text{eqn 8}$$

$$[X_+(t)]=[X_-(t)]+\Delta Verror(t)[Ph_A(t),Ph_B(t)]^* \qquad \text{eqn 9}$$

In the above equations, X(t) is the state vector of estimated parameters, and the +/−nomenclature is used to indicate update vector parameters and current vector parameters. $V_{error}(t)$ is the current difference between the observed recombined signal sampled from the analog down conversion and the expected output that was predicted by the LINC model used for system identification. $\Delta$ is a update rate control parameter and $[Ph_A(t),Ph_B(t)]$ is a vector of captured stimuli samples that were used to drive the input to the numerical model at the same time instant as the implemented amplifier. For the three tap example, equation 9 would be represented as equation 10.

$$\begin{bmatrix} Ph_A tap_{-1_+}(t) \\ Ph_A tap_{0_+}(t) \\ Ph_A tap_{1_+}(t) \\ \ldots \\ Ph_B tap_{-1_+}(t) \\ Ph_B tap_{0_+}(t) \\ Ph_B tap_{1_+}(t) \end{bmatrix} = \begin{bmatrix} Ph_A tap_{-1_-}(t) \\ Ph_A tap_{0_-}(t) \\ Ph_A tap_{1_-}(t) \\ \ldots \\ Ph_B tap_{-1_-}(t) \\ Ph_B tap_{0_-}(t) \\ Ph_B tap_{1_-}(t) \end{bmatrix} + \Delta Verror(t) \begin{bmatrix} Ph_A(t-1) \\ Ph_A(t) \\ Ph_A(t+1) \\ \ldots \\ Ph_B(t-1) \\ Ph_B(t) \\ Ph_B(t+1) \end{bmatrix}^* \qquad \text{eqn 10}$$

This algorithm is a direct implementation of the standard LMS algorithm. To ensure proper operation, it is important that the time index of the captured stimuli and observation waveforms be consistent, and that the delays in the compensation network be properly handled.

The iteration explicitly defined within equation 8 and 9 is repeatedly executed over the sampled data set until the residual RMS value of the error voltage Verror (t) has finished converging. To ensure that the best estimate for the system parameters has been identified, it is appropriate to repeat the operation of gathering more transmit samples and recovered down conversion samples and repeating this process. The process is terminated when the overall RMS error from sample set to sample set does not exhibit any further degradation.

Although the computational simplicity of the LMS algorithm is very attractive, its convergence speed can be prohibitively slow. This can be overcome by utilizing the recursive least squares (RLS) or Kalman filter algorithms. These algorithms exhibit significantly faster convergence rates but at the expense of increased computational complexity. These algorithms may be used within the LINC amplifier as a direct replacement for the LMS algorithm and employed in an identical manner. These algorithms are defined and explained in *Digital Communications*, second edition, John G. Proakis, Chapter 6 pages 519–693, McGraw Hill 1989, 1993 ISBN 0-07-050937-9; *Adaptive Filter Theory*, second edition, Simon Haykin, Chapter 6, pages 186,236, Chapter 7, pages 244–273, Chapter 8, 9, 10, 11, pages 274–402, Prentice Hall 1991, 1996 ISBN 0-13-013236-5; *Applied Optimal Estimation*, Arthur Gelb, chapter 4 pages 102–142, chapter 6 pages 180–216, The M.I.T. Press ISBN 0 262 70008-5, incorporated herein by reference, consequently the algorithm will simply be defined below using the nomenclature of Proakis as a matter of record and without further explanation.

$$s_{obs}(t)=Y_N^T(t)C_N(t-1) \qquad \text{eqn 11}$$

$$Verror(t)=s_{true}(t)-s_{obs}(t) \qquad \text{eqn 12}$$

$$K_N(t) = \frac{P_N(t-1)Y_N^*(t)}{w + Y_N^T(t)P_N(t-1)Y_N^*(t)} \qquad \text{eqn 13}$$

-continued $$P_N(t) = \frac{1}{w}[P_N(t-1) - K_N(t)Y_N^T(t)P_N(t-1)] \quad \text{eqn 14}$$

$$C_N(t)=C_N(t-1)+P_N(t)Y_N^*(t)\text{Verror}(t) \quad \text{eqn 15}$$

Figure 19:
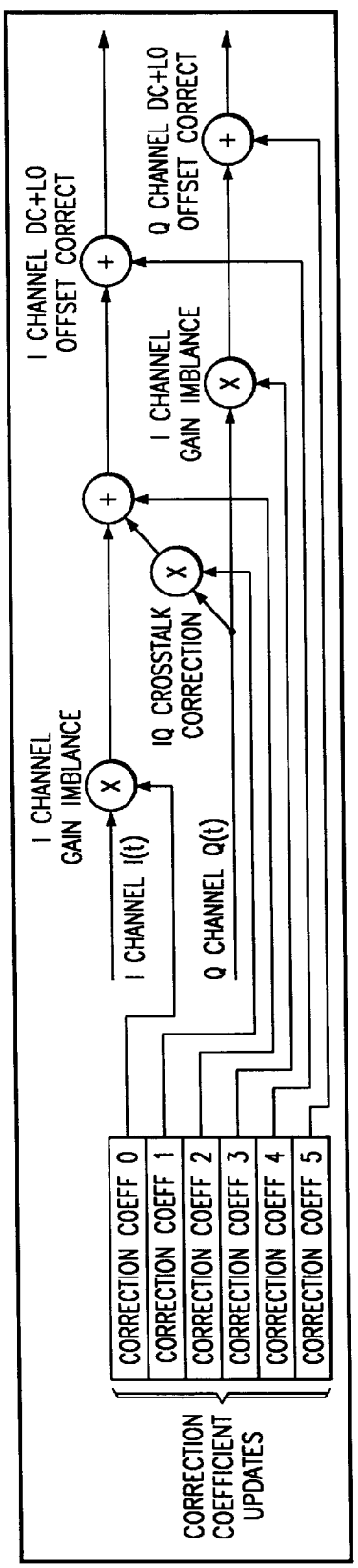
FIG. 19 is a schematic diagram of a IQ modulator correction element of the LINC model of FIG. 16.

FIG. 19 is similar to FIG. 10A, except that this figure is a mathematical model and does not work on samples in real time. It models the actual quadrature modulator rather than applying the inverse characteristic, and is part of the ACPCE. This is only used in an implementation which has analog quadrature modulators. Examination of FIG. 19 reveals that the structure of the compensation circuitry may have internal interactions that cause the linear LMS and RLS algorithms to fail to correctly identify the true system parameters. This occurs because the adjustment of the IQ modulator parameters will modify the gain and phase response of the circuit which is compensated for by the FIR filter coefficients. This interaction does not necessarily have to exhibit a linear characteristic and as such will cause the linear estimation algorithms to fail. This deficiency may be overcome by employing the extended Kalman filter algorithm. The algorithm may be directly implemented in the data flow and control structure illustrated in FIG. 18. The ability of the extended Kalman filter to identify the system components despite the nonlinear interactions is achieved because the algorithm identifies the interactions between parameters as well as the parameters themselves. This causes a significant increase in computational complexity. Consequently, this algorithm is only used, if it can be identified that nonlinear interactions between compensation parameters do occur for a particular implementation.

The extended Kalman filter algorithms for non linear estimation environments is widely defined and explained in, *Adaptive Filter Theory*, second edition, Simon Haykin, Chapter 6, pages 186,236, Chapter 7, pages 244–273, Chapter 8, 9, 10, 11, pages 274–402, Prentice Hall 1991, 1996 ISBN 0-13-013236-5; *Applied Optimal Estiiniatio*, Arthur Gelb, chapter 4 pages 102–142, chapter 6 pages 180–216, The M.I.T. Press ISBN 0 262 70008-5, consequently the algorithm will simply be defined below using the nomenclature of Proakis as a matter of record and without further explanation.

$$s_{obs}(t)=h_N(t)\{t, C_N(t-1)\} \quad \text{eqn 16}$$

$$\text{Verror}(t)=s_{true}(t)-s_{obs}(t) \quad \text{eqn 17}$$

$$C_N(t)=C_N(t-1)Y_N^*(t)[\text{Verror}(t)] \quad \text{eqn 18}$$

$$P_N(t)=[1-Y_NH_N(C_N(t-1))]P_N(t-1) \quad \text{eqn 19}$$

$$Y_N=P_N(t-1)H_N^T(C_N(t-1))[H_N(C_N(t-1))P_N(t-1)H_N^T(C_N(t-1))+R_N]^{-1} \quad \text{eqn 20}$$

$$H_N(C_N(t-1)) = \frac{\partial h_N(C_N(t-1))}{\partial C_N(t-1)} \quad \text{eqn 21}$$

Figure 20:
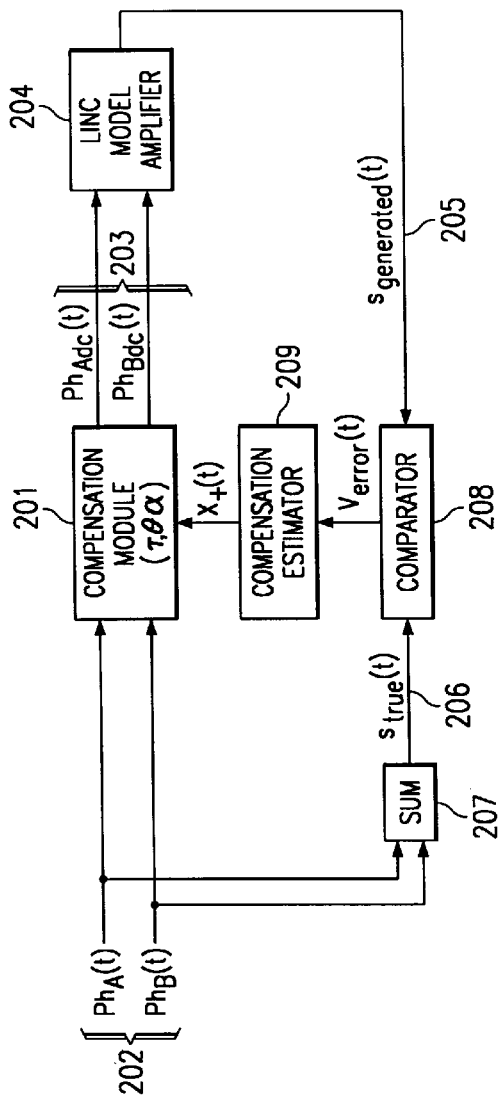
FIG. 20 is a schematic diagram of an arrangement to estimate initial compensation parameter values using a LINC model.

The last stage of the initialization procedure is to use the numerical model generated as described above to generate an initial set of compensation parameters. As depicted by FIG. 20, this is preferably accomplished using the model 204 in conjunction with a compensation module 201 to model the entire amplifier. The compensation module 201 acts as the DCSP 21, and may be implemented using the actual DCSP electronics (e.g., the ASIC or other signal processing modules), or a software routine which replicates the operation of the DCSP.

In operation, the compensation module 201 is stimulated with a sample data stream of component signals, $Ph_A(t)$ and $Ph_B(t)$ 202 from the SCS. The digitally compensated signal components, $Ph_{Adc}(t)$ and $Ph_{Bdc}(t)$ 203, are then applied directly to LINC model amplifier 204 which outputs an estimated replica $s_{generated}(t)$ 205 of the transmit signal. This signal initially deviates from the original signal trajectory, $s_{true}(t)$ 206 because the compensation parameters are initially set to default values which assume a perfect LINC amplifier. A predicted or desired signal $s_{true}(t)$ is generated from summer 207 which combines the input component signals 202. Note that the input signals 202 are preferably a pre-set test sequence generated by the SCS, but can alternatively be generated by separating a random modulation signal s(t).

The comparator 208 generates an error vector Verror(t) which is used by the compensation estimator 209 to compute adjustments to the compensation parameters. The updated compensation parameters are provided to the compensation circuit 201 via the parameter vector $X_+(t)$. The compensation estimator is a direct implementation of the LMS, RLS or Kalman filter algorithms which were discussed previously. If it is identified that the compensation circuit is constructed such that one or more of the compensation parameters exhibit nonlinear interactions, the extended Kalman filter is preferably used to adjust the values of the compensation parameters.

The above numerical off-line process is executed until the RMS value of the error vector falls to within a predetermined, sufficiently low value. An acceptable RMS value is such that when the compensation parameters are used in conjunction with the physical LINC amplifier, (as opposed to the LINC model), the generated power spectra will not violate regulatory requirements and that the modulation accuracy is sufficient not to impair system performance. When this system criteria, and/or additional system dependent criteria are met, then the compensation parameters are stored and on-line transmission may commence. The above process may be accelerated by simply pre-loading the compensation circuit compensation parameters with values that are computed from the direct inverse of the amplitude gain, phase delay and propagation delay values that were determined by the correlation process (step 152). Furthermore, in some applications where regulatory emission requirements are relaxed, this direct inversion of the correlation values may be sufficient to initiate transmission.

b. Updates to compensation parameters during operation

The processes and algorithms used by the ACPCE to monitor the operation of the LINC amplifier and adaptively update the compensation parameters will now be described with reference to FIG. 21.

Upon entering the TRACK AND UPDATE state (FIG. 11), the ACPCE loads the previously computed compensation parameter values into the DCSP 21 (assuming the DCSP was modeled in software in the FIG. 20 process), and commences a transmission event. During the lifetime of the transmission event, the physical characteristics of the analog components may change as a function of temperature, aging, power supply droop, etc. Consequently, the compensation parameters are adjusted to continually track and compensate for these changes. The algorithms used to support this functionality are preferably identical to those used in the previous section which described the initial calculation and evaluation of the compensation parameters.

Figure 21:
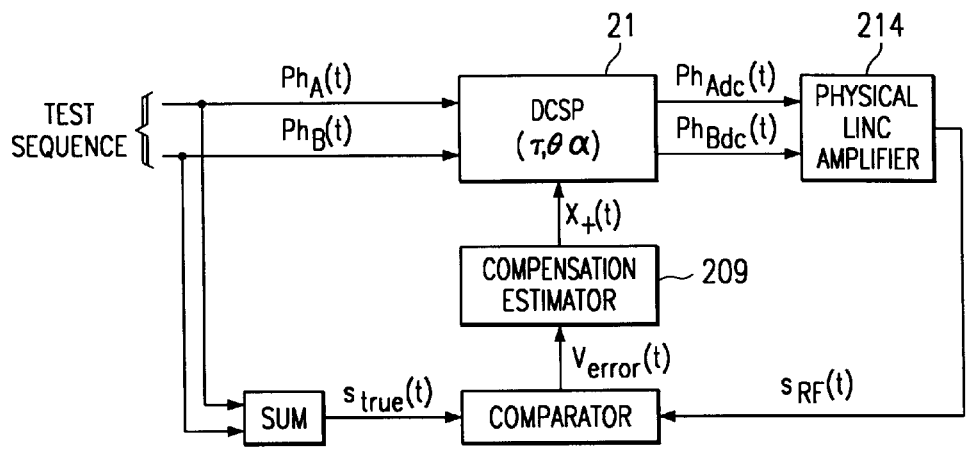
FIG. 21 is a schematic diagram of an arrangement to estimate compensation parameter values using a LINC amplifier.

FIG. 21 illustrates the general process performed when the LINC amplifier is in the TRACK AND UPDATE state (5). As seen by comparing FIGS. 20 and 21, the actual physical amplifier 214 is now used in place of the model 204. As a consequence, it may not be possible or feasible for the compensation estimation algorithms to "keep up" with the large data rate and numeric processing power associated with the real time process. Thus, as described above, the sets of data samples are captured and processed off-line. This is permissible because the amplifier characteristics change very slowly, at a rate that is orders of magnitude slower than the data rate of the transmitted signal. Although off-line processing is preferred, it is contemplated that the algorithms may potentially be implemented in real-time in future implementations.

As illustrated in FIG. 21, the DCSP 21 is stimulated with a continuous data stream of the component signals $Ph_A(t)$ and $Ph_B(t)$ from the signal component separator 11. These component signals are generated from s(t), the complex baseband information signal s(t) (not shown) to be transmitted. The digital compensated signal components, $Ph_{Adc}(t)$ and $Ph_{Bdc}(t)$, are applied directly to the LINC amplifier which outputs $s_{RF}(t)$, which represents the observed output transmission signal. The RF downconversion and analog-to-digital conversion components (26 and 27 in FIG. 2) provided along the $S_{RF}(t)$ signal path are omitted to simplify the drawing.

As further illustrated by FIG. 21, the component signals $Ph_A(t)$ and $Ph_B(t)$ are also summed to generate a predicted or desired output transmission signal $s_{true}(t)$. The predicted output transmission signal $s_{true}(t)$ may alternatively be generated directly from the input transmission signal s(t). When the LINC amplifier initially enters the TRACK AND UPDATE state and a transmission is commenced, the observed output transmission signal $S_{RF}(t)$ should not appreciably deviate from the predicted signal, $s_{true}(t)$, because the compensation parameters are initially set to accurate values. Over time, the deviation between these signals will normally increase (until the parameters are updated) as the current compensation parameters become outdated.

With further reference to FIG. 21, the signals $s_{true}(t)$ and $s_{RF}(t)$, as appropriately scaled to negate the effects of amplification, are compared by a comparator in an off-line, non-real-time mode to generate an error vector $V_{error}(t)$ This may be accomplished, for example, by capturing and storing sample sequences of $s_{true}(t)$ and $s_{RF}(t)$, and reading these sequences from memory during a comparison phase. Rather than storing sequences of $s_{true}(t)$, sequences of the signals used to generate $s_{true}(t)$ (such as $Ph_A(t)$ and $Ph_B(t)$) may be captured and stored.

As further illustrated by FIG. 21, the signal $V_{error}(t)$ is used by the ACPCE's compensation estimator 209 to compute adjustments to the compensation parameters. The updated compensation parameters are provided to the DCSP via the parameter vector $X_+(t)$. The compensation estimator 209 is a direct implementation of the LMS, RLS or Kalman filter algorithms which were previously discussed. Furthermore, if the DCSP is constructed such that one or more of the parameters exhibit nonlinear interactions, then the extended Kalman filter is preferably used to adjust the values of the compensation parameters.

This process of capturing predicted and observed data sequences, combined with numerical off-line computation, is repetitively used to ensure that the current values of the compensation parameters are sufficiently accurate to ensure that regulatory power spectral emission, system modulation accuracy and amplifier NPR requirements are maintained. The process may be repeated at a predetermined rate which is suitable for the particular application, such as five times per second or once every ten seconds. Alternatively, the signal $V_{error}$ (or another appropriate signal) may be monitored to dynamically determine when the updates should be computed.

The accuracy of the parameter estimation can be enhanced by iterative updating of the compensation parameters. Rather than calculate new parameters based on only the information in one sample capture period, the amount of change of the parameters can be controlled by calculating a weighted average of the current calculated values with progressively smaller contributions from previous parameter calculations. With this approach, the newly calculated parameters do not change significantly or suddenly on each calculation due to non-ideal characteristics of the data of particular sample sets. This type of long term averaging helps to achieve a better overall correction rather than one that "jumps" around the ideal position.

In addition, the transition from one parameter set to the next may be applied in steps spread over an interval of time to avoid sudden changes in the amplifier outputs. This is preferably accomplished by generating a sequence of parameter values on an interpolated path between the two sets of values. These parameters are then programmed into the filters and other correction systems in succession at intervals such that the change is made smooth and gradual.

The process depicted in FIG. 21 and described above is also preferably used to update the compensation parameters when the amplifier is in an antiphase or other training mode. The only difference is that the component signals $Ph_A(t)$ and $Ph_B(t)$ are generated by the SCS 11 without regard to any input transmission signal.

The algorithms used for system identification and compensation parameter estimation are summarized as follows:

LMS Update:

$$\text{Verror}(t) = s_{true}(t) - s_{obs}(t) \qquad \text{eqn 22}$$

$$C_{k+1} = C_k + \Delta e_k V_k^* \qquad \text{eqn 23}$$

$$[X_+(t)] = [X_-(t)] + \Delta \text{Verror}(t)[Ph_A(t), Ph_B(t)]^* \qquad \text{eqn 24}$$

Recursive Least Squares (direct form) also known as the Kalman Filter update:

$$s_{obs}(t) = T_N^Y(t) C_N(t-1) \qquad \text{eqn 25}$$

$$\text{Verror}(t) = s_{true}(t) - s_{obs}(t) \qquad \text{eqn 26}$$

$$K_N(t) = \frac{P_N(t-1) Y_N^*(t)}{w + Y_N^T(t) P_N(t-1) Y_N^*(t)} \qquad \text{eqn 27}$$

$$P_N(t) = \frac{1}{w}[P_N(t-1) - K_N(t) Y_N^T(t) P_N(t-1)] \qquad \text{eqn 28}$$

$$C_N(t) = C_N(t-1) + P_N(t) Y_N^*(t) \text{Verror}(t) \qquad \text{eqn 29}$$

Extended Kalman Filter for Non Linear Estimation Scenarios:

$$s_{obs}(t) = h_N(t)\{t, C_N(t-1)\} \qquad \text{eqn 30}$$

$$\text{Verror} = s_{true}(t) - s_{obs}(t) \qquad \text{eqn 31}$$

$$C_N(t) = C_N(t-1) + Y_N^*[\text{Verror}(t)] \qquad \text{eqn 32}$$

$$P_N(t) = [1 - Y_N H_N(C_N(t-1))] P_N(t-1) \qquad \text{eqn 33}$$

$$Y_N = P_N(t-1) H_N^T(C_N(t-1))[H_N(C_N(t-1)) P_N(t-1) H_N^T(C_N(t-1)) + R_N]^{-1} \qquad \text{eqn 34}$$

$$H_N(C_N(t-1)) = \frac{\partial h_N(C_N(t-1))}{\partial C_N(t-1)} \qquad \text{eqn 35}$$

VIII. Combining of Amplified Signals

Figure 24:
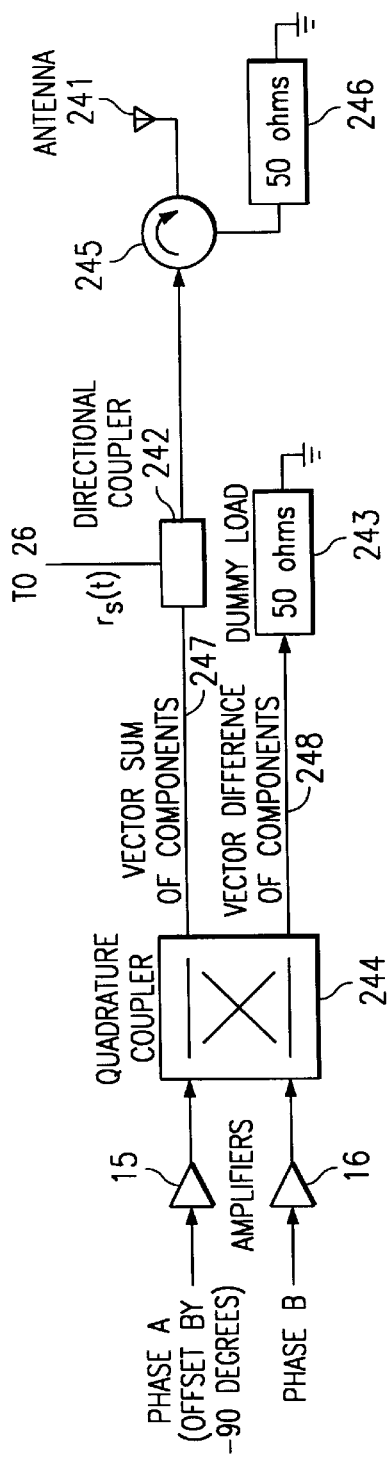
FIG. 24 depicts the amplifier combining and sampling element of FIG. 2 coupled to an output antenna.

FIG. 24 depicts the internal parts of block 25 ("Amplifier Power Combining and Sampling") in FIG. 2, and the antenna 241 which is coupled thereto. Directional coupler 242 feeds a small amount of the RF signal back to the down conversion block 26 (FIG. 2). FIG. 24 also depicts circulator 245, which prevents received or reflected signals from antenna 241 from entering the system. The individually amplified constant envelope phase modulated component signals are combined to produce the vector sum of the two via a quadrature coupler 244, which has two separate outputs. The LINC amplifier generates a maximum output power by having the two components in phase with each other.

A practical consideration in the use of a quadrature coupler is the need for the components to actually be offset so that they are 90 degrees apart in order to co-phase at the main output. Other types of couplers require a 180 degree offset. This can be arranged in the digital signal component separator 11. When this is done, all of the combined power is seen at the main combiner output 247. No power is seen at the second output 248.

The LINC amplifier outputs minimum power by having the two signals exactly out of phase with each other. No power is seen at the main output 247, as all of the power goes to the second quadrature combiner output 248. This output 248 can be connected to a terminating "dummy" load 243 of sufficient power handling capability. As described below, the dummy load 243 may optionally include or be in the form of an energy recovery circuit.

All intermediate power levels are generated by the difference in phase between the two component signals. Both of the amplifiers 15, 16 run at full power continuously and their combined power is continuously shared between the main output and the dummy load 243.

The use of nonlinear amplifiers 15, 16, which are inherently more efficient, means that the amplifiers themselves do not generate as much heat as other types of linear amplifiers. The waste energy from the combination of the outputs is dissipated in the dummy load which can be remote from the amplifiers and other circuits. This means that cooling of the amplifiers and other components of the amplifier is simpler, and that the amplifiers can run at a lower temperature and in a smaller enclosure and with potentially higher reliability. The amount of waste energy sent to the dummy load is dependent on the peak to average power ratio of the signal amplified. Some modulation schemes which have less amplitude variation will not require the phases to cancel as much as others and will generate less heat in the load.

IX. Digital-to-Analog and Up Conversion

Whenever digital techniques are used in the signal component separator 11 and in the correction filters, at some point the signals have to be converted from digital samples to analog form in digital to analog (D/A) converters. If complex baseband analog signals are to be generated for an analog quadrature modulator, a total of four converters are used for the in-phase and quadrature components of each of the two phase modulated signals. If real sampled signals from a digital quadrature modulator are generated, then only one converter is needed for each of the two phase modulated signals.

Figure 25:
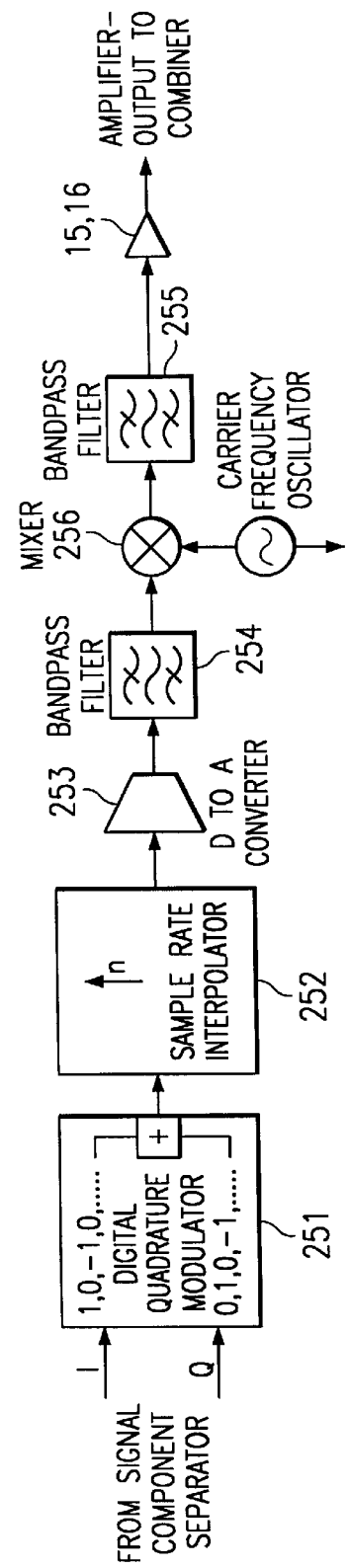
FIG. 25 depicts the modulation and upconversion of one of the two signal paths of the LINC amplifier of FIG. 2.

If digital quadrature modulation is used the frequency at the output of the D/A converters will be relatively low when compared with the hundreds of megahertz typically used in modem wireless communications systems. The low intermediate frequency needs to be unconverted to the carrier frequency used for transmission. This upconversion process is done using analog techniques which are well known in the art. FIG. 25 illustrates a typical preferred path but many other combinations are possible.

FIG. 25 depicts an expansion of one half of 22 from FIG. 2 and either 23 or 24, and an amplifier, either 15 or 16. FIG. 25 depicts the path of one of the phase component signals.

The inputs "From Signal Component Separator" are the I and Q complex components of either $Ph_{Adc}(t)$ or $Ph_{Bdc}(t)$. The digital quadrature modulator 251 is depicted to be the simplest type, however. More complicated types use a sampled sine wave lookup table and multipliers and could be used. The sample rate interpolator 252 raises the sample rate to ease the reconstruction filtering requirements. Following the interpolator 252 is the actual DAC 253. The first bandpass filter 254 acts as a reconstruction filter, and may alternatively be a lowpass filter. The signal at the output of this filter 254 is at an intermediate frequency.

The mixer to RF and RF image rejection bandpass filter 255 follows before the amplifier. Other implementations may use mixing 256 to additional stages of intermediate frequencies before mixing to the RF which passes through the non-linear amplifiers 15 or 16. Note that the necessary buffer amplifiers between the DAC and filter and between the filters and the mixer (not shown) are to provide isolation between the various components and to adjust the signal levels appropriately at each stage.

X. Monitoring of Output Signal

In order to implement the monitoring and correction mechanism a small amount of the output signal of the quadrature combiner is directed to a receiver, using a directional coupler. The receiver converts the RF signal down to complex baseband samples which can be compared with samples of the ideal signal. This monitoring process enables the ACPCE to calculate the amount of inaccuracy which exists through the whole of the two upconversion paths.

FIG. 26 shows a preferred down conversion scheme. FIG. 26 depicts portions of FIGS. 2, 24 and 25, and includes the FIR filters 92, 93 which are inside block 21 in FIG. 2.

A small amount of the signal going to the antenna is taken by the directional coupler 242 which is inside block 25 of FIG. 2. The bandpass filters 261, 263, mixer 262 and local oscillator are all contained inside block 26 of FIG. 2. The A/D converter 264 and digital quadrature modulator 265 are inside block 27 of FIG. 2. The I and Q outputs of the digital quadrature modulator are the $\gamma s(t)$ 137.

The directional coupler takes a small amount of the RF signal which goes to the antenna. Directional couplers are usually designed to take a portion such as an amount 20 or 30 db below the signal put into them. This amount of energy does not significantly reduce the amount of power going straight through to the antenna, but it is an accurate representation of what is going to the antenna.

The bandpass filter 261 is an image rejection filter which rejects the image which might get converted down to the first IF together with the desired signal. The mixer 262 converts the signal to the first IF. In this illustration, there is only one IF but more may be used. The local oscillator is preferably the same one as the one in FIG. 25. This ensures precision matching of the frequencies of up and downconversion, including phase noise effects. It would be possible to use another or different frequency or oscillator, but it would be much more complicated and difficult to implement the correction if this were to be done.

If additional intermediate frequency stages are to be used, then the preference is for oscillators to be the same between up and downconversion. The filter 263 is an anti-aliasing filter which prevents the sampled output of the A/D converter from containing anything but the desired frequency. In the case of oversampling the IF, this can be a low pass filter. If the signal is undersampled, it must be bandpass filter centered around the IF. The A/D converter 264 is a standard component. The digital quadrature modulator 265 performs the reverse of the digital quadrature modulator. In its simplest form, it requires that the outputs be interpolated and filtered due to an inherent decimation. The use of a digital quadrature demodulator will provide a good representation of the signal at complex baseband. As in the upconversion, there would be some buffering stages between the components in the downconversion.

The differences in the signal paths are due to the total of the distortions in all of the components in the paths. These distortions will be frequency dependent differential time delay, amplitude difference and phase difference. It is important for the correction to be effective over the bandwidth output by the amplifiers. This is a much wider bandwidth than the channel to be occupied by the transmitted signal. It is possible to reduce any residual wideband emissions of the upconversion paths by filtering the output of the amplifier and thereby reduce the requirement for wideband monitoring. A minimum sampling ratio of 4 to 1 compared with the original input sampling rate is typically required. A higher sampling rate up to the 16 to 1 used in the signal component separator 11 reduces the need for output filtering.

In order for the training system to work accurately the baseband signals seen at the output of the demodulator 265 should be a very accurate representation of the signal actually being transmitted at the amplifier combiner output to the antenna.

The sample measurements taken by the ACPCE can be adjusted in amplitude to take advantage of the full dynamic range available in the digital processing. The full precision helps to make the measurements and the calculated corrections more accurate. The samples of the two phase components $Ph_A(t)$ and $Ph_B(t)$ are at a constant amplitude, but the down converted output may be at any amplitude dependent on the signal being transmitted. An important consideration is that the A/D converter 264 in the monitoring path is not overloaded because this can cause severe distortion. Control of the amplitude of the signals before the A/D converter may be applied using knowledge of the transmitted amplitude from the transmit path. The availability of this information allows overloads to be avoided.

Another important point is that any analog adjustment of gain in the down conversion would appear as an amplitude error in the feedback path if it is not counteracted numerically by scaling the digital samples. A simple implementation would be to fix the gain so that the maximum possible output of the amplifier corresponds to just less than the maximum input of the A/D converter.

It is possible that the antenna may not be properly matched, causing energy to reflect back down to the combiner and result in phase and amplitude changes. It is also possible for the antenna to receive unrelated interfering signals from other transmitters which can be seen at the monitoring point. In order to reduce these effects, an isolator or circulator 245 (FIG. 24) can be attached between the monitoring directional coupler 242 and the antenna 241. An isolator directs any energy from the antenna to a separate dummy load 246 as is shown in FIG. 24.

The down conversion process should be substantially error free because any distortions introduced by it will appear in addition to the effects produced in the upconversion and amplification. This will cause the ACPCE to correct for these impairments as part of the whole. This in turn will result in the transmitted signal having that distortion added to it.

The preferred implementation of the receiver is to first down convert using the same Local Oscillator (LO) as is used in the upconversion. This will result in an intermediate frequency which is the same as that used in the transmit paths and it will cancel any phase and frequency variations introduced by the oscillator in the upconversion paths.

The further down conversion and demodulation of the signals in the receive path can be done using analog or digital techniques. Although analog quadrature demodulators can be fine tuned to produce balanced outputs they are usually subject to distortion which changes over time and temperature which requires continuous correction. Their individual analog outputs also require separate analog to digital converters which are difficult to match absolutely.

Digital quadrature demodulators (DQDM) do not produce the impairments of analog versions and only a single high speed A/D converter is required before the DQDM. Digital techniques are preferred as much as possible to reduce distortion and avoid the parameter drift associated with the analog methods. Digital down conversion can be done using a variety of techniques including undersampling and digital filtering to minimize the amount of analog processing. Undersampling is a technique whereby the analog signal is bandpass filtered as shown in FIG. 26 and then sampled at a rate which is sufficient only to observe the band of interest. This being a rate much lower than that required to sample the actual intermediate frequency.

In the same way that the LO is shared between the upconversion and down conversion the same digital clocks should be used in the DQDM as in the SCS and digital upconversion. This technique greatly simplifies the implementation of fine tuning of the frequency and phase of the carrier in the demodulation chain.

XI. Training of Compensation System

As indicated above, an important aspect of the invention involves the application of stimulation signals along the compensation/amplification chains when the amplifier is in a keyed-off mode (i.e., when no information signal is being transmitted). This allows the amplifiers 15, 16 to be maintained at a constant power operating point, and reduces drift in analog component values. Preferably, the stimulation signals are also used to train the compensation system (and are thus referred to herein as "training signals") to ensure that the compensation/amplification chains are sufficiently balanced when transmission commences.

As indicated above, an important feature of the invention involves the use of stimulation or training signals that are in antiphase. (The term "antiphase signals" is used herein to refer collectively to the signal applied to one of the compensation/amplification chains and to its antiphase counterpart that is applied to the other compensation/amplification chain.) Provided that the compensation/amplification chains are sufficiently balanced, the antiphase signals substantially cancel when combined. As a result, emissions from the antenna are substantially inhibited without the need for a costly RF antenna switch to switch between the antenna and a dummy load. The elimination of the RF switch provides significant benefits, as RF switches tend to be expensive and produce a power loss between the amplifier and the antenna.

Although the elimination of the RF switch is an important feature of the invention, an RF switch may nevertheless be incorporated into the transmitter in some embodiments. This would enable antiphase training signals to be used without regard for whether the compensation/amplification chains are in balance. In addition, the use of the RF switch would allow non-antiphase training signals to be used. In one embodiment, for example, a diode or other power detector is used to give a quick indication of the total energy caused by residual imbalance, and to disconnect the antenna when this level is too high. In another embodiment, multiple detectors with respective bandpass filters are used to measure energy in discrete frequency bands, and the outputs of these detectors are used to select or limit the frequency band of the antiphase training signals.

FIGS. 22A–22D show how antiphase signals produce no resulting output when the compensation/amplification chains are balanced, and how phase and amplitude imbalances result in a small output. When there is perfect balance, all of the power is sent to the dummy load 243 (FIG. 24). If the compensation/amplification chains are badly unbalanced, energy is emitted from the antenna until a state of balance is achieved.

The ability to put the two amplifiers 15, 16 into antiphase allows the amplifier output level to be controlled while leaving the amplifiers keyed up at full power. This is an advantage over other types of amplifiers since power, bias and keying on by application of a signal to the amplifiers can be done without any transmission occurring. This means that bias, key up and bias re-optimization can be set up without potentially undesirable effects being seen at the start of transmission as would normally be the case. The amplifiers can be allowed time to stabilize their thermal state (fully warm up), and fine tuning of bias can be performed.

The antiphase training feature of the invention can be used in a variety of different operational states of the amplifier. For example, in a TDMA or other system in which data is transmitted in periodic or repetitive bursts, antiphase training can be used to maintain balance between transmissions. In addition, as described in the following subsections, antiphase training can be used to maintain a state of balance while the amplifier is being powered up or down, and can be used to achieve a state of balance following a channel change.

a. Generation of antiphase sequences

The antiphase training signals are preferably generated by the SCS 11 (as digital sequences), although the signals could alternatively be generated elsewhere within the system. The SCS preferably generates the antiphase training sequences based on control inputs 29 (FIG. 3A) from the ACPCE's state machine (FIG. 11), and based on whether a non-zero-amplitude transmission signal s(t) is present at the input to the SCS. For example, when the amplifier is in the TRACK AND UPDATE state, the SCS may begin generating antiphase training sequences when the SCS detects a zero amplitude input signal s(t).

The content (numeric values) of the antiphase sequences is preferably independent of the input signal s(t). In one embodiment, a base sequence is generated or read from a memory, and is inverted to form an inverted sequence. The base sequence is applied to one of the compensation/amplification chains, and the inverted sequence is applied to the other compensation/amplification chain. The inversion may be achieved by inverting a sign bit, using a look-up table, or using another suitable approach.

b. Selection of training sequences

The training signals are preferably selected so as to allow the ACPCE to generate accurate compensation parameters. Because the degree of balance between the compensation/amplification chains is frequency dependent, training signals which cover a range of frequencies are preferably used. This may be accomplished, for example, by sweeping or hopping the frequency while maintaining the two training signals in antiphase. In one embodiment, training signals are used which, within the duration of a single training sample block, cover the entire frequency range of interest (e.g., the channel or set of channels assigned to the transmitter).

The appendix description of the TRAINING AND ACQUISITION state lists a number of possible training sequences "a" to "n". While the non-antiphase sequences "a" to "k" are all useful for training purposes, they generally require that the amplifier be disconnected from the antenna. Thus, these signals are most useful in environments or designs in which the transmitter includes an antenna switch. The antiphase sequences, such as "l", "m" and "n," are preferred because the only emitted signal to the antenna would be due to residual imbalance between the two compensation/amplification chains.

Figure 23:
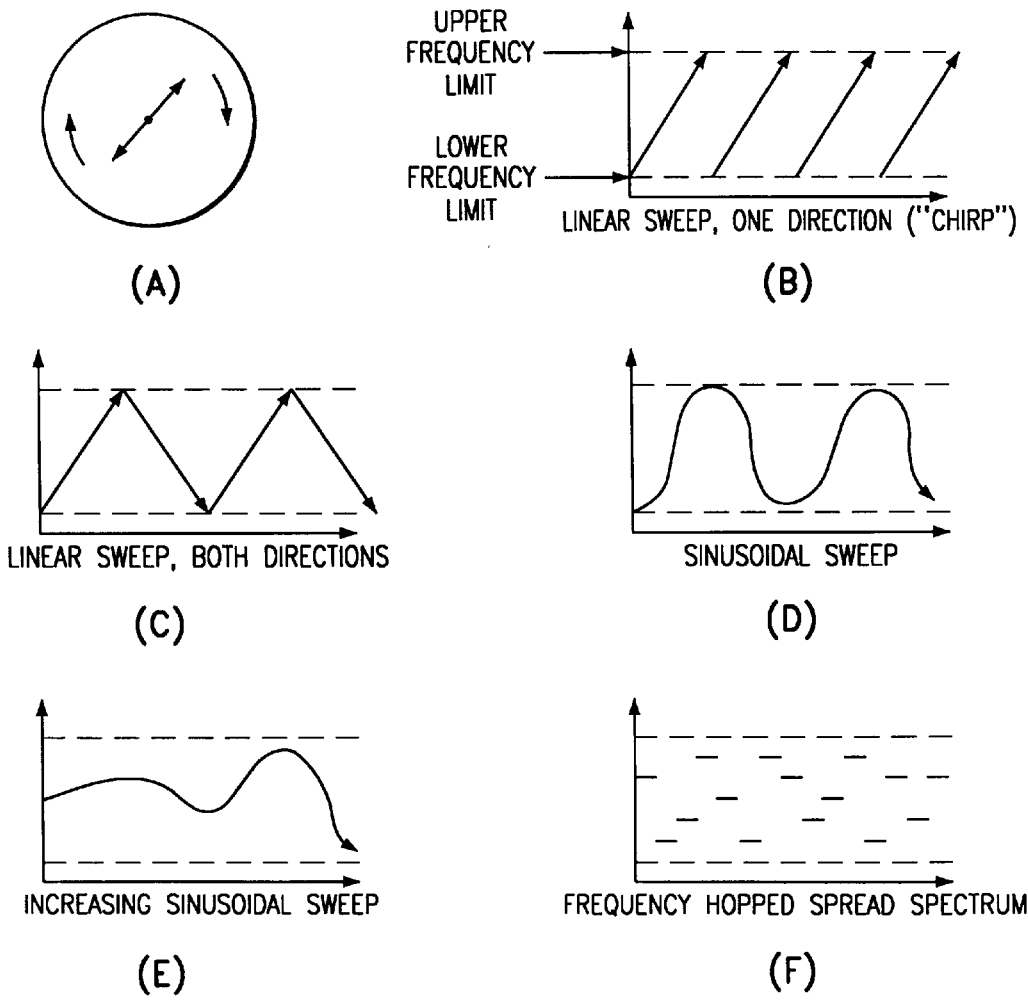
FIGS. 23(A)–(F) depict frequency-varying antiphase training sequences.
Figure 22A:
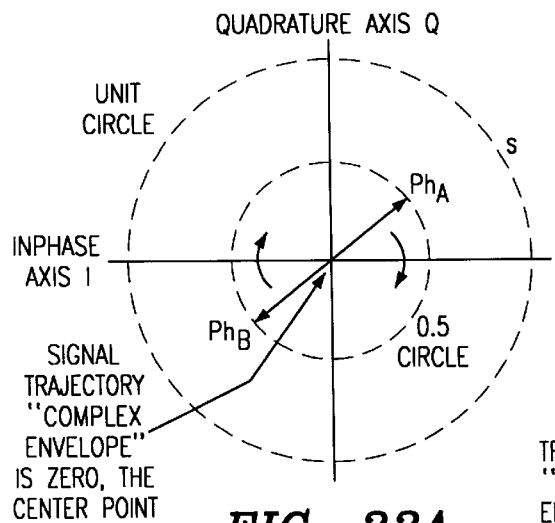
FIGS. 22A–22D are graphs showing balanced antiphase signals with no resulting output, and a small output from phase and amplitude imbalances.
Figure 22B:
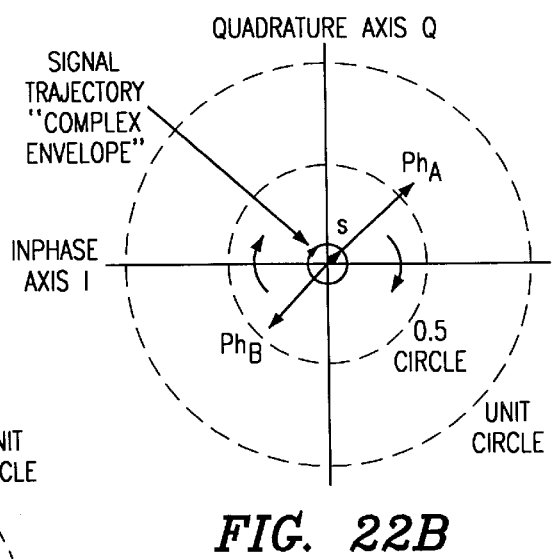
Figure 22C:
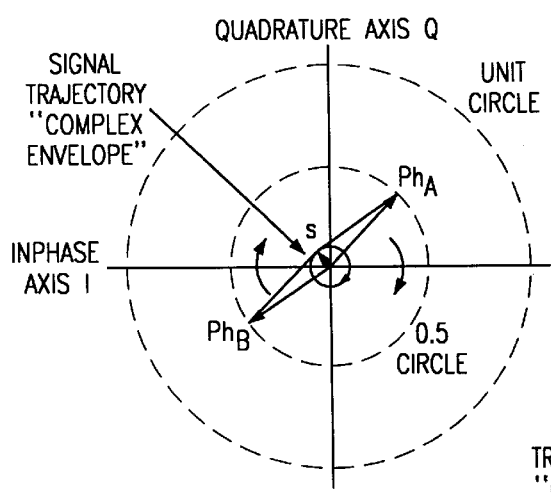
Figure 22D:
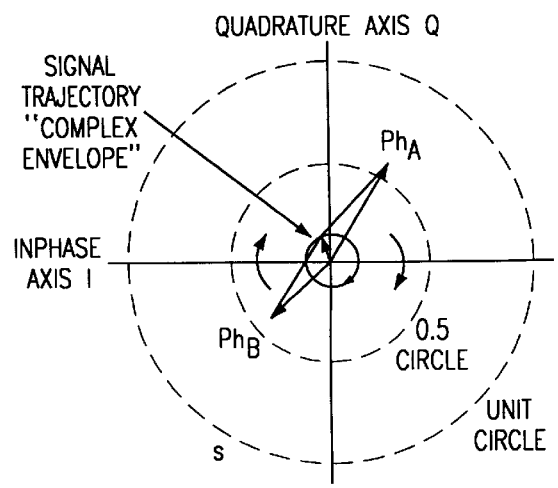

In order to cover the full range of frequency and provide training information which maps frequency dependent variations, the antiphase signals should be made to cover the entire band that is occupied by the signal components. This is a much wider band than that occupied by the normal transmissions. Frequency sweeping, chirping and/or hopping can be used for this purpose. As illustrated by FIG. 23(A), the antiphase test pattern has the two signal components in antiphase. The rotation represents the frequency which is swept, chirped or hopped across a particular frequency band. At baseband this signal is represented by a negative frequency at the lower limit and DC in the middle.

FIGS. 23(B)–23(F) illustrate several possible patterns for varying the frequency of the antiphase signals. These patterns include (B) unidirectional linear sweeps, (C) bidirectional linear sweeps, (D) sinusoidal sweeps, (E) sinusoidal sweeps which increase in frequency range over time, and (F) frequency hopping. In the FIG. 23(E) scenario, the frequency range can initially be limited to the channel currently assigned to the transmitter, and can slowly be increased as a greater level of balance is achieved to encompass adjacent channels; this method has the benefit of reducing the likelihood of interference on other channels, and is described in further detail below.

An important benefit of the frequency hopping scheme is that residual energy transmitted from the antenna is spread out over a wide range of frequencies. As a result, the unwanted emissions appear as background noise, and the likelihood that the unwanted emissions within any frequency channel will be sufficiently high to cause interference is reduced. A related benefit is that frequency hopped, antiphase training sequences can be used with a lesser degree of balance between the two chains than is possible with non-spread-spectrum sequences.

An alternative to chirps and sweeps is a polyphase signal which is a series of discrete frequencies transmitted one after the other. Such a signal could be a series of frequencies in increasing or decreasing order. A particularly useful sequence would be either a randomly frequency hopped antiphase pattern or antiphase signals generated from a noise input to a frequency modulation process, so that unwanted emissions would appear only as background noise.

c. Powering up and down of amplifier

If the amplifier has not been switched on for some time, or if the temperature has changed significantly, the compensation/amplification chains may be severely out of balance. In some applications, it may be acceptable in this situation to simply begin using antiphase training at regular power levels. In other applications, the unwanted emissions from the antenna may be unacceptable.

Figure 27:
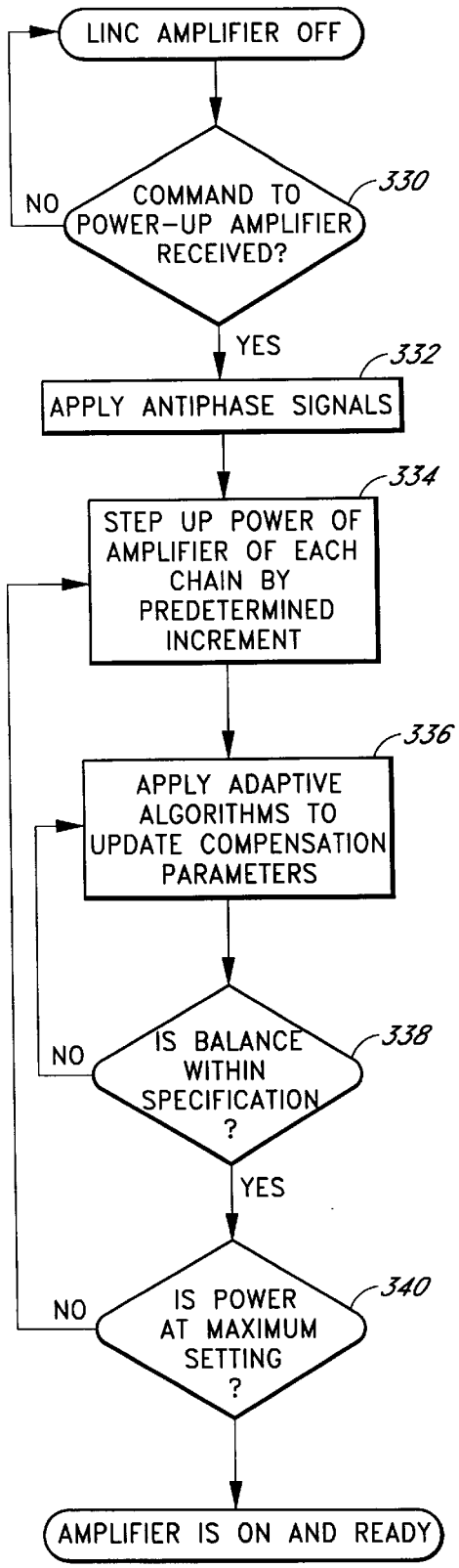
FIG. 27 illustrates a process that may be used to ramp up the LINC amplifier in power while maintaining the compensation/amplification chains in balance.

One solution to this problem is to replace the antenna with a dummy load during training, such as through use of an RF antenna switch, when an intolerable level of imbalance is detected. As discussed above, however, RF switches add to the cost of the transmitter, and cause power loss between the amplifier and the antenna. A preferred approach, therefore, is to slowly ramp up the power of the amplifier while driving the compensation/amplification chains in antiphase while monitoring the degree of imbalance. An example of such a process is illustrated by FIG. 27, which corresponds to the TRANSMIT POWER UP state 1A of FIG. 11 (discussed above and in the appendix). This process may, for example, be implemented in hardware and/or firmware as part of the ACPCE.

Referring to FIG. 27, the process remains in a loop with the amplifier in the OFF state until a command is received (typically from the transmitter's microprocessor) to power up the amplifier (step 330). Antiphase training signals are then applied to compensation/amplification chains (step 332), and the amplifiers 15, 16 are stepped up in power by a small increment (step 334). The process then enters into a loop (steps 336 and 338) in which the ACPCE applies the adaptive compensation algorithms until the degree of balance (preferably measured by monitoring the residual output power) falls within a predetermined specification. Once the level of balance falls within specification, the process determines whether the amplifier is at its maximum power setting (step 340). If the maximum power setting has been reached, the process terminates and the amplifier enters into the CALIBRATION state (FIG. 11). If the maximum power state has not yet been reached, the process loops back to step 334 to again step up the power and apply the adaptive algorithms.

Figure 28:
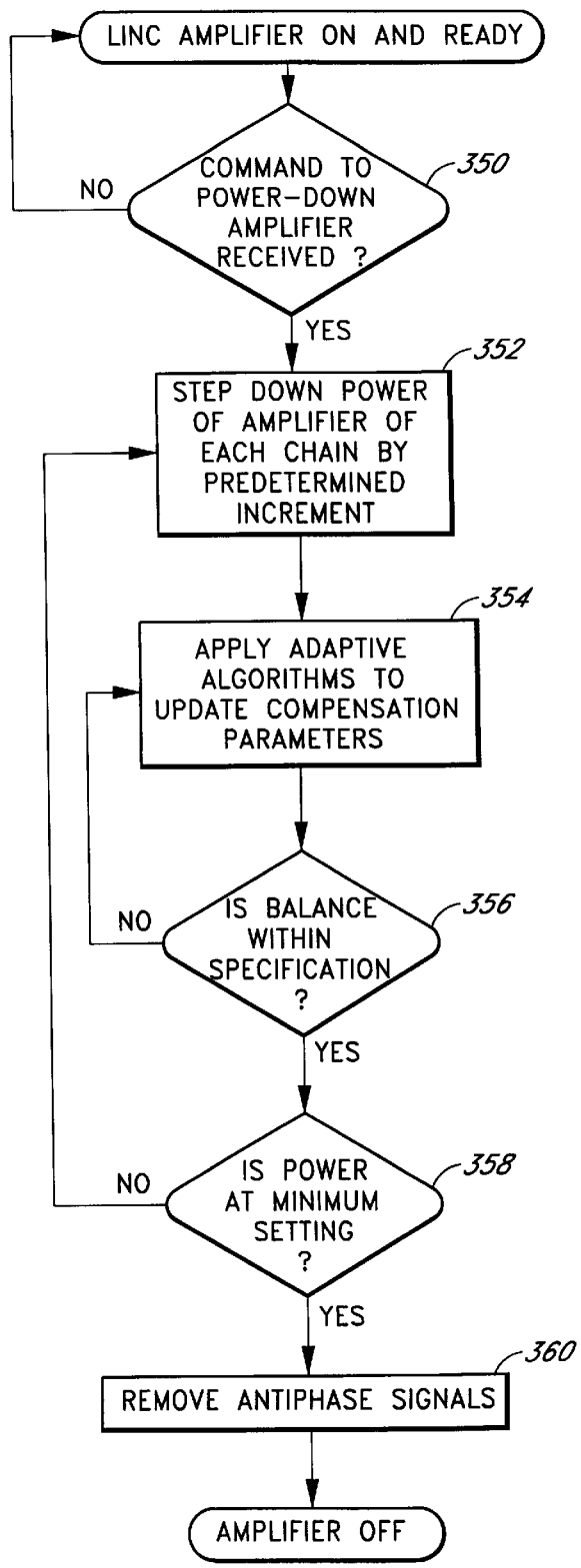
FIG. 28 illustrates a process that may be used to ramp down the LINC amplifier in power while maintaining the compensation/amplification chains in balance.

As depicted in FIG. 28, a similar process may be used to maintain unwanted emissions at an acceptable level as the LINC amplifier is powered down. The FIG. 28 process corresponds to the TRANSMIT POWER DOWN state 1B of FIG. 11 (discussed above and in the appendix). It is assumed in FIG. 28 that the amplifier is currently in an antiphase training mode when the power down command is received. In response to the command, the power level of the amplifiers 15, 16 is stepped down by a small increment (step 352), and the adaptive algorithms are used to balance the compensation/amplification chains to within a predetermined specification (step 354 and 356). This process is repeated until the power level reaches a minimum (step 358), at which time the antiphase training signals are removed (step 360).

The incremental power steps used in step 334 (FIG. 27) and step 352 (FIG. 28) are selected to be small enough so that the level of imbalance caused by the power steps is acceptably small. Thus, unwanted emissions from the antenna remain at an acceptable level during the ramp up process. In one embodiment, a calibration process is used to determine the overall power increment levels that can be tolerated in steps 334 and 352 without generating unacceptable levels of emissions, and the results of this process are stored in the transmitter's nonvolatile memory for subsequent use.

The power settings of the amplifiers are preferably stepped up and down in the FIG. 27 and 28 processes by varying the input drive, bias level, and/or power supply of each amplifier 15, 16. One potential problem with this method is that it tends to be difficult to increase or decrease the power of two amplifiers by exactly the same amount. To avoid this problem, a second calibration process (not illustrated) is preferably used to measure, for each amplifier 15, 16, the level of power increase (or decrease) which occurs in response to a given control input. The measurements taken during this calibration process are stored in the transmitter's memory, and are used to select the respective control input levels to use to ramp up and down the amplifiers 15, 16 in lock step. This calibration process is preferably implemented as an adaptive process that is invoked whenever the LINC amplifier is powered up or down. Alternatively, the calibration process could be invoked only during the manufacture and initial testing of the transmitter.

d. Real time adjustments to training band

In some applications, a greater level of imbalance (and thus unwanted emissions) can be tolerated within a particular frequency band or channel of the transmitter than in adjacent channels used by the transmitter. For example, if a particular channel has been uniquely assigned to the transmitter, a relatively high level of emissions may be acceptable within this channel, since no other transmitters can currently transmit on the channel.

To take advantage of this situation, a training process may be used which initially limits the frequency of the antiphase training signals to a particular band, such as a band that is uniquely assigned to the transmitter. As the compensation/ amplification chains become balanced, the frequency range of the antiphase signals may be widened gradually (in steps or otherwise) to cover adjacent transmission channels. Using this approach, the compensation/amplification chains can be brought into balance quickly while reducing the likelihood of interference in adjacent channels.

FIG. 29 illustrates a process that may be used to implement a narrow-to-wide band training scheme. This process could optionally be combined with the power-up process (FIG. 27) to further reduce interference in adjacent channels. Initially, narrow-band antiphase training signals are applied to the compensation/amplification chains (step 370), and the bandwidth (sweep range, etc.) of the antiphase signals is increased by a small, predetermined increment (step 372). The incremental bandwidth increase used in step 372 is selected to be small enough such that the imbalance caused by the increase produces an acceptable level of unwanted emissions. In the first iteration, the bandwidth of the antiphase signals following step 372 preferably falls within the assigned channel of the transmitter. Within this frequency range, the compensation/amplification chains are brought into balance (steps 374 and 376), and then the frequency range of the antiphase signals is again increased (step 372). This process continues until the frequency range reaches a predetermined maximum (step 378), which preferably encompasses all frequencies which may be encountered along the compensation/amplification chains during normal operation.

Another feature of the invention involves changing the frequency of operation of the amplifier without powering down the amplifier. This feature may be used, for example, when the transmitter changes to a new transmission channel. FIG. 30 illustrates a process which may be used for this purpose. Initially, antiphase training signals are applied to the compensation/amplification chains within a band that corresponds to the current operating frequency of the amplifier (step 380). The frequency range of the antiphase signals is then shifted by a small increment (step 382) in the direction of the target operating frequency, and the adaptive algorithms are used to balance the compensation/amplification chains (steps 384 and 386). The frequency shift used in step 382 is selected to be small enough such that the imbalance caused by the shift produces an acceptable level of unwanted emissions. This process of incrementally shifting the frequency range and then balancing the compensation/amplification chains continues until the new frequency of operation in reached (step 388)

e. Transitions between training sequences and modulated signal

When the LINC amplifier is running in antiphase at full power and the compensation/amplification chains are balanced, the amplifier is ready to begin transmitting a signal. However, discontinuities in the frequency, phase or amplitude of the component signals generated by the SCS 11 can cause undesirable wideband energy (referred to as "splatter") to appear at the output of the amplifier. Thus, rather than simply switching from the antiphase training signals to the input signal s(t), a smoothing function is preferably used to smooth the transition between the two. The smoothing function is also used on transitions from the input signal to the antiphase training signals, such as at the end of a burst transmission.

FIG. 31 depicts, in generic form, a process which may be used to smooth the transition between an input-based signal and an artificially-generated training signal (in either direction). The process may be implemented during the TRANSMIT RAMP UP and TRANSMIT RAMP DOWN states 4, 7 illustrated in FIG. 11 and discussed above. The process is preferably implemented as part of the SCS 11, but could alternatively be implemented elsewhere in the system. It is assumed that the process has available to it both (1) the digital component signals generated by the SCS from the input signal s(t), and (2) the artificially-generated antiphase training signals. In addition, it is assumed that the process has the ability to manipulate the phase and frequency of the antiphase training signals. For purposes of describing the process, it will be assumed that a transition is being made from training signals (source1) to input-based component signals (source2).

Initially, the component or phase signals $Ph_A(t)$ and $Ph_B(t)$ at the output of the SCS are based solely on the samples of the antiphase training sequences (source1).

In step 400, a linear, Gaussian or other weighting function is applied to the source1 and source2 samples to increase the contribution of the input-based component signals by a small amount, and to decrease the contribution of the training signals by an equal amount. The incremental values used in step 400 are sufficiently small to maintain wideband splatter at an acceptable level. During the smoothing process, each SCS output is generated as a vector sum of the corresponding weighted complex samples from source1 and source2 (step 404). Once the SCS output is based solely on the input signal s(t), the process terminates.

XII. Storage and Reuse of Compensation Parameters

The LINC amplifier is preferably configured to self train to achieve a good output as part of its initial testing. The resulting filter coefficients and other compensation parameters are then stored in non-volatile memory, so that the compensation parameters are available for use when the transmitter is subsequently turned on. Compensation parameters calculated during subsequent uses of the amplifier can be stored in addition to or in place of the previously stored parameter sets. Where multiple parameter sets are maintained in memory, an averaging algorithm can be used to generate the start-up compensation parameters from the stored parameter sets.

One optional feature of the LINC amplifier involves time stamping the compensation parameter sets that are stored in memory. If a continuously running internal clock shows that the most recently stored parameter set is too old at switch on, the full start up training and acquisition can be performed; otherwise, the most recently stored parameter set (or a set generated by averaging multiple sets) could be used, without the need to enter the full training sequence.

As indicated above, it is possible for the correction parameters to be different for different transmit channels. When the frequency of operation is changed substantially to a new range, such as by changing the final LO frequency, the amplifiers and other components may have different characteristics. Accordingly, another option is to store compensation parameter sets for each channel or band of operation, and to select the parameter set to be used at start-up based on the current channel or channels of operation. The initial channel-specific parameter sets can be generated and stored in non-volatile memory at the factory, and these initial sets can be updated automatically over time. If no compensation parameter data is available for the selected channel at start-up, an interpolation algorithm can be used to generate the parameter set from those stored for other channels.

XIII. Gain Control and Clipping

Figure 32:
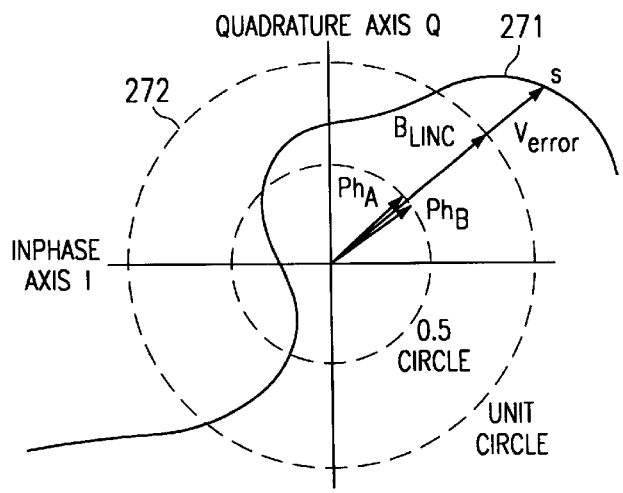
FIG. 32 is a graph showing clipping in the operation of the signal component separator of FIG. 2.

The disclosed LINC design does not function correctly over all possible numerical ranges of the input signal I and Q components. Despite being bandlimited, the input signal s(t) is permitted to migrate across the entire complex modulation plane which is unbounded. As depicted in FIG. 32 and revealed by equation 3, the decomposition performed by the SCS is only valid when the signal trajectory 271 is within the unit circle 272. Provided the SCS takes care of numerical/computational failure, the output of the amplifier will be unable to generate the required amplitude signal because of the maximum finite power level that the amplifier can deliver. Under such circumstances, a clipping event will occur at the output of the amplifier and distortion products will be observed. Such scenarios should not be permitted to occur.

Each clipping event will be characterized by a duration and power level. As the clip duration becomes shorter, the distortion energy will approach a white broad band Gaussian distribution. However, long duration clips will tend to concentrate the distortion energy within the bandwidth of the original signal s(t).

The above scenario can be eliminated or controlled by using a digital automatic gain control (AGC) stage prior to the SCS 11 that causes the signal, s(t) to be constrained within the unit circle. If the AGC stage still allows an excessive input to the SCS it must generate signals with the correct phase but on the unit circle. Spurious phase responses should not result from an overload of the SCS input.

In the amplitude scaling block an important implementation consideration is determination of the peak to average ratio of a signal for setting the correct range of amplitudes to be output by the amplifier. Ideally, when the absolute highest peak signal is input to the SCS, this should produce the condition where both amplifiers 15, 16 are driven in phase for maximum combined output. This will then serve as a reference for the generation of all other amplitudes. Typically this value is not known until it occurs and even when set it may still be possible for occasional signals to exceed this value. In a multi-channel system additional carriers may be keyed on and off, changing the power requirements. Ideally the average power level in such systems should be adjusted so that the addition or removal of carriers does not cause the power of the others to change.

Sample power can be averaged over time and the occurrence of peaks which exceed the maximum output capability noted. If clipping is unacceptably frequent, the input signal sample values can be reduced by a scaling factor to reduce the overall output power. The scaling block can avoid clipping problems by scaling the inputs to a conservatively low level at start up, and stepping the values up until the best efficiency balance against clipping is achieved. This does not affect the operating point of the amplifiers since they run at a constant power.

With most types of digital modulation such as 16QAM, the peak to average ratio and clipping statistics are easily calculated. Therefore, in these applications, the amplitude level can be programmed into the LINC amplifier and automatic adjustment becomes relatively simple. Amplitude modulated voice is an example of a signal which has a high and unpredictable peak to average power. In this case the automatic control would be an advantage but in this example a long time average would be needed to avoid the level jumping up and down as the amplitude is corrected.

If the peak which is selected is extremely infrequent and of short duration it may be better for overall efficiency to allow it to be clipped and position the average power closer to the peak. It is then preferable for the amplitude scaling of the AGC to perform the clipping to save the SCS from being subjected to an input which exceeds its capability. Setting the average higher in the output range promotes power efficiency because the amplifiers spend more time closer to being co-phased and less power is sent to the dummy load.

Amplifier power output control can be achieved using an amplitude scaling block before the SCS. There is also the possibility of doing this by attenuation of overall amplifier output and also by altering the bias of the amplifiers. Control in the amplitude scaling block gives very precise manual or automatic control without changing the amplifier operating points. This method of control is the preferred option. Anything which alters the operating points of the amplifiers could require new correction parameters to be calculated to correct for other effects of the change.

Hard limited amplifier classes (C, E and F) are efficient but have very nonlinear transfer characteristics. Thus, when operating close to or at saturation, a large change in the input signal amplitude might be needed to achieve a small change in the output. If the FIR filters do not have enough effect on the outputs of amplifiers operating in severe gain compression, then alternative means for amplifier gain control might be desired.

It is a preferred refinement of the ACPCE control system to allow the overall amplifier gains to be adjusted by controlling the amplifiers directly. This can be done by adjusting their power supplies or bias conditions. This would require digital to analog converters to control the voltages. By adjusting for any bulk gain mismatch in this way, the maximum available digital resolution of the FIR filters can be applied to the fine control of any gain variation across the frequency band in use as well as phase and delay errors. Direct amplifier controls are used for the power up and down of the amplifiers 15, 16 as described earlier. In a case where the amplifiers have a significant difference in gain, coarse bulk gain adjustments could also be done manually at the time of manufacture.

If the FIR filters still do not affect the amplifier gains effectively, the bias controls can be used for all of the gain control, but may be sufficient only if the amplifiers 15, 16 have substantially flat gain over the operating frequency band. This is likely to be the case when the amplifiers 15, 16 are operated far into compression and also when the bandwidth is small compared to the frequency of the channel. For example, 1 MHz at 900 MHz is only 1/900 or 0.11% bandwidth to frequency ratio.

FIG. 33 shows how the amplifier controls preferably connect to the ACPCE 28 in the LINC amplifier. Since amplifiers 15, 16 are non-linear, they produce a substantially constant output. This means that if they have different gains, which is likely to be the case, the adjustment of their inputs will not have much effect on their outputs. Gain balance is important for successful LINC amplifier operation. It is probable that if any significant amount of bulk gain difference exists between the amplifiers 15, 16 themselves, the adaptive algorithms of the ACPCE 28 will drive one of the FIR filters 92, 93 to reduce the signal in one path a lot and boost the other as far as it can. This may still not be enough to achieve balance at the output of the amplifiers. Even if it is, the effect could be detrimental to the effectiveness of other aspects of the correction due to a small, noisy, signal passing through one path with limited digital resolution and precision. All of the dynamic range of the FIR filters 92, 93 might be used up on the one gain balancing effect without leaving numerical precision for other corrections such as gain slope over frequency. This effect, while likely to be slight, might require much of the available FIR dynamic range. It is desirable, therefore, to separate out the parameters controlling overall gain balance into a single adjustment which controls the amplifiers directly. This can be applied through bias or power supply voltages to the amplifiers through a pair of slow acting D/A converters 281, 282. Gain control could also be applied to other components in the upconversion paths. With overall gain matched this way, the FIR filters can be used to effectively control any frequency dependent gain differences between the amplifiers which might remain. Note that there is a possible need for bulk delay adjustment which amounts to the same bulk phase shift. This might be set up manually at the time of manufacture, as might bulk gain, or it might be adjusted by another ACPCE controlled structure such as the one described in reference to FIG. 33 for gain.

Ideally, a LINC amplifier will be chosen for a task such that it can operate near its peak of efficiency. One of the details of setting up the power level and maximum efficiency is making sure that the peak power really does conform to colinearity, with both amplifiers operating biased at their best efficiency point. A separate automatic amplifier efficiency peaking system could be used to keep the amplifiers on the peak of their efficiency.

XIV. Recovery of Waste Energy

Figure 34:
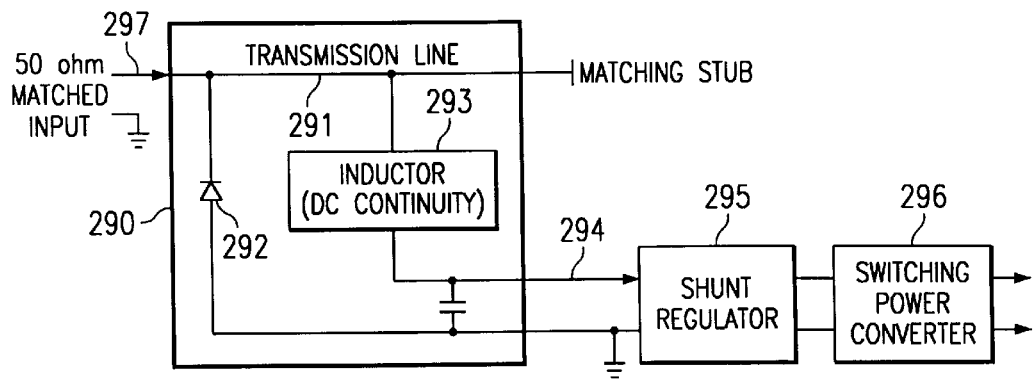
FIG. 34 is a schematic diagram of an inventive arrangement to recover waste energy.

The waste energy sent to the dummy load 243 (FIG. 24) is in the form of a radio frequency signal which can be rectified and recovered. The recovery and use of this energy can help to enhance the overall power consumption efficiency of the LINC amplifier. This type of energy recovery is easier and more economical to implement than recovering the waste heat generated as it is in conventional amplifiers. FIG. 34 is a diagram of an energy recovery circuit which can be used to recover the waste energy that is applied to the dummy load. The circuit would be connected to the quadrature coupler 244 in place of the standard dummy load 243.

In the illustrated embodiment, the energy recovery circuit presents a constant 50 ohm impedance to the quadrature coupler output to avoid reflecting RF energy back to the coupler and amplifiers. The circuit converts the varying amount of input to a constant voltage which can be used to do useful work. The power could be used to charge a large reservoir capacitor at the input to the power supplies to the LINC amplifier and reduce its overall power demand from the supply source.

The power going into the dummy load 243 can be a significant portion of the total produced by the amplifiers 15, 16 since both amplifiers preferably run at full power continuously. When the overall amplifier output is intended to be less than the maximum, the excess energy goes to the dummy load 243. Therefore, it is a significant potential aid to power efficiency to recover the energy going to the dummy load. Even if only a relatively small percentage of the energy can be recovered, it significantly improves the overall power conversion efficiency of the amplifier.

With further reference to FIG. 34, the input 297 connects to a transmission line 291, which presents to the quadrature coupler 244 a matched impedance of 50 ohms. If the quadrature coupler does not see a matched termination, this can affect the balance of the combining of the two amplifier outputs. A diode 292 is placed to rectify the RF alternating signal to produce a DC output. The inductor 293 is an RF block which has a low DC resistance but appears as a high resistance to RF frequencies. In the case of UHF frequencies, the inductor 293 could be a part of the overall transmission line structure. The power handling capabilities of individual diodes would not be sufficient to convert all of the available power, so a plurality of the detector structures 290 would be used with their outputs 294 combined in series and parallel to give a useful output to the shunt regulator 295.

In addition, the "transmission line" 291 would likely be a more complicated structure of filters and couplers to maintain the impedance matching and distribute the RF energy input at 297 to multiple detector structures 290. A shunt regulator 295 is used to maintain a constant load on the diodes. The apparent impedance match could otherwise be affected as the power from the RF input varies with the signal being transmitted. In addition, the amount of loading on the switching power converter 296 cannot be assumed invariant. There would be a rapidly varying power input and a varying DC load. The active shunt regulation would dump power to ground when the switching power converter has no load attached to it. The switching power converter 296 changes the available detected power to a constant voltage but with a current which will be dependent on the available detected RF power.

XV. Effects of Imbalances

Figure 35:
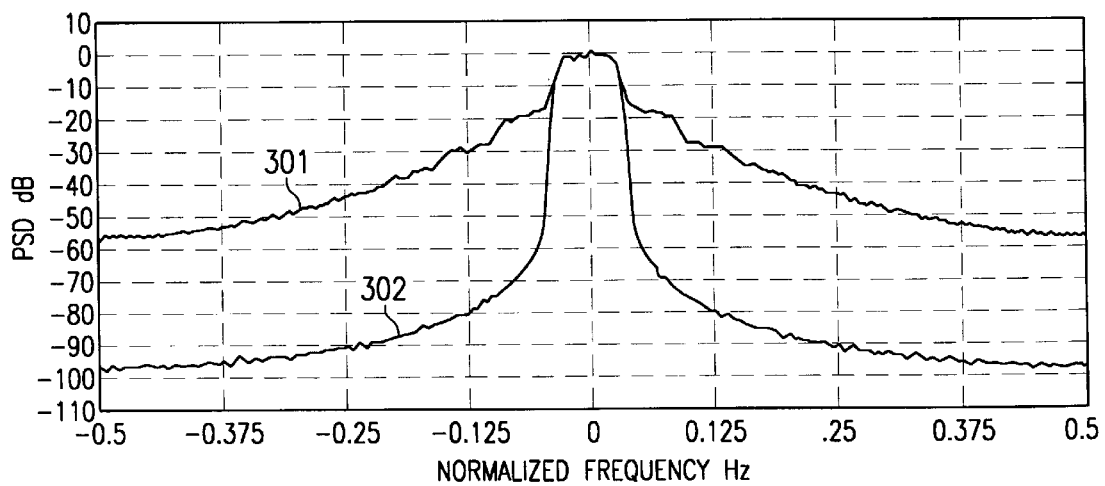
FIG. 35 is an idealized graph of the power spectral densities of the amplifiers.
Figure 36A:
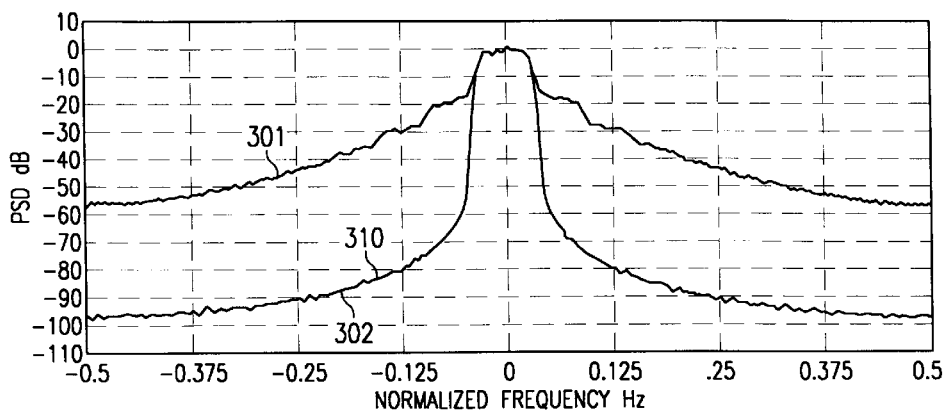
FIGS. 36A–36C are graphs of the power spectral densities of the amplifiers with various phase imbalances.
Figure 36B:
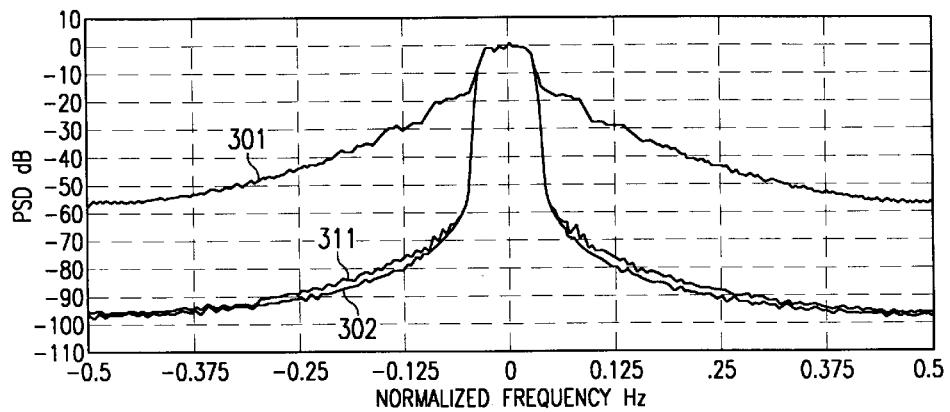
Figure 36C:
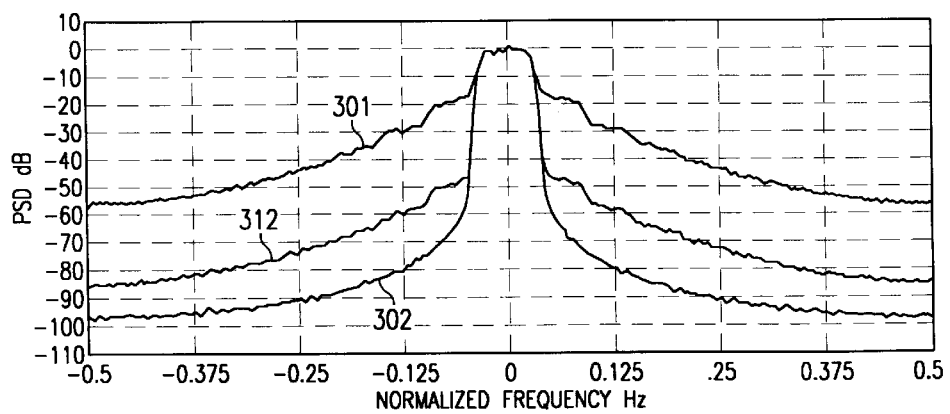

FIG. 35 is similar to FIG. 5 and is an overlaid spectral plot of the two amplifier outputs $Ph_{Arf}$ and $Ph_{Brf}$ 301 and the combined output at the antenna under ideal conditions of balance of phase, amplitude and delay 302. The two plots match in the central part of the spectrum, which is the bandwidth of the modulated signal to be transmitted. The modulation spectrum is typical of what might be generated by a 16 QAM or QPSK signal. The trace 302 of FIG. 35 is a reference for all of the plots in FIGS. 36 and 37, and is calculated with no phase, amplitude or delay difference between $Ph_{Arf}$ and $Ph_{Brf}$. The plots in FIGS. 36 and 37 all have the phase signals and the ideal reference 302 from FIG. 35 for comparison purposes. FIG. 36A shows the effect of amplitude balance but an 0.01 degree phase imbalance 310. FIG. 36B shows the effect of amplitude balance but an 0.1 degree phase imbalance 311. FIG. 36C shows the effect of amplitude balance but a 1 degree phase imbalance 312. FIG. 37A shows the effect of phase balance but an 0.01 dB amplitude imbalance 320. FIG. 37B shows the effect of phase balance but an 0.1 dB amplitude imbalance 321. FIG. 37C shows the effect of phase balance but a 1 dB amplitude imbalance 322. From these plots, it can be seen that performance is compromised noticeably by phase imbalance of 0.1 degree and amplitude imbalance of 0.01 dB.

XVI. Additional Considerations

In practical product implementations, various additional features may be desirable. Monitoring of the amplifier operating conditions and configuration would normally be provided in any amplifier. In a LINC amplifier, an individual amplifier failure and balance failure detector may also be provided to avoid spurious emissions. This could be done by implementing a digital filter at baseband in the receiver to look for out-of-band energy which would be produced at unacceptable levels under fault conditions. In this event the amplifiers would be switched off and the fault reported. If the fault is serious the bias and power would have to be cut immediately. This possibility is included in the state machine diagram of FIG. 11.

A further efficiency enhancement is to have small amplifiers generate the whole output signal alone when the signal is at a low level. Higher power amplifiers can be brought into operation on demand to meet peak output requirements. In a LINC configuration the extra amplifiers can be made to power on in antiphase just before they are required and then contribute their power smoothly when required. A practical advantage to this method would be in systems where peaks are occasional and very high. A processing delay would be allowed to give the high power amplifiers time to warm up before being called upon to contribute to the output.

Although this invention has been described in terms of certain preferred embodiments, other embodiments that are apparent to those of ordinary skill in the art, including embodiments which do not provide all of the benefits and features set forth herein, are also within the scope of this invention. Accordingly, the scope of the present invention is defined only by the appended claims. In the claims which follow, reference characters used to denote method steps are provided for convenience of description only, and not to imply a particular order for performing the steps.

APPENDIX—STATE MACHINE SPECIFICATION a. Transmit Power Off State

When the state machine is in the TX POWER OFF state (state 1 in FIG. 11), the following logic is applied:

| | |
|---|---|
| IF | a bias on signal is applied to the power amplifier OR IF a control signal is enabled indicating that transmission is pending. |
| THEN | the ACPCE shall exit the TX POWER OFF state (1) and enter the TX POWER UP state (1A). |
| ELSE | the ACPCE controller shall remain in the TX POWER OFF state (1). | b. Transmit Power Up State

When the state machine is in the TX POWER UP state (1A), the following logic is applied:

| | |
|---|---|
| IF | a bias on signal is applied to the power amplifier OR IF (a control signal is enabled indicating that transmission is pending AND the bias has reached the normal point for operation). |
| THEN | the ACPCE controller shall exit the TX POWER UP state (1A) and enter the CALIBRATION state (2). |
| ELSE IF | a bias signal has been removed from the power amplifier or if a control signal is disabled OR IF the amplifier has been switched off. |
| THEN | the ACPCE controller shall exit the TX POWER UP state (1A) and re-enter the TX POWER OFF state (1). |
| ELSE | the ACPCE controller shall remain in the TX POWER UP state (1A). | c. Transmit Power Down State

When the state machine is in the TX POWER DOWN state (1B), the following logic is applied:

| | |
|---|---|
| IF | the bias to the power amplifier has been fully removed |
| THEN | the ACPCE controller shall exit the TX POWER DOWN state (1B) and enter the TX POWER OFF state (1). |
| ELSE | the ACPCE controller shall remain in the TX POWER DOWN state (1B). | d. Calibration State

When the state machine is in the CALIBRATION state (2), the following logic is applied:

| | |
|---|---|
| IF | it is determined that the existing compensation parameters are no longer accurate or valid OR IF the power amplifier is being provisioned with the first transmission test and the compensation values are set to inaccurate manufacturing default values OR IF compensation parameter value time stamps, if employed, have expired OR IF (the amplifier has been switched off AND the option of recalibration on power down has been selected by the user) |
| THEN | the ACPCE controller shall exit the CALIBRATION state (2) and enter the TRAINING AND ACQUISITION state (3). |
| ELSE IF | IF the ACPCE controller determines that the compensation parameters are still valid, that is they are sufficiently accurate to ensure power spectral emission requirements are not exceeded AND the transmission request indicates that the transmission signal s(t) does not require a transmission ramp AND the power amplifier key up signal is enabled AND no fault conditions are present. |
| THEN | the ACPCE controller shall exit the CALIBRATION state (2) and enter the TRACK AND UPDATE state (5). |
| ELSE IF | the ACPCE controller determines that the compensation parameters are still valid, that is they are sufficiently accurate to ensure power spectral emission requirements are not exceeded AND the transmission request indicates that the transmission signal s(t) does require a transmission ramp AND no fault conditions are present. |
| THEN | the ACPCE controller shall exit the CALIBRATION state (2) and enter the TX RAMP UP state (4). |
| ELSE IF | the ACPCE controller determines that the power amplifier enable control signal has been disabled indicating that the pending transmission has been terminated OR IF (the amplifier has been switched off AND the option for re-calibration on power down has not been selected) OR IF (the amplifier has been switched off AND the option for re-calibration on power down has been selected AND a re-calibration has just been performed). |
| THEN | the ACPCE controller shall exit the CALIBRATION state (2) and re-enter the POWER DOWN state (1B). |
| ELSE IF | the ACPCE controller determines that a major fault condition has occurred. |
| THEN | the ACPCE controller shall report the fault condition to a power amplifier management entity and exit the CALIBRATION state (2) and enter the TX POWER DOWN state (1B). |
| ELSE | the ACPCE controller shall remain in the CALIBRATION state (2). |

Training and Acquisition State

When the state machine is in the TRAINING AND ACQUISITION state (3), the following logic is applied:

| | |
|---|---|
| IF | the ACPCE controller determines that the power amplifier bias or power amplifier enable control signal has been disabled indicating that the pending transmission has been terminated OR IF (the amplifier has been switched off AND the option for recalibration on power off has been selected AND the compensation parameter values are valid for all frequency channels that have been specified for calibration) OR IF (the amplifier has been switched off AND the option for recalibration on power off has not been selected) |
| THEN | the ACPCE controller shall exit the TRAINING AND ACQUISITION state (3) and re-enter the CALIBRATION state (2). |
| ELSE IF | the ACPCE controller determines that a major fault condition has occurred. |
| THEN | the ACPCE controller shall report the fault condition to a power amplifier management entity and exit the TRAINING AND ACQUISITION state (3) and re-enter the CALIBRATION state (2). |
| ELSE IF | the ACPCE controller determines that compensation parameter values are invalid for one or more frequency channels of operation that have been specified for calibration. |
| THEN | the ACPCE controller shall execute the following compensation parameter estimation procedure:<br>STEP 1: stimulate the analog RF up conversion, amplification and power combining circuitry with one or more of the following test sequences<br>    a) independently transmit a narrowband cpm (continuous phase modulation) bandlimited transmission sequence on each compensation/amplification chain.<br>    b) concurrently transmit a narrowband cpm bandlimited transmission sequence on each compensation/amplification chain.<br>    c) independently transmit a wideband cpm bandlimited transmission |

|  |  |  |
|---|---|---|
|  |  | sequence on each compensation/amplification chain. |
|  | d) | concurrently transmit a wideband cpm bandlimited transmission sequence on each compensation/amplification chain. |
|  | e) | transmit a narrowband bandlimited white noise signal that has been subjected to signal component separation and consists of two constant envelope phase varying transmission signals. |
|  | f) | transmit a wideband bandlimited white noise signal that has been subjected to signal component separation and consists of two constant envelope phase varying transmission signals. |
|  | g) | independently transmit a discrete or continuous frequency chirp sequence constructed from constant envelope phase varying modulation on each compensation/amplification chain. |
|  | h) | independently transmit a discrete or continuous polyphase sequence constructed from constant envelope phase varying modulation on each compensation/amplification chain. |
|  | i) | concurrently transmit a discrete or continuous frequency chirp sequence constructed from constant envelope phase varying modulation on each compensation/amplification chain. |
|  | j) | concurrently transmit a discrete or continuous polyphase sequence constructed from constant envelope phase varying modulation on each compensation/amplification chain. |
|  | k) | transmit a sequence of random modulation sequence s(t) signal that has been subject to signal component separation. |
|  | l) | concurrently transmit a discrete or continuous anti-phased frequency chirp sequence constructed from constant envelope phase varying modulation on each compensation/amplification chain. |
|  | m) | concurrently transmit a discrete or continuous anti-phased polyphase sequence constructed from constant envelope phase varying modulation on each compensation/amplification chain. |
|  | n) | concurrently transmit a discrete or continuous anti-phased (pseudo) randomly frequency hopped sequence constructed from constant envelope phase varying modulation on each compensation/amplification chain. |
|  | It is important to note that this stage may require the ACPCE to isolate the amplifier from an antenna and direct the generated RF energy to a dummy load to prevent undesirable power emission during training. This requirement is eliminated if training sequences of type "l", "m", or "n" are used. These important sequences that have been specifically designed for this application are described in the main body of the disclosure. | |
|  | STEP 2: for each transmitted sequence the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down-converted power amplifier combining output circuit via the ADC (analog-to-digital converter) circuits, ks(t). | |
|  | STEP 3: the ACPCE shall compute from the ensemble of received data samples estimates of all up conversion imperfections. This may be done by utilizing one or more of the following algorithms: | |
|  | a) | correlation |
|  | b) | LMS system identification |
|  | c) | RLS system identification |
|  | d) | nonlinear Kalman filter system identification algorithims |
|  | e) | any signal processing algorithm that is capable of system identification in nonlinear signal processing, e.g. distortion analysis by wavelet multi signal resolution. |
|  | STEP 4: compute estimates of the signal compensation parameters that are required to counteract the imperfections identified in the previous step(3). | |
|  | STEP 5: upload compensation parameters to the Digital Signal Compensation Processing block via the parameter state vector $X_+(t)$. | |
|  | STEP 6: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t). | |
|  | STEP 7: determine if the error between the desired transmitted sequence s(t) = $Ph_A(t)$ + $Ph_B(t)$ and the observed sequence ks(t) is below an acceptable level. | |
|  | STEP 8: IF the error is below an acceptable level THEN store update compensation parameters and proceed to step 9 ELSE repeat steps 1–7. | |
|  | STEP 9: IF all channels have been calibrated THEN finish ELSE repeat steps 1–8 for the next channel. The channels to be calibrated may be defined as a user option. | |
| ELSE IF | the ACPCE controller determines that compensation parameter values are valid for all frequency channels of operation that have been specified for calibration AND the power amplifier key enable has been set. | |
| THEN | the ACPCE controller shall exit the TRAINING AND ACQUISITION state (3) and enter the TX RAMP UP state (4) | |
| ELSE | the ACPCE controller shall remain in the TRAINING AND ACQUISITION state (3) and transmit one of the following signals: [an antiphase discrete or continuous polyphase, discrete or continuous antiphase frequency chirp signal, a discrete or continuous antiphase frequency hopped signal or transmit a static antiphase null signal if these specialized sequences are unavailable.] | | f. Transmission Ramp-Up State

When the state machine is in the TRANSMISSION RAMP UP state (4), the following logic is applied:

| | |
|---|---|
| IF | the amplifier has been switched off. |
| THEN | the ACPCE controller shall exit the TX RAMP UP state (4) and enter the TRACK AND UPDATE state (5). |
| ELSE IF | the ACPCE controller determines that a major fault condition has occurred. |
| THEN | the ACPCE controller shall report the fault condition to a power amplifier management entity and exit the TRANSMISSION RAMP UP state (4) and enter the TRACK AND UPDATE state (5). |
| ELSE IF | the ACPCE controller determines that the power amplifier bias or power amplifier enable control signal is still enabled indicating that the transmission has started. |
| THEN | the ACPCE controller shall execute the power ramp algorithm (e.g., FIG. 31) and exit the TX RAMP UP state (4) and enter the TRACK AND UPDATE state (5). | g. Track and Update State

When the state machine is in the TRACK AND UPDATE state (5), the following logic is applied:

| | |
|---|---|
| IF | the ACPCE controller determines that a major fault condition has occurred. |
| THEN | the ACPCE controller shall report the fault condition to a power amplifier management entity and exit the TRACK AND UPDATE state (5) and enter the TRANSMIT RAMP DOWN state (7). |
| ELSE IF | the ACPCE controller determines that a minor fault condition has occurred. |
| THEN | the ACPCE controller shall report the fault condition to a power amplifier management entity and exit the TRACK AND UPDATE state (5) and enter the CALIBRATION state (2) |
| ELSE IF | the ACPCE controller determines that the amplifier has been switched off AND transmission is in progress OR IF (the amplifier has been switched off AND (no transmission or a special training pattern is in progress)). |
| THEN | the ACPCE controller shall exit the TRACK AND UPDATE state (5) and enter the TX RAMP DOWN state (7). |
| ELSE IF | the ACPCE controller determines that the transmission has been temporarily suspended for TDM burst mode procedures. |
| THEN | the ACPCE controller shall exit the TRACK AND UPDATE state (5) and enter the TRANSMIT RAMP DOWN state (7). |
| ELSE IF | the ACPCE controller determines that compensation parameter values are valid for the frequency channel of operation and that normal transmission/operation is in progress. |
| THEN | the ACPCE controller shall execute the following compensation parameter update and monitor procedure.<br>STEP 1: from the transmitted signal sequence, s(t), the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).<br>STEP 2 the ACPCE shall compute update estimates of the compensation parameters from the ensemble of received data samples. This may be done by utilizing one or more of the following algorithms:<br>    a) LMS system adaptation and gradient update algorithms.<br>    b) RLS system adaptation and gradient update algorithms.<br>    c) nonlinear Kalman filter system adaptation and gradient update algorithms.<br>    d) any signal processing algorithm that is capable of adaptation such that the updated compensation parameters are more accurate than the existing parameters.<br>STEP 3: upload compensation parameters to the Digital Signal Compensation Processing block via the parameter state vector $X_+(t)$.<br>STEP 4: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).<br>STEP 5: determine if the error between the desired transmitted sequence $s(t)=Ph_A(t)+Ph_B(t)$ and the observed sequence ks(t) is below an acceptable level.<br>STEP 6: if the error is below an acceptable level THEN store update compensation parameters and proceed to step 7 ELSE repeat steps 1–5.<br>STEP 7: finish. |
| ELSE | the ACPCE controller shall remain in the TRACK AND UPDATE state (5). |

Burst Idle Training State

When the state machine is in the BURST IDLE TRAINING state (6), the following logic is applied:

| | |
|---|---|
| IF | the ACPCE controller determines that a major fault condition has occurred. |
| THEN | the ACPCE controller shall report the fault condition to a power amplifier management entity AND exit the BURST IDLE TRAINING state (6) and enter the TRACK AND UPDATE state (5). |
| ELSE IF | the ACPCE controller determines that the power amplifier enable control signal has been disabled indicating that the pending transmission has been terminated OR IF the amplifier has been switched off. |
| THEN | the ACPCE controller shall exit the BURST IDLE TRAINING state (6) and re-enter the TRACK AND UPDATE state (5). |
| ELSE IF | the ACPCE controller determines that compensation parameter values are valid for the frequency channel of operation AND the power amplifier key enable has been set. |
| THEN | the ACPCE controller shall exit the BURST IDLE TRAINING state (6) AND enter the TX RAMP UP state (4). |
| ELSE IF | the ACPCE controller determines that compensation parameter values are valid for the frequency channel of operation and that transmission/operation of the antiphase sequence has commenced. |
| THEN | the ACPCE controller shall execute the following compensation parameter update and monitor procedure: |
| | STEP 1: from the transmitted antiphase signal sequence the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t). |
| | STEP 2: the ACPCE shall compute update estimates of the compensation parameters from the ensemble of received data samples. This may be done by utilizing one or more of the following algorithms. |
| |     a)   LMS system adaptation and gradient update algorithms |
| |     b)   RLS system adaptation and gradient update algorithms |
| |     c)   nonlinear Kalman filter system adaptation and gradient update algorithms. |
| |     d)   any signal processing algorithm that is capable of adaptation such that the updated compensation parameters are more accurate than the existing parameters. |
| | STEP 3: upload compensation parameters to the Digital Signal Compensation Processing block via the parameter state vector $X_+(t)$. |
| | STEP 4: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t). |
| | STEP 5: determine if the error between the desired transmitted sequence $s(t)=Ph_A(t)+Ph_B(t)$ and the observed sequence ks(t) is below an acceptable level. |
| | STEP 6: if the error is below an acceptable level THEN store update compensation parameters and proceed to step 8 else repeat steps 1–5. |
| | STEP 7: finish. |
| ELSE | the ACPCE controller shall remain in the BURST IDLE TRAINING state (6). |

Transmission Ramp Down State

When the state machine is in the TRANSMISSION RAMP DOWN state (7), the following logic is applied:

| | |
|---|---|
| IF | the ACPCE controller determines that the power amplifier has been switched off AND the amplifier is still transmitting |
| THEN | the ACPCE controller shall execute the power ramp algorithm (e.g., FIG. 31) and exit the TRANSMISSION RAMP DOWN state (7) and enter the CALIBRATION state (2). |
| ELSE IF | the ACPCE controller determines that a major fault condition has occurred. |
| THEN | the ACPCE controller shall report the fault condition to a power amplifier management entity and exit the TRANSMISSION RAMP DOWN state (7) and re-enter the CALIBRATION state (2). |
| ELSE IF | the ACPCE controller determines that the power amplifier bias or power amplifier enable control signal has been disabled indicating that the transmission has finished. |
| THEN | the ACPCE controller shall execute the power ramp down algorithm and exit the TRANSMISSION RAMP DOWN state (7) and enter the BURST IDLE state (6). |

What is claimed is:

1. In a LINC power amplifier in which an input transmission signal is separated into component signals that are amplified along respective amplification chains and then combined by a signal combiner to form an output transmission signal, and in which circuitry is provided for monitoring the output transmission signal, a method of generating a numeric model of the amplification chains and combiner so that imperfections therein can be corrected during normal operation of the amplifier, the method comprising:

(a) providing the numeric model with an initial set of model parameters;

(b) applying a stimulation sequence to the amplification chains to generate an observed output sequence at an output of the combiner;

(c) applying the stimulation sequence to the model to calculate a predicted output sequence, and comparing the predicted output sequence to the observed output sequence; and (d) iteratively refining the model parameters and repeating step (c) until a difference between the predicted and observed output sequences is substantially minimized.

2. The method of claim 1, further comprising repeating steps (b), (c) and (d) using at least one other stimulation sequence to identify a set of model parameters which substantially minimizes a difference between the predicted and observed output sequences for a plurality of different stimulation sequences.

3. The method of claim 1, wherein step (d) comprises using a Least Mean Squares, Recursive Least Squares, Kalman, or Extended Kalman algorithm to generate updates to the model parameters.

4. The method of claim 1, wherein step (a) comprises using a default set of model parameters.

5. The method of claim 1, wherein step (a) comprises generating the initial set of model parameters by:

(a1) applying a known stimulation sequence to at least one the amplification chains and recording a resulting output sequence of the combiner;

(a2) correlating the known stimulation sequence with the output sequence recorded in step (a1) to measure at least one of the following amplification chain characteristics: amplitude gain, propagation delay and phase rotation; and (a3) generating an initial set of model parameters which incorporates measurements made in step (a2).

6. The method of claim 5, wherein step (a1) comprises applying a first stimulation sequence to a first amplification chain while concurrently applying a second stimulation sequence which is orthogonal to the first stimulation sequence to a second amplification chain.

7. The method of claim 5, wherein step (a1) comprises applying a first stimulation sequence to a first amplification chain while concurrently applying a second stimulation sequence which is in antiphase with the first stimulation sequence to a second amplification chain.

8. The method of claim 1, wherein the numerical model implements a finite impulse response digital filter.

9. The method of claim 8, wherein the numerical model further implements a quadrature modulator imperfection circuit.

10. The method of claim 1, further comprising using a set of model parameters generated using steps (a)–(d) to generate a set of compensation parameters to be used by a compensation processor to modify the component signals during normal operation of the amplifier.

11. The method of claim 10, wherein generating the set of compensation parameters comprises using the compensation processor in combination with the numeric model to simulate the operation of the amplifier while adaptively adjusting the compensation parameters.

12. The method of claim 10, further comprising adaptively updating the compensation parameters during normal operation of the amplifier.

13. The method of claim 1, wherein steps (a)–(d) are implemented though a firmware program within a transmitter.

14. In a LINC amplifier system in which an input transmission signal is separated into component signals that are amplified along respective amplification chains and then combined by a signal combiner to form an output transmission signal, and in which the component signals are modified by compensation processors, based on sets of compensation parameters, to compensate for differences in the amplification chains, a method of adaptively adjusting the compensation parameters, comprising:

(a) generating a numeric model which represents the amplification chains and the combiner;

(b) applying a test sequence to a compensation module which includes or represents the compensation processors, and applying a resulting output of the compensation module to the numeric model, to simulate the operation of the amplifier system; and (c) during step (b), adaptively updating the compensation parameters until an error in an output signal generated by the numeric model falls to within a predetermined threshold.

15. The method of claim 14, wherein steps (a)–(c) are performed while inhibiting transmissions of a signal.

16. The method of claim 14, wherein step (a) comprises:

(a1) applying a stimulation sequence to the amplification chains to generate an observed output sequence at an output of the combiner;

(a2) applying the stimulation sequence to the model to calculate a predicted output sequence, and comparing the predicted output sequence to the observed output sequence; and (a3) iteratively refining parameters of the model and repeating step (a2) until a difference between the predicted and observed output sequences is substantially minimized.

17. The method of claim 14, wherein step (c) comprises using a Least Mean Squares, Recursive Least Squares, Kalman, or Extended Kalman algorithm to generate updates to the compensation parameters.

18. The method of claim 14, further comprising commencing a transmission using a set of compensation parameters computed from step (c).

19. The method of claim 14, wherein steps (b) and (c) are implemented using a firmware program of a transmitter.

20. The method of claim 14, wherein step (b) comprises replicating the compensation processors through software.

21. In a LINC amplifier system in which an input transmission signal is separated into component signals that are amplified along respective amplification chains and then combined by a signal combiner to form an output transmission signal, a method of compensating for a difference between the amplification chains, comprising, during a transmission event:

(a) separating the input transmission signal into first and second component signals of substantially constant amplitude and varying phase;

(b) modifying at least one of the first and second component signals using a compensation processor, based on a set of compensation parameters, to compensate for the difference;

(c) applying the first and second component signals as modified in step (b) to respective amplification chains;

(d) monitoring an observed output sequence at an output of the signal combiner;

(e) comparing the observed output sequence to a predicted output sequence, the predicted output sequence based on the input transmission signal; and (f) adaptively adjusting the compensation parameters to reduce a difference between the observed output sequence and the predicted output sequence.

22. The method of claim 21, wherein step (e) comprises generating the predicted output sequence from the input transmission signal.

23. The method of claim 21, wherein step (e) comprises generating the predicted output sequence from the component signals.

24. The method of claim 21, wherein step (f) comprises using a Least Mean Squares, Recursive Least Squares, Kalman, or Extended Kalman algorithm to generate updates to the compensation parameters.

25. The method of claim 21, wherein step (f) comprises applying an interpolation function to successive sets of compensation parameters to thereby reduce spurious emissions during updates to the compensation parameters.

26. The method of claim 21, wherein steps (e) and (c) comprise processing signal samples that are stored in memory.

27. The method of claim 21, wherein step (f) is performed in a non-real-time mode.

28. A linear power amplifier system for radio frequency transmissions, comprising:

a signal separator circuit which separates an input transmission signal into first and second component signals;

first and second signal processing chains which process the first and second component signals, respectively, at least one of the signal processing chains including a compensation processor which modifies the respective component signal based on a set of compensation parameters to compensate for differences between the first and second processing chains;

a signal combiner circuit which combines the components signals for transmission following processing along the signal processing chains;

a signal monitoring circuit which captures and stores within a computer memory sequences of digital signal samples that represent an expected and an actual output of the signal combiner circuit during transmission events; and a compensation estimation circuit which reads the samples from the computer memory and processes the samples in a non-real-time mode to generate updates to the compensation parameters.

29. The linear power amplifier system as in claim 28, wherein the compensation estimation circuit implements a Least Mean Squares, Recursive Least Squares, Kalman, or Extended Kalman algorithm in non-real-time to generate the updates to the compensation parameters.

30. The linear power amplifier system as in claim 29, wherein the compensation estimation circuit comprises a general-purpose DSP device that executes a computer program to implement the Least Mean Squares, Recursive Least Squares, Kalman, or Extended Kalman algorithm.

31. The linear power amplifier system in claim 28, wherein the signal separator circuit separates the input transmission signal into component signals of substantially constant amplitude and varying phase.

* * * * *